US006898102B2

(12) United States Patent
Keeth

(10) Patent No.: US 6,898,102 B2
(45) Date of Patent: May 24, 2005

(54) DIGITLINE ARCHITECTURE FOR DYNAMIC MEMORY

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 10/620,179

(22) Filed: Jul. 14, 2003

(65) Prior Publication Data

US 2004/0062069 A1 Apr. 1, 2004

Related U.S. Application Data

(60) Continuation of application No. 10/150,236, filed on May 17, 2002, now Pat. No. 6,594,173, which is a continuation of application No. 09/826,764, filed on Apr. 5, 2001, now Pat. No. 6,392,303, which is a continuation of application No. 09/507,170, filed on Feb. 18, 2000, now Pat. No. 6,243,311, which is a division of application No. 08/701,749, filed on Aug. 22, 1996, now Pat. No. 6,043,562.
(60) Provisional application No. 60/010,293, filed on Feb. 1, 1996, and provisional application No. 60/010,622, filed on Jan. 26, 1996.

(51) Int. Cl.$^7$ ................................................ G11C 5/06
(52) U.S. Cl. .......................... 365/63; 365/206; 365/214
(58) Field of Search ........................... 365/63, 206, 214

(56) References Cited

U.S. PATENT DOCUMENTS

| | | | |
|---|---|---|---|
| 4,536,947 A | | 8/1985 | Bohr et al. |
| 4,742,018 A | | 5/1988 | Kimura et al. |
| 4,914,502 A | | 4/1990 | Lebowitz et al. |
| 4,922,460 A | | 5/1990 | Furutani et al. |
| 4,967,396 A | | 10/1990 | Kajigaya et al. |
| 4,970,564 A | | 11/1990 | Kimura et al. |
| 4,980,860 A | * | 12/1990 | Houston et al. ....... 365/189.11 |

(Continued)

FOREIGN PATENT DOCUMENTS

| | | |
|---|---|---|
| DE | 4433695 | 3/1995 |
| EP | 0078338 | 5/1983 |
| JP | 60-258795 | 12/1984 |
| JP | 3-174765 | 7/1991 |

OTHER PUBLICATIONS

Ahn et al., "Bidirectional Matched Global Bit Line Scheme for High Density DRAMS", (Abstract), pps. 91–92.
Hamada et al., "A Split —Level Diagonal Bit–Line (SLDB) Stacked Capacitor Cell for 256MbDRAMs", IEEE, Apr.; 1992, pps. 799–802.
Inoue et al., "A 16Mb DRAM with An Open Bit–Line Architecture", International Solid State Circuits Conference, IEEE, 1988, pps. 246–247.
Kimura et al., "A Block–Oriented RAM with Half–Sized DRAM Cell and Quasi–Folded Data–Line Architecture", Nov. 11, 1991, IEEE, Journal of Solid–State Circuit, pps. 1511–1518.
Takashima et al., "Open/Folded Bit–Line Arrangement for Ultra High–Density DRAMs", (Abstract), pp. 89–90.
Hidaka et al., "A Divided/Shared Bit–Line Sensing Scheme for ULSI DRAM Cores", Journal of Solid–State Circuit, vol. 26, No. 4, Apr. 1991, pps. 473–477.
IBM Technical Disclosure Bulletin, vol. 30, No. 3, Aug. 1987, pps. 1314–1315.
IBM Technical Disclosure Bulletin, vol. 30, No. 11, Apr. 1988, pps. 246–248.

*Primary Examiner*—Viet Q. Nguyen
(74) *Attorney, Agent, or Firm*—TraskBritt

(57) ABSTRACT

A novel bi-level DRAM architecture is described which achieves significant reductions in die size while maintaining the noise performance of traditional folded architectures. Die size reduction results primarily by building the memory arrays with 6F$^2$ or smaller memory cells in a type of cross-point memory cell layout. The memory arrays utilize stacked digitlines and vertical digitline twisting to achieve folded architecture operation and noise performance.

2 Claims, 45 Drawing Sheets

U.S. PATENT DOCUMENTS

| | | | |
|---|---|---|---|
| 5,014,110 A | 5/1991 | Satoh | |
| 5,107,459 A | 4/1992 | Chu et al. | |
| 5,138,412 A | 8/1992 | Hieda et al. | |
| 5,170,243 A | 12/1992 | Dhong et al. | |
| 5,206,183 A | 4/1993 | Dennison | |
| 5,208,180 A | 5/1993 | Gonzalez | |
| 5,243,558 A | 9/1993 | Saeki | |
| 5,280,443 A | 1/1994 | Hidaka et al. | |
| 5,315,542 A | 5/1994 | Melzner | |
| 5,396,450 A | 3/1995 | Takashima et al. | |
| 5,396,451 A | 3/1995 | Ema | |
| 5,499,205 A | 3/1996 | Ahn et al. | |
| 5,534,732 A | 7/1996 | DeBrosse et al. | |
| 5,581,126 A | 12/1996 | Moench | |
| 5,625,234 A | 4/1997 | Suzuki et al. | |
| 5,670,815 A | 9/1997 | Childs et al. | |
| 5,680,347 A | 10/1997 | Takeuchi et al. | |
| 5,732,010 A * | 3/1998 | Takashima et al. | 365/63 |
| 5,815,428 A | 9/1998 | Tsuruda et al. | |
| 5,838,038 A | 11/1998 | Takashima et al. | |
| 5,864,181 A | 1/1999 | Keeth | |
| 5,877,976 A | 3/1999 | Lattimore et al. | |
| 5,940,321 A | 8/1999 | Takeuchi et al. | |
| 5,949,698 A | 9/1999 | Shirley | |
| 6,005,265 A | 12/1999 | Kuroda et al. | |
| RE36,531 E * | 1/2000 | Kuriyama et al. | 365/63 |
| 6,018,172 A | 1/2000 | Hidaka et al. | |
| 6,034,879 A | 3/2000 | Min et al. | |
| 6,043,562 A | 3/2000 | Keeth | |
| 6,084,307 A | 7/2000 | Keeth | |
| 6,094,370 A | 7/2000 | Takashima | |
| 6,185,123 B1 | 2/2001 | Allen et al. | |
| 6,188,598 B1 | 2/2001 | Mueller et al. | |
| 6,222,275 B1 | 4/2001 | Keeth | |
| 6,243,311 B1 | 6/2001 | Keeth | |
| 6,392,303 B2 | 5/2002 | Keeth | |
| 6,392,393 B1 * | 5/2002 | Brambilla et al. | 323/315 |
| 6,410,948 B1 * | 6/2002 | Tran et al. | 257/202 |
| 6,429,529 B1 | 8/2002 | Keeth | |
| 6,449,195 B1 * | 9/2002 | Min et al. | 365/189.05 |
| 6,456,518 B1 | 9/2002 | Keeth | |
| 6,496,402 B1 * | 12/2002 | Somasekhar et al. | 365/63 |
| 6,504,255 B2 | 1/2003 | Keeth | |
| 6,570,781 B1 * | 5/2003 | Lee et al. | 365/63 |
| 6,594,173 B2 * | 7/2003 | Keeth | 365/63 |
| 6,607,944 B1 * | 8/2003 | Tran et al. | 438/129 |
| 2001/0030899 A1 * | 10/2001 | Keeth | 365/206 |
| 2002/0141220 A1 * | 10/2002 | Keeth | 365/63 |
| 2003/0030150 A1 * | 2/2003 | Keeth | 257/776 |
| 2003/0102515 A1 * | 6/2003 | Tran et al. | 257/390 |
| 2003/0198073 A1 * | 10/2003 | Keeth | 365/63 |

* cited by examiner

DIGITLINE ARCHITECTURE FOR DYNAMIC MEMORY

CROSS-REFERENCE TO RELATED APPLICATIONS

This application is a continuation of application Ser. No. 10/150,236, filed May 17, 2002, now U.S. Pat. No. 6,594,173, issued Jul. 15, 2003, which is a continuation of application Ser. No. 09/826,764, filed Apr. 5, 2001, now U.S. Pat. No. 6,392,303, issued May 21, 2002, which is a continuation of application Ser. No. 09/507,170, filed Feb. 18, 2000, now U.S. Pat. No. 6,243,311, issued Jun. 5, 2001, which is a divisional of application Ser. No. 08/701,749, filed Aug. 22, 1996, now U.S. Pat. No. 6,043,562, issued Mar. 28, 2000. This application claims priority to provisional application Ser. Nos. 60/010,293 filed Feb. 1, 1996, and 60/010,622 filed Jan. 26, 1996.

BACKGROUND OF THE INVENTION

Field of the Invention: The present invention relates generally to memory devices and, in particular, the present invention relates to a digitline architecture in a DRAM.

State of the Art: A modern DRAM memory cell or memory bit, as shown in FIG. 1, consists of one MOS transistor 10 and one storage capacitor 12—accordingly referred to as a one-transistor one-capacitor (1T1C) cell. The memory bit transistor operates as a switch, interposed between the memory bit capacitor and the digitline 14. The memory bit is capable of holding a single piece of binary information, as a stored electric charge in the cell capacitor. Given a bias voltage of Vcc/2 on the capacitor's common node, a logic one level is represented by +Vcc/2 volts across the capacitor and a logic zero is represented by −Vcc/2 volts across the capacitor. In either case, the amount of charge stored in the memory bit capacitor is $Q=C \cdot VCC/2$ coulombs, where C is the capacitance value in Farads.

The digitline 14, as depicted in FIG. 1, consists of a conductive line connected to a multitude of memory bit transistors. Generally, either metal or silicided/polycided polysilicon forms the conductive line. Due to the large quantity of attached memory bits, its physical length, and proximity to other features, the digitline is very capacitive. For instance, a typical value for digitline capacitance on a 0.35 μm process might be around 300 fF. Digitline capacitance is an important parameter since it dictates many other aspects of the design.

The memory bit transistor's gate terminal connects to a wordline (towline) 16. The wordline, which connects to a multitude of memory bits, consists of an extended segment of the same polysilicon used to form the transistor's gate. The wordline is physically orthogonal to the digitline. A memory array, shown in FIG. 2, is created by tiling a selected quantity of memory bits together such that memory bits along a given digitline do not share a common wordline and such that memory bits along a common wordline do not share a common digitline. FIG. 3 contains an example of a memory array formed by tiling memory bits. There are several features of this layout that need illumination. First, note that the memory bits are in pairs to permit the sharing of a common contact to the digitline. This feature reduces the array size by eliminating unnecessary duplication. Second, note that any given wordline only forms (crosses) a memory bit transistor on alternating digitlines. This feature allows the formation of digitline pairs and ensures that wordline activation enables transistors only on alternate digitlines. Digitline pairs are an inherent feature in folded digitline arrays, as depicted in FIG. 3. An alternate array structure called open digitline architecture can also be used. A thorough understanding of both folded and open architectures by those skilled in the art assists in appreciating the characteristics and benefits of the bi-level digitline of the present invention. The open digitline and folded digitline architectures both have distinct advantages and disadvantages. While open digitline architectures achieve smaller array layouts by virtue of using smaller $6F^2$ memory bit cells, they also suffer from poor noise performance. A relaxed wordline pitch which stems from the $6F^2$ memory bit simplifies the task of wordline driver layout. Sense amplifier layout, though, is difficult because the array configuration is inherently half pitch—one sense amplifier for every two digitlines. Folded digitline architectures, on the other hand, have superior signal to noise, at the expense of larger, less efficient array layout. Good signal to noise performance stems from the adjacency of true and complement digitlines and the capability to twist these digitline pairs. For example, U.S. Pat. No. 5,107,459 to Chu et al., issued Apr. 21, 1992 describes a stacked digitline architecture which uses lateral and vertical twisting. This technique, however, allows differential noise to be experienced on the digitlines which creates difficulty for differential sense amplifiers. Sense amplifier layout in the folded digitline architecture is simplified because the array configuration is quarter pitch—one sense amplifier for every four digitlines. Wordline driver layout is more difficult since the wordline pitch is effectively reduced in folded architectures.

For the reasons stated above, and for other reasons stated below which will become apparent to those skilled in the art upon reading and understanding the present specification, there is a need in the art for a new array architecture which combines the advantages of both folded and open digitline architectures while avoiding their respective disadvantages. To meet this objective, the architecture needs to include the following features and characteristics: an open digitline memory bit configuration, a small $6F^2$ memory bit, and a small, efficient array layout. The memory must also include a folded digitline sense amplifier configuration, adjacent true and complement digitlines, and twisted digitline pairs to achieve a high signal to noise ratio. Further, a relaxed wordline pitch should be used to facilitate better layout.

BRIEF SUMMARY OF THE INVENTION

The above-mentioned problems with digitline architectures and other problems are addressed by the present invention and will be understood by reading and studying the following specification. A memory device is described which reduces overall die size beyond that obtainable from either the folded or open digitline architectures. A signal to noise performance is achieved which approaches that of the folded digitline architecture.

In particular, the present invention describes a dynamic memory device comprising a multi-level digitline pair fabricated on a semiconductor die. The multi-level digitline pair has vertically offset first and second digitlines. The digitline pair is vertically twisted such that the first digitline is located below the second digitline on one horizontal side of the vertical twist and located above the second digitline as an upper digitline on an opposite horizontal side of the twist.

In another embodiment, an integrated circuit dynamic memory device comprises an integrated circuit die having multiple, vertically offset conductive levels, and a multi-level digitline pair fabricated on the integrated circuit die having first and second electrically isolated digitlines, each of the first and second digitlines comprising first and second sections located in different ones of the multiple conductive levels and electrically connected via a vertically traversing electrical path. The first and second digitlines are located such that the first section of the first digitline is vertically located above the first section of the second digitline and the second section of the first digitline is vertically located below the second section of the second digitline.

In yet another embodiment, a method is described for reducing noise in an integrated circuit memory device. The method comprises the step of electrically balancing first and second vertically stacked digitlines. To balance the digitlines, the first and second digitlines can be fabricated in first and second conductive levels such that the first and second digitlines are substantially vertically aligned. A vertical conductive twist can be provided to locate a portion of each of the first and second digitlines in both the first and second conductive levels. Finally, an equal number of memory cells can be coupled to the portion of the first and second digitlines located in a lower conductive level.

DETAILED DESCRIPTION OF THE INVENTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

An understanding of basic DRAM operation, such as reading and writing, is necessary to fully appreciate the present invention. A detailed description of DRAM circuitry is presented below.

Figure 1:
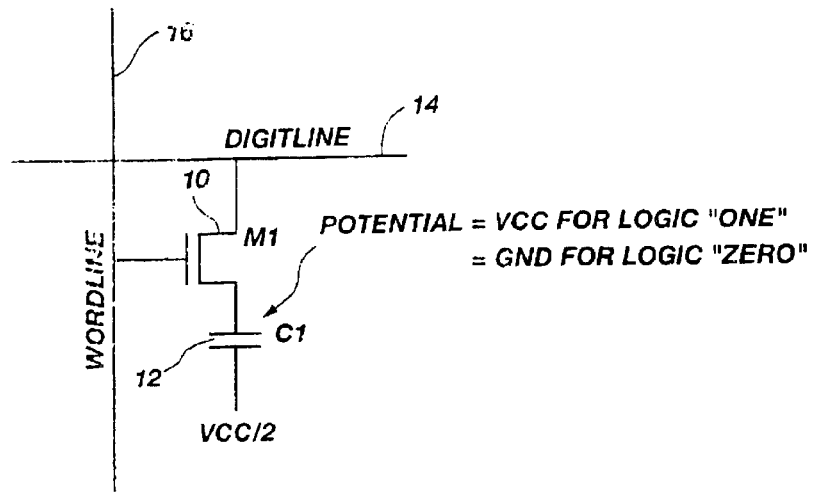
FIG. 1 is a 1T1C DRAM memory cell.
Figure 2:
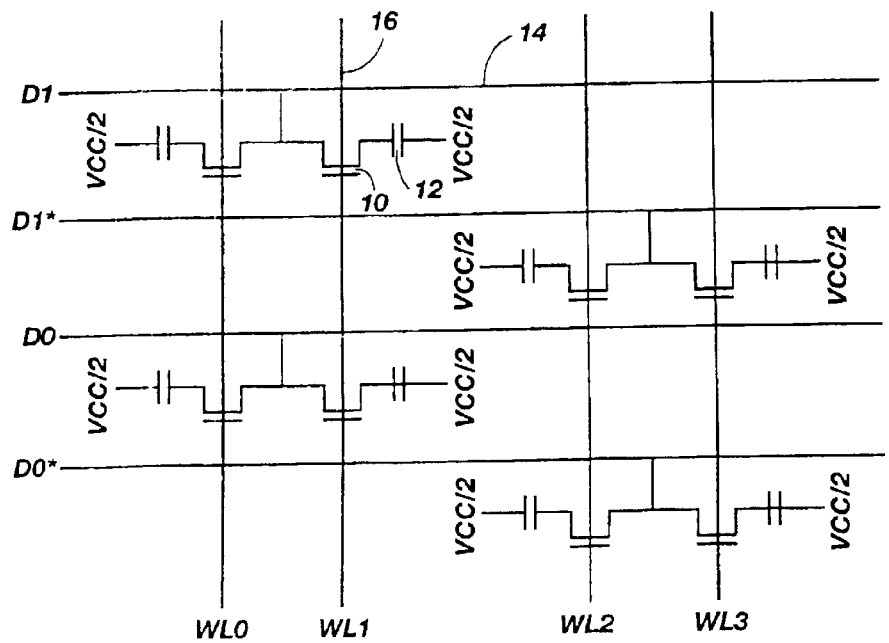
FIG. 2 is a folded memory array schematic.
Figure 3:
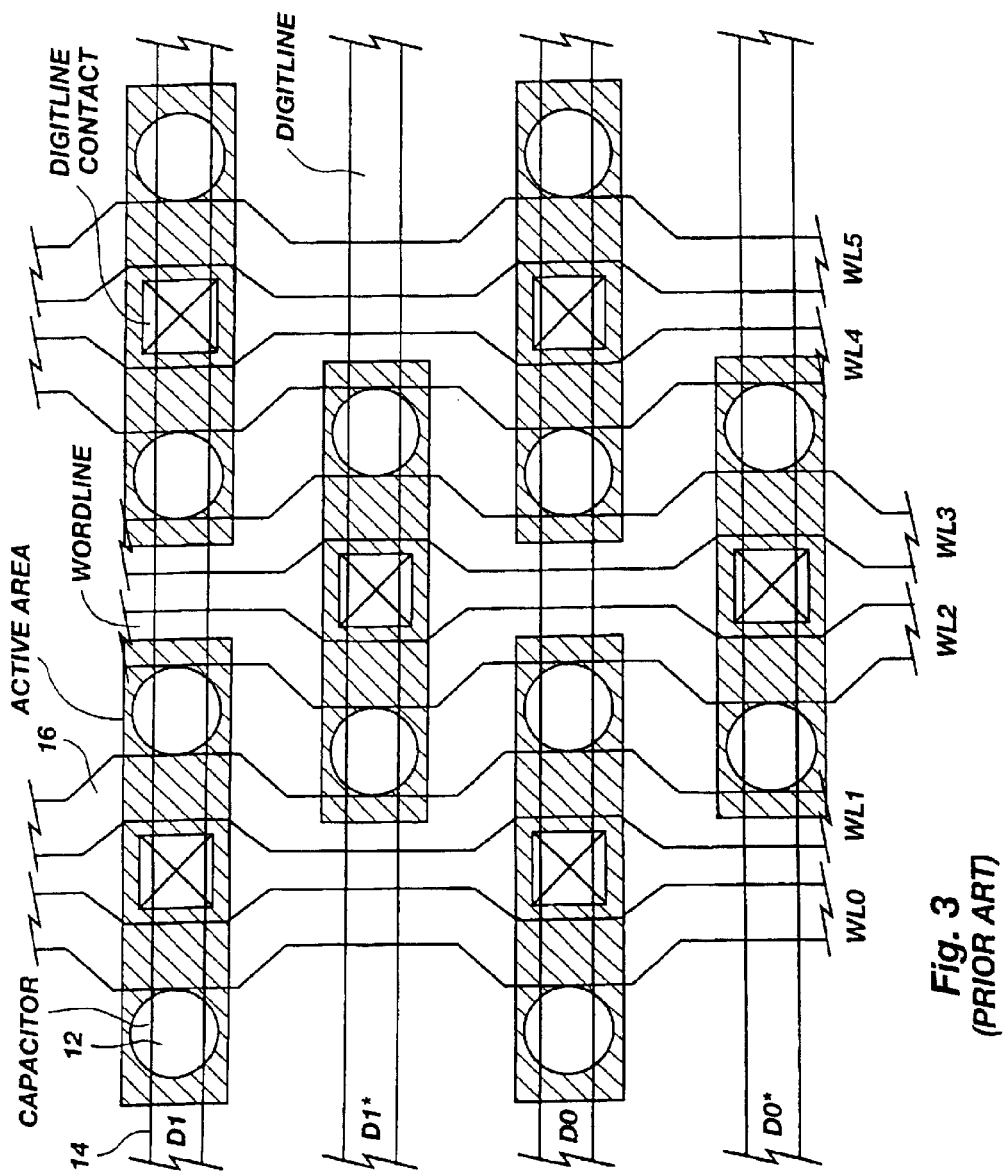
FIG. 3 is a folded memory array layout.
Figure 4:
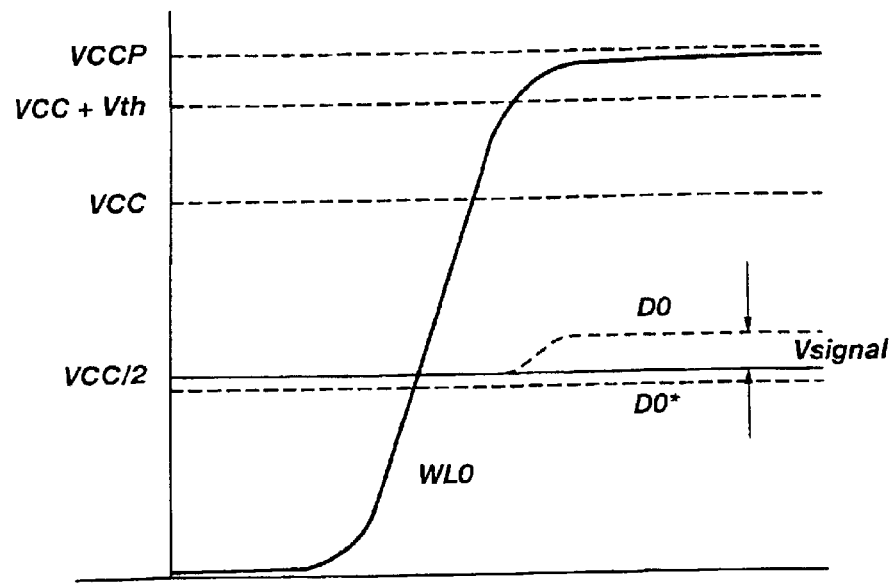
FIG. 4 depicts cell access waveforms.

Referring to FIG. 2, assume that the capacitor has a logic one level (+Vcc/2) stored on it. Conceptually form a digit-line pair or column with two adjacent digitlines. The digitlines, labeled D0 and D0* are initially equilibrated at Vcc/2 volts. All wordlines are initially at zero volts, which turn off the memory bit transistors. To read memory bit1, wordline WL0 transitions to a voltage that is at least one transistor $V_{th}$ above Vcc. This elevated wordline voltage level is referred to as Vccp or Vpp. When the wordline voltage exceeds one $V_{th}$, above the digitline voltage (Vcc/2 in this example) and the memory bit transistor turns on, the memory bit capacitor will begin to discharge onto the digitline. Essentially, reading or accessing a DRAM cell results in charge sharing between the memory bit capacitor and the digitline capacitance. This sharing of charge causes the digitline voltage to either increase for a stored logic one or decrease for a stored logic zero. Ideally, the access will only modify the active digitline, leaving its complement digitline unaltered. In reality, the other digitline voltage will also change slightly, due to parasitic coupling between digitlines and overlap capacitance between the firing wordline and the digitline. Regardless, a differential voltage develops between the two digitlines. The magnitude of this signal voltage is a function of the memory bit capacitance (cmemory bit), digitline capacitance (Cdigit), the memory bit's stored voltage prior to the access (Vcell), and any noise terms. Accordingly, $V_{signal}=[(Vcell \cdot Cmbit) \div (Cdigit+Cmbit)]-V_{noise}$ volts. For a design in which Vcell=1.65V, Cmemory bit=40 fF, Cdigit=300 fF, and $V_{noise}$=0, this equation yields a $V_{signal}$ of 194 mV. FIG. 4 contains typical waveforms for the cell access operation just described.

Figure 5:
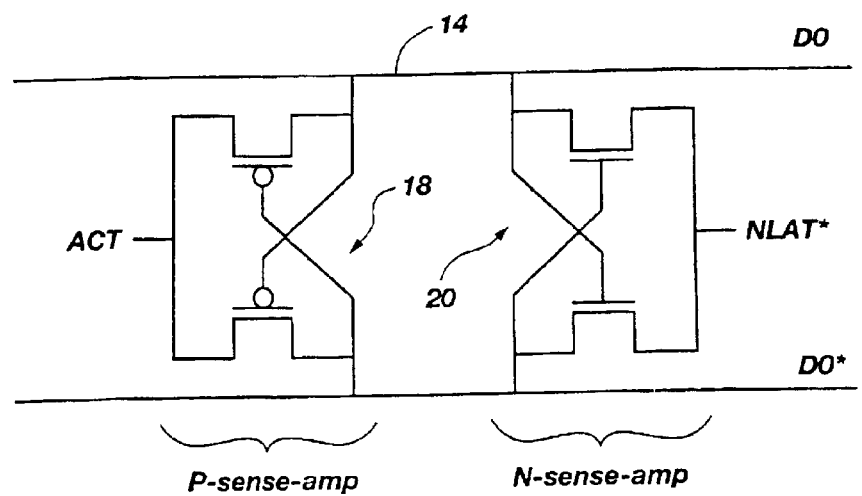
FIG. 5 is a sense amplifier schematic.
Figure 6:
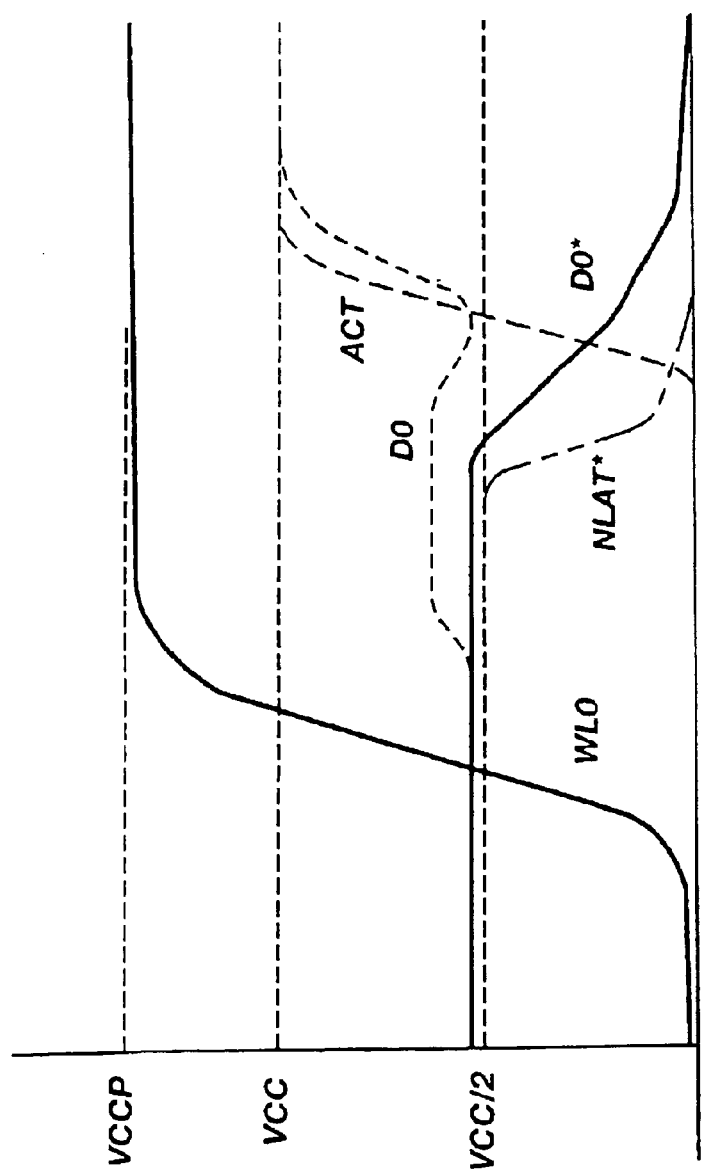
FIG. 6 depicts sensing operation waveforms.

After the cell access is complete, the sensing operation can commence. The reason for forming a digitline pair will now become apparent. FIG. 5 contains a schematic diagram for a simplified sense amplifier circuit. Note that it consists of a cross-coupled PMOS pair 18 and a cross-coupled NMOS pair 20. The NMOS pair or N-sense-amp common node is labeled NLAT* (for N-sense-amp LATch) in FIG. 5. Similarly, the P-sense-amp common node is labeled ACT (for ACTive pull-up). Initially, NLAT* is biased to Vcc/2 and ACT is biased to VSS or ground. Since the digitline pair D0 and D0* are both initially at Vcc/2 volts, the N-sense-amp transistors remain off due to zero Vgs potential. Similarly, both P-sense-amp transistors remain off due to their negative Vgs potential. As discussed in the preceding paragraph, a signal voltage develops between the digitline pair when the memory bit access occurs. While one digitline contains charge from the cell access, the other digitline serves as a reference for the sensing operation. The sense amplifier firing generally occurs sequentially rather than concurrently. The N-sense-amp fires first and the P-sense-amp second. The N-sense-amp is generally a better amplifier than the P-sense-amp because of the higher drive of NMOS transistors and better $V_{th}$ matching. This provides for better sensing characteristics and lower probability of errors. FIG. 6 contains waveforms for the sensing operation. Dropping the NLAT* signal toward ground will fire the N-sense-amp. As the voltage between NLAT* and the digitlines approaches $V_{th}$, the NMOS transistor, whose gate connection is to the higher voltage digitline, will begin to conduct. Transistor conduction occurs first in the subthreshold region, progressing to the saturation region as the gate to source voltage exceeds $V_{th}$. Conduction results in the discharge of the low voltage digitline toward the NLAT* voltage. Ultimately, NLAT* will reach ground, bringing the digitline with it. Note that the other NMOS transistor will not conduct since its gate voltage derives from the low voltage digitline, which is discharging toward ground. In reality, parasitic coupling between the digitlines and limited subthreshold conduction by the second transistor will reduce the high digitline voltage.

Shortly after the N-sense-amp fires, ACT will drive toward Vcc. This activates the P-sense-amp that operates in a complementary fashion to the N-sense-amp. With the low voltage digitline approaching ground, a strong signal exists to drive the appropriate PMOS transistor into conduction. This conduction, again moving from subthreshold to saturation operation, will charge the high voltage digitline toward ACT, ultimately reaching Vcc. Since the memory bit transistor remains on during sensing, the memory bit capacitor will charge to the NLAT* or ACT voltage level. The voltage, and hence charge, which the memory bit capacitor held prior to accessing will restore a full level—Vcc for a logic one and GND for a logic zero. It should be apparent now why the minimum wordline voltage is $V_{th}$ above Vcc. If Vccp were anything less, the memory bit transistor would turn off before the memory bit capacitor attains a full Vcc level.

Figure 7:
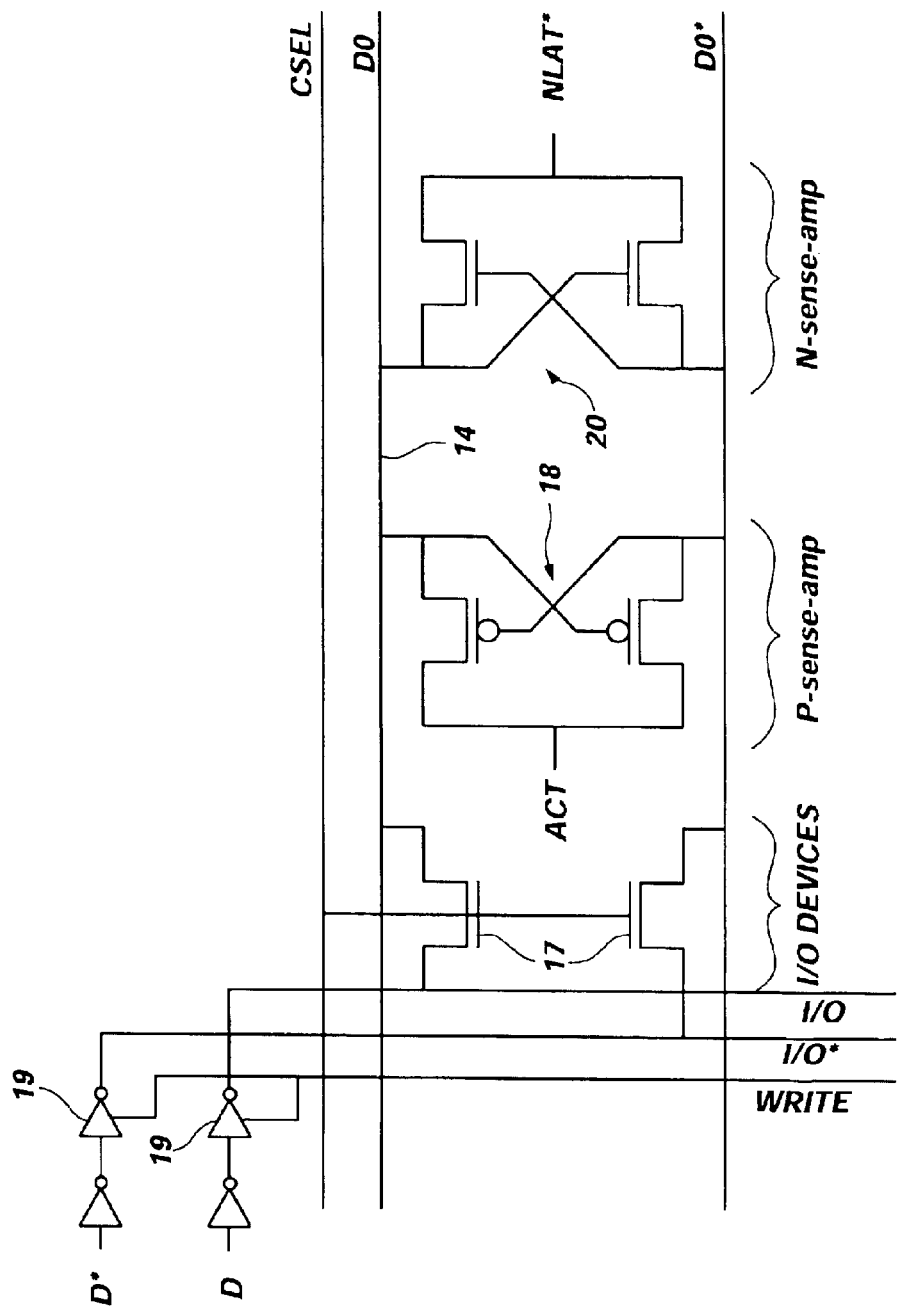
FIG. 7 is a sense amplifier schematic with I/O devices.
Figure 8:
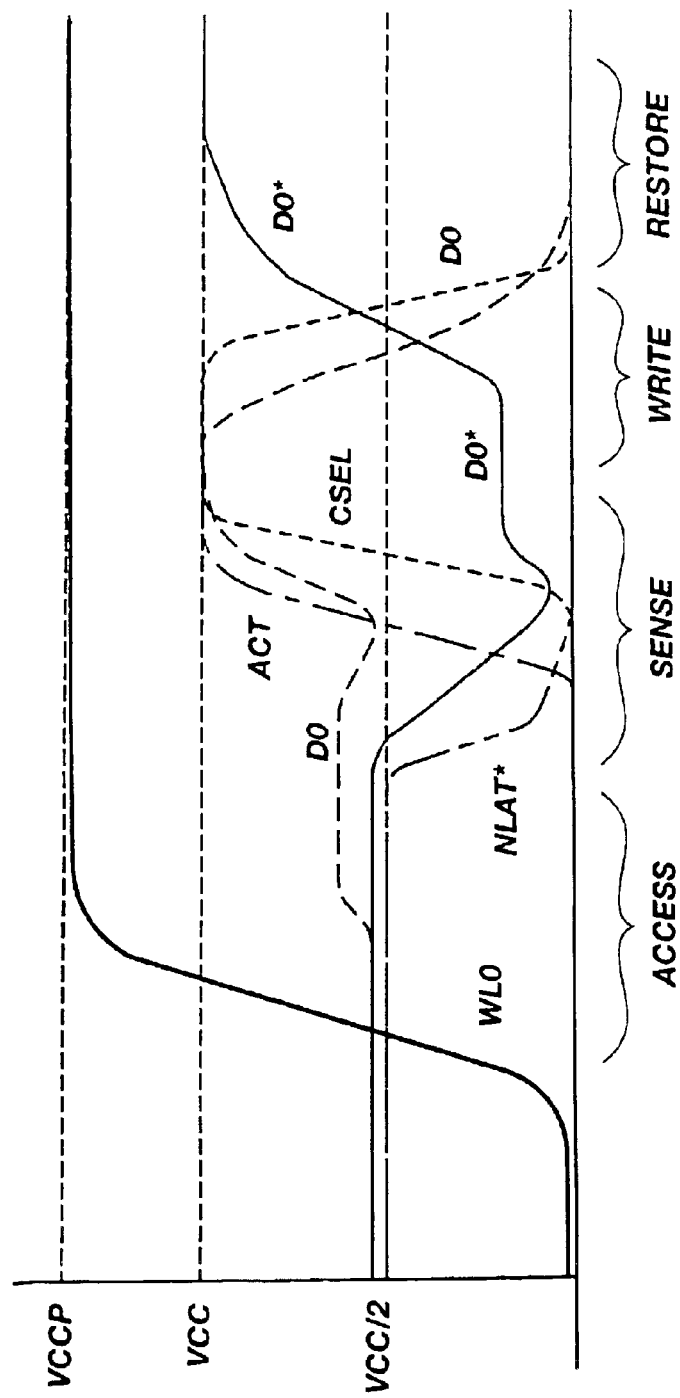
FIG. 8 depicts write operation waveforms.

A DRAM write operation is very similar to sensing and restore operations except that separate write driver circuits determine whether logic ones or zeros are placed into the cells. The write driver circuit is generally a tri-state inverter 19 connected to the digitlines through a second pair of pass transistors 17 as shown in FIG. 7. These pass transistors are referred to as I/O transistors. The gate terminals of the I/O transistors connect to a common CSEL (Column SELect) signal. The column address determines which CSEL signal activates and ultimately which pair (or multiple pairs) of digitlines route to the output pad or write driver. In most current DRAM designs, the write driver simply overdrives the sense amplifier pair, which remains active during the writing operation. The write operation needs to be long enough in duration to flip the sense amplifiers. After new data writes into the sense amplifiers, the amplifiers actually finish the write cycle by restoring the digitlines to full rail to rail voltages. FIG. 8 contains an example of this, in which D0 is initially high after the sensing operation, and low after the write operation. Each read cycle refreshes all of the memory bit capacitors connected to the active wordline. A write operation, though, involves only two to four memory bits within an array of memory bits. This is because a single CSEL line generally connects to only four I/O transistor pairs. The remaining digitlines are accessible through additional CSEL lines corresponding to different column address locations.

Memory Cells and Arrays. The primary advantage of DRAM, over other types of memory technology, is low cost. This advantage arises from the simplicity and scaling characteristics of its 1T1C memory cell. Although the DRAM memory bit encompasses simple concepts, its actual design and implementation are highly complex. Successful, cost-effective DRAM designs require a tremendous amount of process technology.

Figure 9:
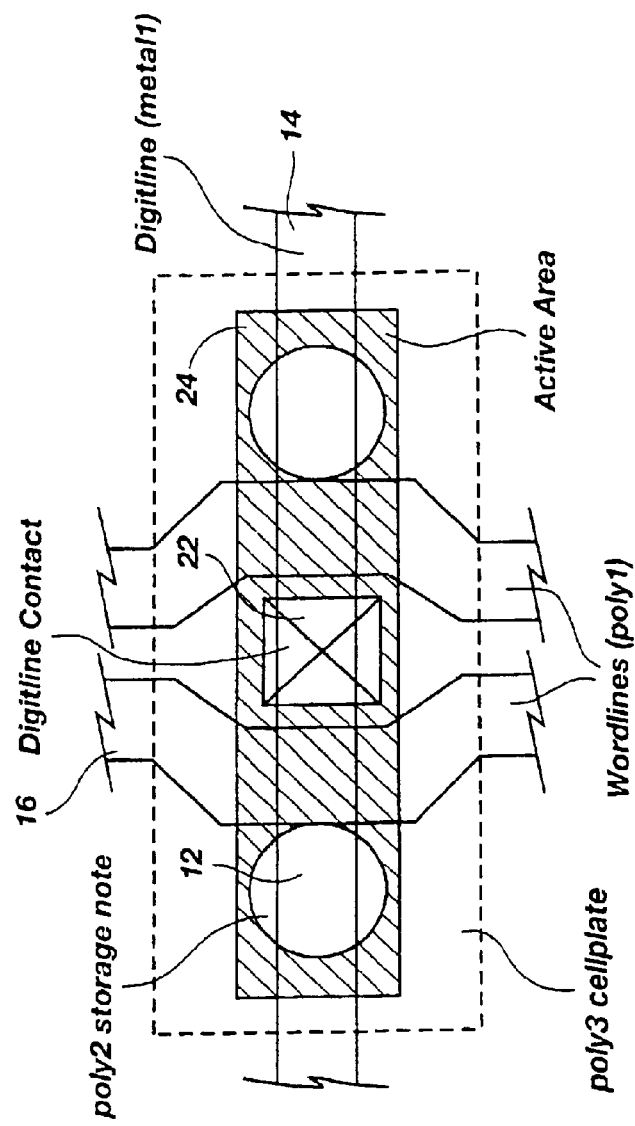
FIG. 9 is a memory bit pair layout.

A modem buried capacitor DRAM memory bit pair appears in FIG. 9. DRAM memory bits are constructed in pairs to allow sharing of the digitline contact 22. Sharing a contact significantly reduces overall cell size. The memory bits consist of an active area rectangle 24 (in this case N+active area), a pair of polysilicon wordlines 16, a single digitline contact 22, a metal or polysilicon digitline 14, and a pair of cell capacitors 12 formed with oxide-nitride-oxide dielectric between two layers of polysilicon. For some processes, the wordline polysilicon is silicided to reduce the sheet resistance, permitting longer wordline segments without reducing speed. The memory bit layout, shown in FIG. 9, is essentially under the control of process engineers, since every aspect of the memory bit must meet stringent performance criteria.

Figure 10:
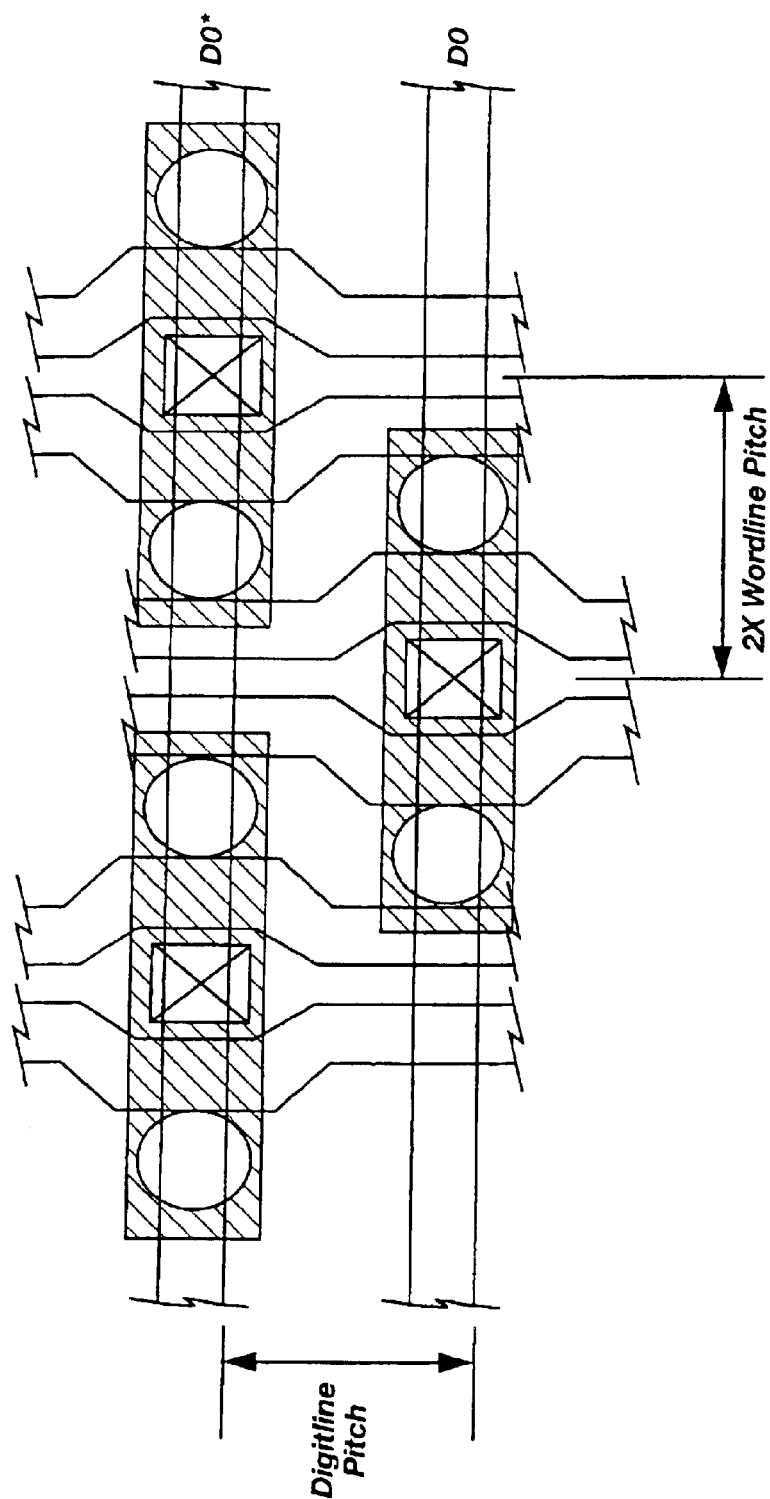
FIG. 10 is a layout to show array pitch.

A small array of memory bits appears in FIG. 10. This figure is useful to illustrate several features of the memory bit. First, note that the digitline pitch (width plus space) dictates the active area pitch and capacitor pitch. Process engineers adjust the active area width and the field oxide width to maximize transistor drive and minimize transistor to transistor leakage. The field oxide technology greatly impacts this balance. A thicker field oxide or a shallower junction depth will enable wider transistor active area. Second, the wordline pitch (width plus space) dictates the space available for the digitline contact, transistor length, active area space, field poly width, and capacitor length. Optimization of each of these features by process engineers is necessary to maximize capacitance, minimize leakage and maximize yield. Contact technology, subthreshold transistor characteristics, photolithography, etch and film technology will dictate the overall design.

Figure 11:
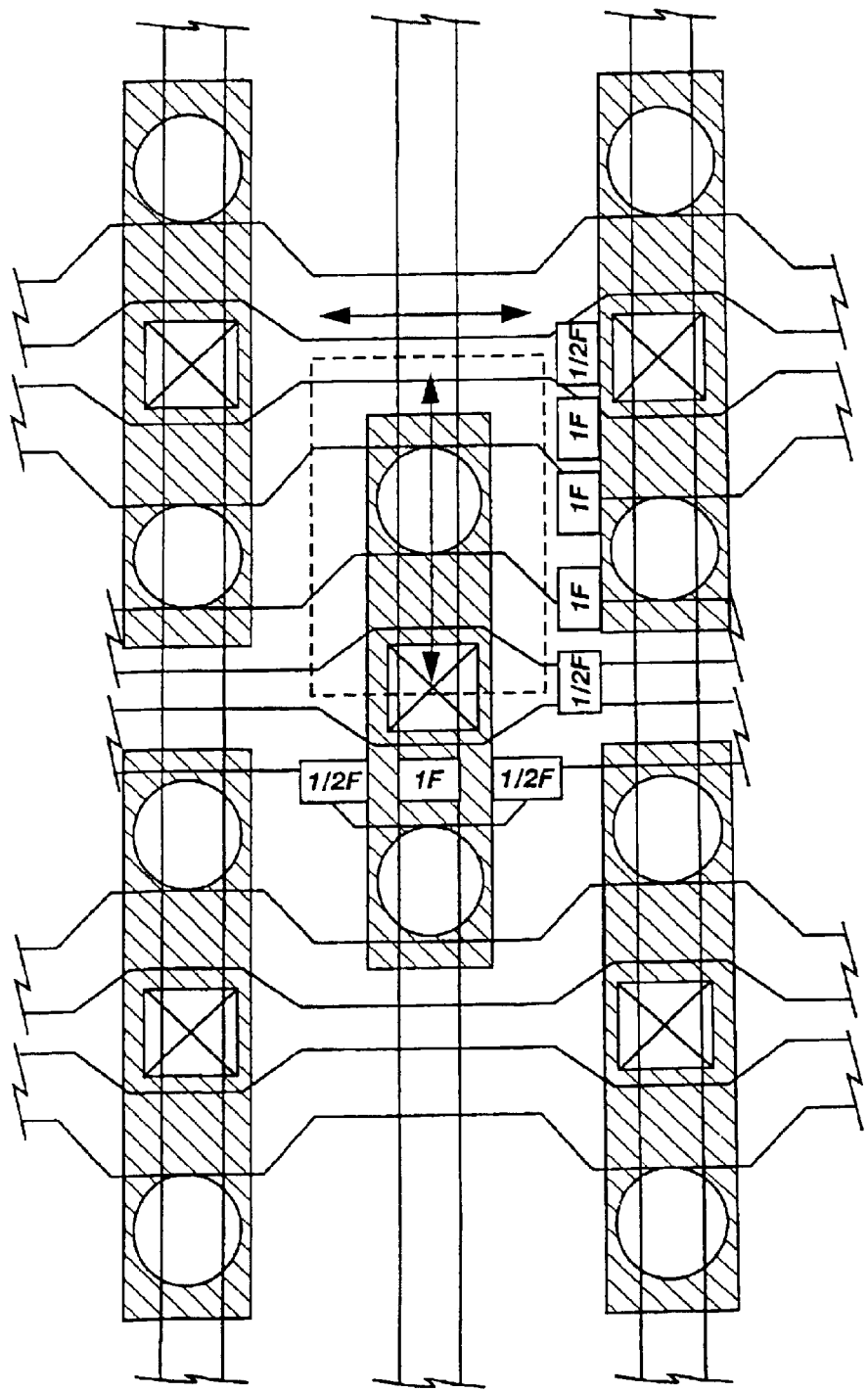
FIG. 11 is a layout to show $8F^2$ derivation.

The memory bit shown in FIGS. 9 and 10 is by definition an eight square feature ($8F^2$) cell. The intended definition of feature is minimum realizable process dimension, but in actual fact equates to a dimension that is half of the wordline (row) or digitline (column) pitch. A 0.25 μm process having wordline and digitline pitches of 0.6 µm yields a memory bit size that is 8·(0.3 µm)²=0.72 µm². Explanation of the 8F² designation is easier with the aid of FIG. 11. An imaginary box drawn around the memory bit defines the cell's outer boundary. Along the x-axis, this box will include ½ digitline contact feature, 1 wordline feature, 1 capacitor feature, 1 field poly feature, and ½ poly space feature, which totals to 4 features. Along the y-axis, this box contains two ½ field oxide features and 1 active area feature, which totals to 2 features. The area of the memory bit is, as defined herein, 4F·2F=8F. The folded array architecture, as shown in FIG. 10, always produces an 8F² memory bit. This results from the fact that each wordline connects (forms a cross-point) with a memory bit transistor on every other digitline and must pass around memory bit transistors as field poly on the remaining digitlines. The field poly in each memory bit cell adds two square features to what would have been a 6F² cell otherwise. Although the folded array yields a cell that is 25% larger than other array architectures, it also produces superior signal-to-noise performance, especially when combined with some form of digitline twisting. Superior low noise performance made folded array architecture the architecture of choice since the 64 kbit generation. It will be appreciated that additional techniques can be used to measure memory cell sizes which may produce different results from the technique described and used to determine cell size herein. One technique which may produce a different cell size measurement is to square the smaller of either the row or column pitch. It is intended for the purpose of the present invention that memory cell size be determined using the above detailed definition.

Figure 12:
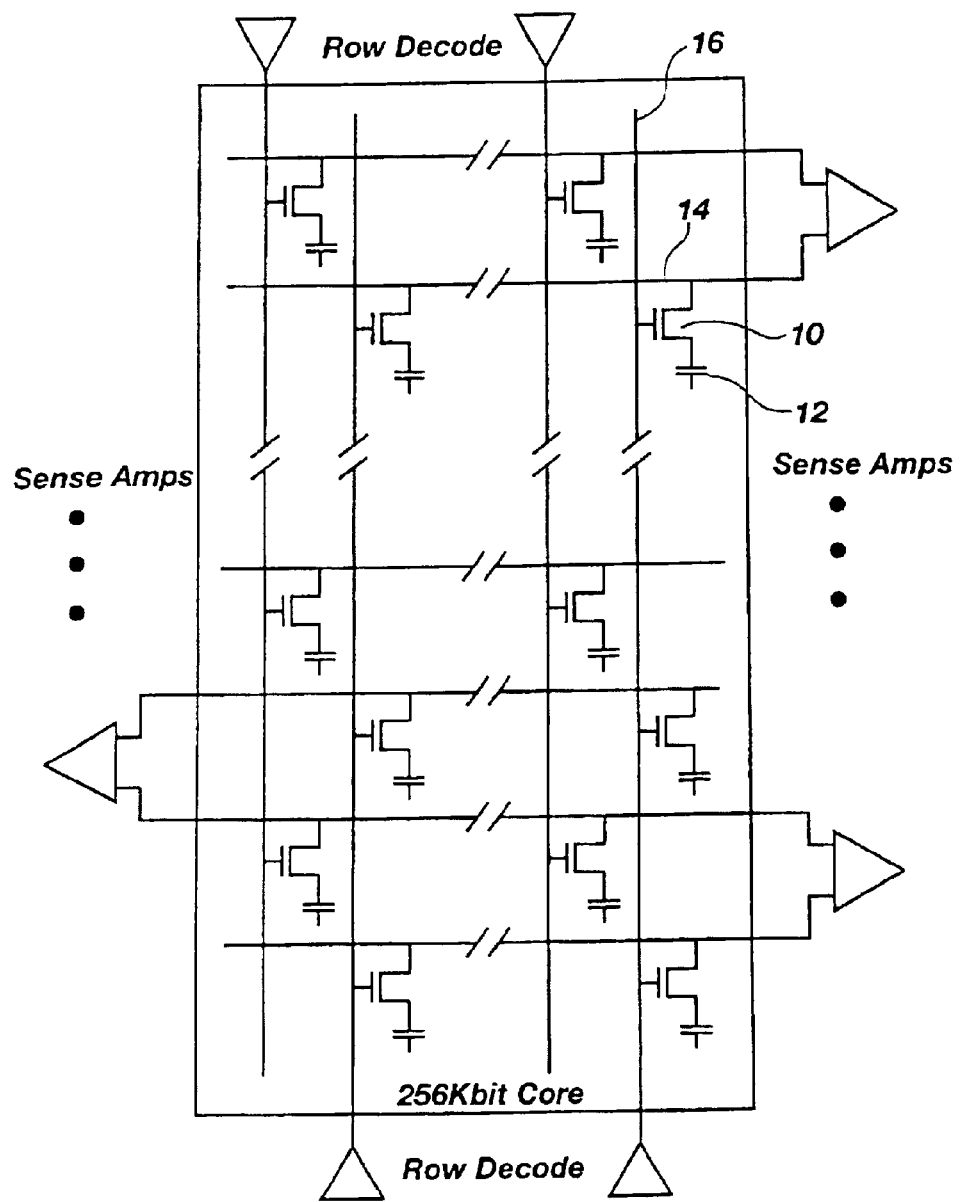
FIG. 12 is a folded digitline array schematic.
Figure 13:
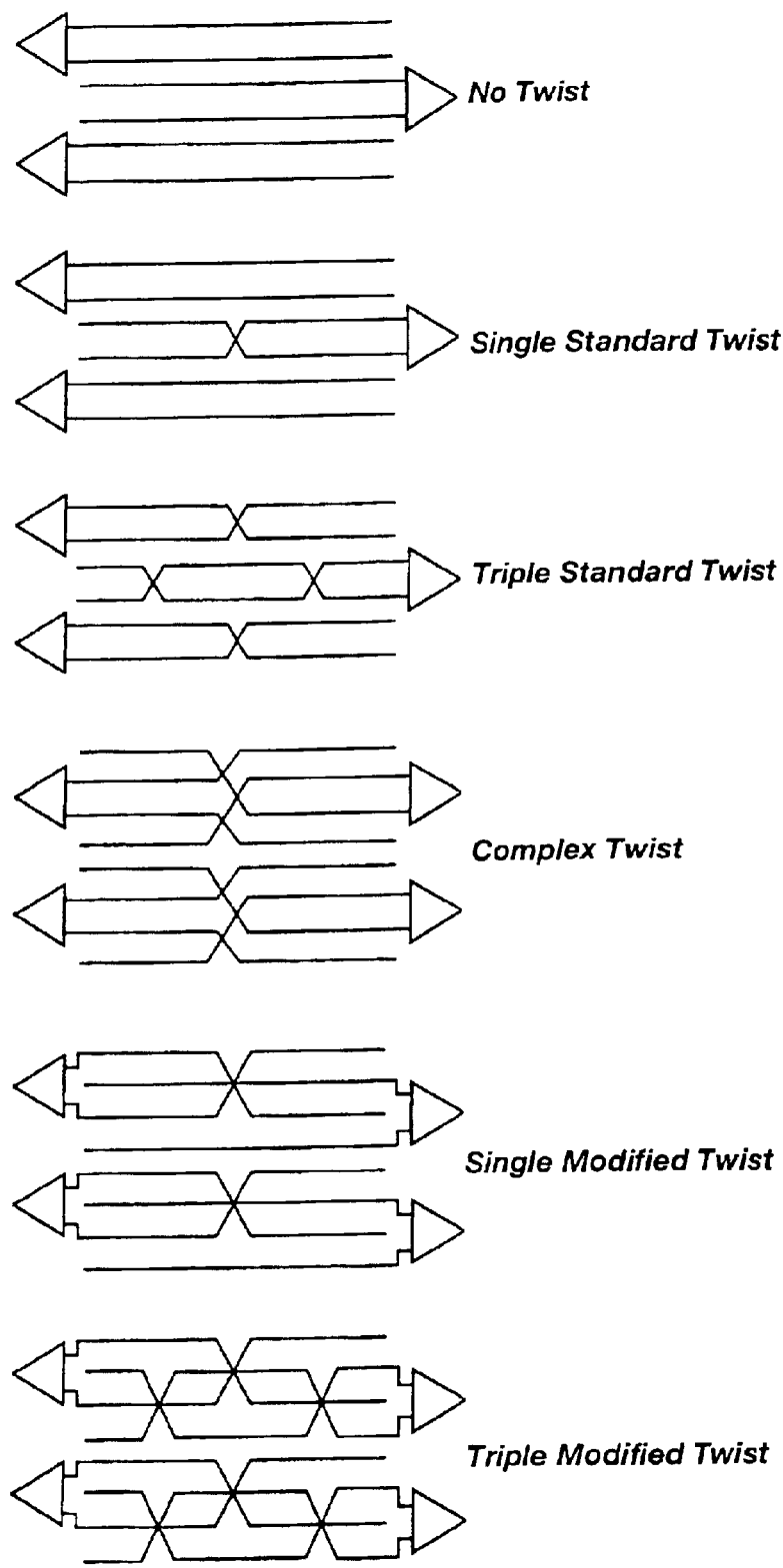
FIG. 13 depicts digitline twist schemes.

A folded array is schematically depicted in FIG. 12. Sense amplifier circuits placed at the edge of each array connect to both true and complement digitlines (D and D*) coming from a single array. Optional digitline pair twisting at one or more places can reduce and balance the coupling to adjacent digitline pairs and improve overall signal-to-noise characteristics. FIG. 13 serves as evidence of the variety of twisting schemes used throughout the DRAM industry. Ideally, a twist scheme will equalize the coupling terms from each digitline to all other digitlines, both true and complement. If done properly, the noise terms will cancel or only produce common mode noise to which the differential sense amplifier is immune. Each digitline twist region consumes valuable silicon area. As a result, design engineers resort to the simplest and most efficient twisting scheme to get the job done. Since the coupling between adjacent metal lines is inversely proportional to their spacing, the signal-to-noise problem gets increasingly worse as DRAMs scale to smaller and smaller dimensions. Evidence of this problem is the industry trend to use more complex twisting schemes on succeeding generations.

Figure 14:
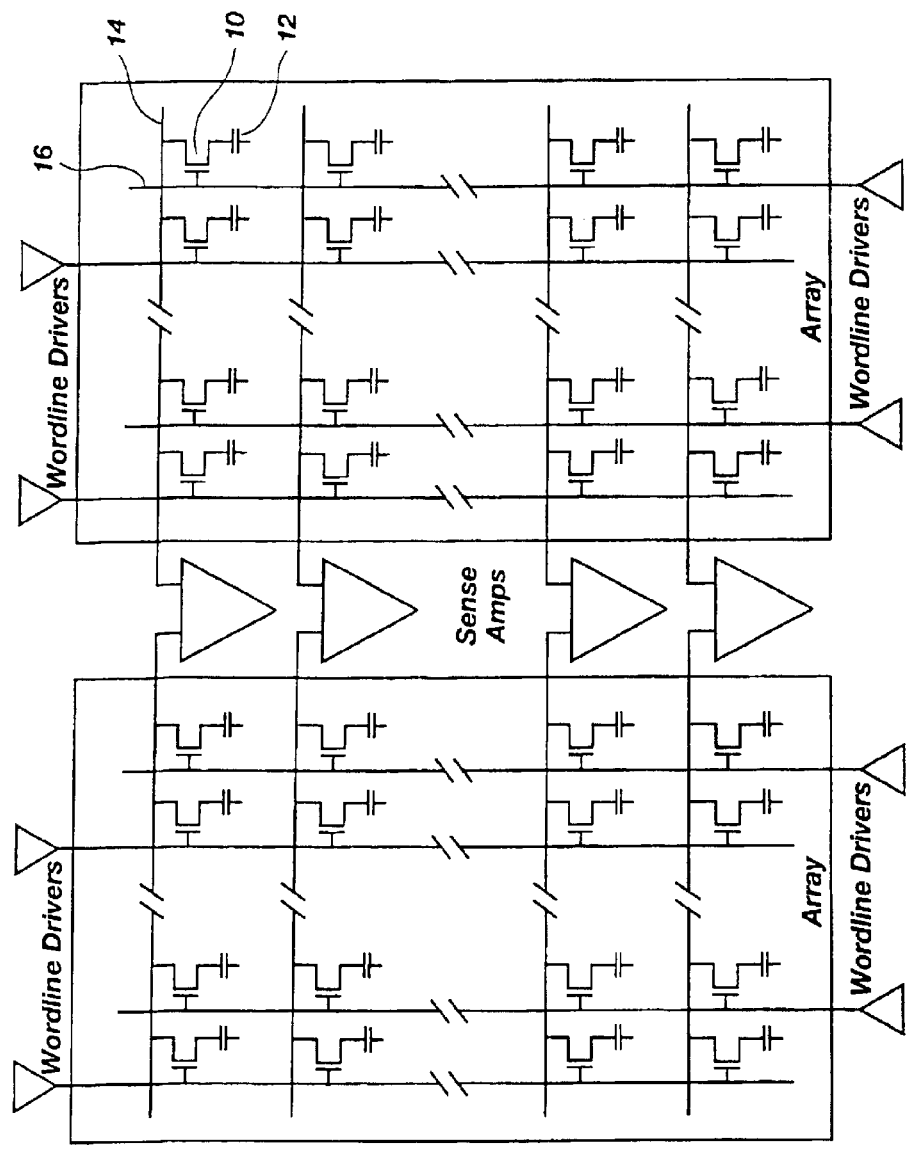
FIG. 14 is an open digitline array schematic.
Figure 15:
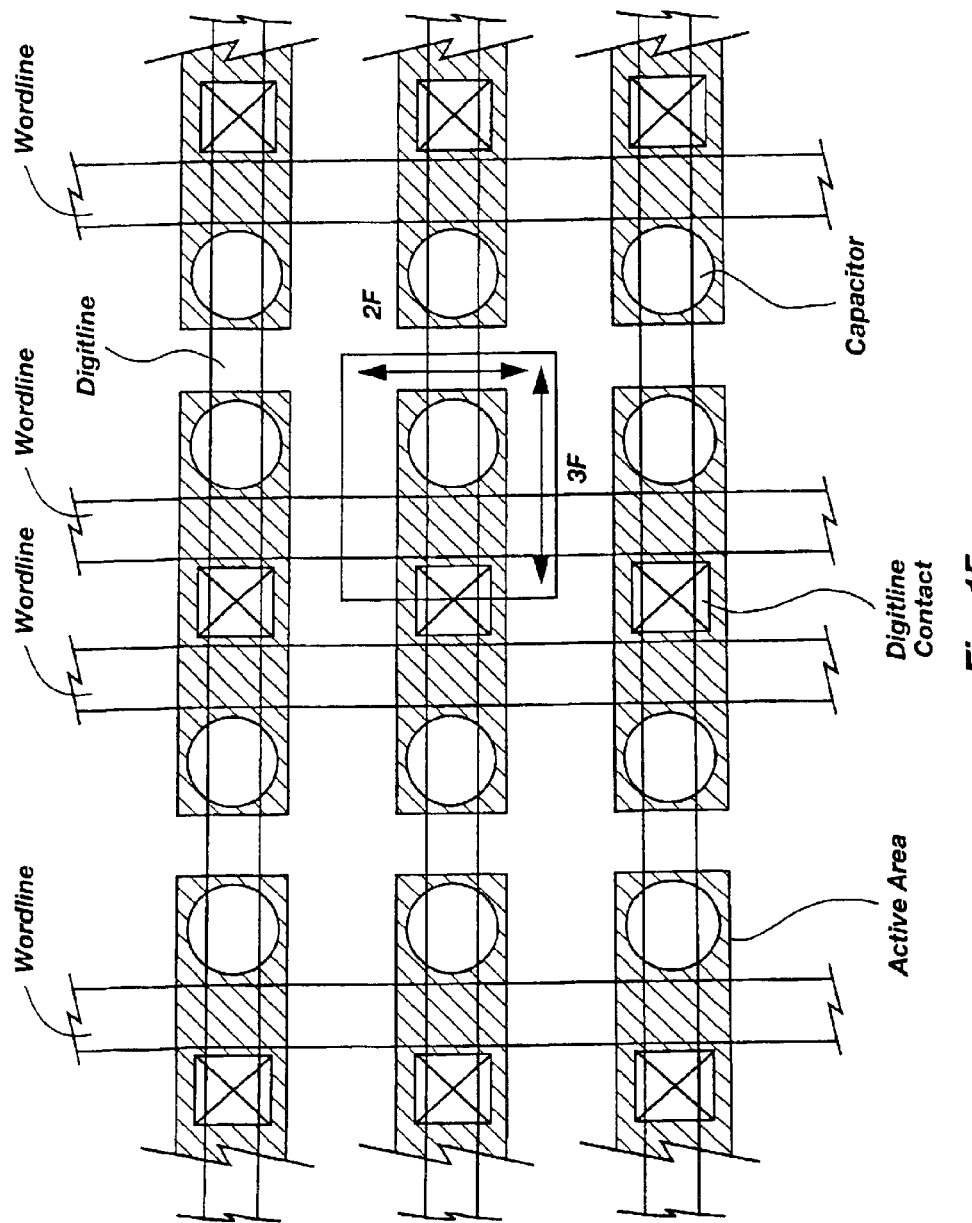
FIG. 15 is an open digitline array layout.

An alternative to the folded array architecture, popular prior to the 64 kbit generation, was the open digitline architecture. Seen schematically in FIG. 14, this architecture also features the sense amplifier circuits between two sets of arrays. Unlike the folded array, though, true and complement digitlines (D and D*) connected to each sense amplifier pair come from separate arrays. This precludes the use of digitline twisting to improve signal-to-noise performance and identifies the prevalent reason why the industry switched to the folded array architecture. Also note that, unlike the folded array architecture, each wordline in an open digitline architecture connects to memory bit transistors on every digitline—cross-point style arrays. This feature permits a 25% reduction in memory bit size to only 6F² since the wordlines do not have to pass alternate memory bits as field poly. The layout for an array of standard 6F² memory bit pairs is shown in FIG. 15. A box is drawn around one of the memory bits to show the 6F² cell boundary. Again, two memory bits share a common digitline contact to improve layout efficiency. Unfortunately, most manufacturers have found that the signal-to-noise problems of open digitline architecture outweigh the benefits derived from reduced array size.

Digitline capacitive components, contributed by each memory bit, include junction capacitance, digitline to cellplate (poly3), digitline to wordline, digitline to digitline, digitline to substrate, and in some cases digitline to storage cell (poly2) capacitance. Each memory bit connected to the digitline, therefore, adds a specific amount of capacitance to the digitline. Most modern DRAM designs have no more than 256 memory bits connected to a digitline segment. Two factors dictate this quantity. First for a given cell size, as determined by row and column pitches, there is a maximum achievable storage capacitance without resorting to exotic processes or excessive cell height. For processes in which the digitline is above the storage capacitor (buried capacitor), contact technology will determine the maximum allowable cell height. This fixes the volume available (cell area multiplied by cell height) in which to build the storage capacitor. Second, as the digitline capacitance increases, the power associated with charging and discharging this capacitance during reading and writing operations increases. Any given wordline essentially accesses (crosses) all of the columns within a DRAM. For a 256 Meg DRAM, each wordline crosses 16,384 columns. With a multiplier such as that, it is easy to appreciate why limits to digitline capacitance are necessary to keep power dissipation low.

Figure 16:
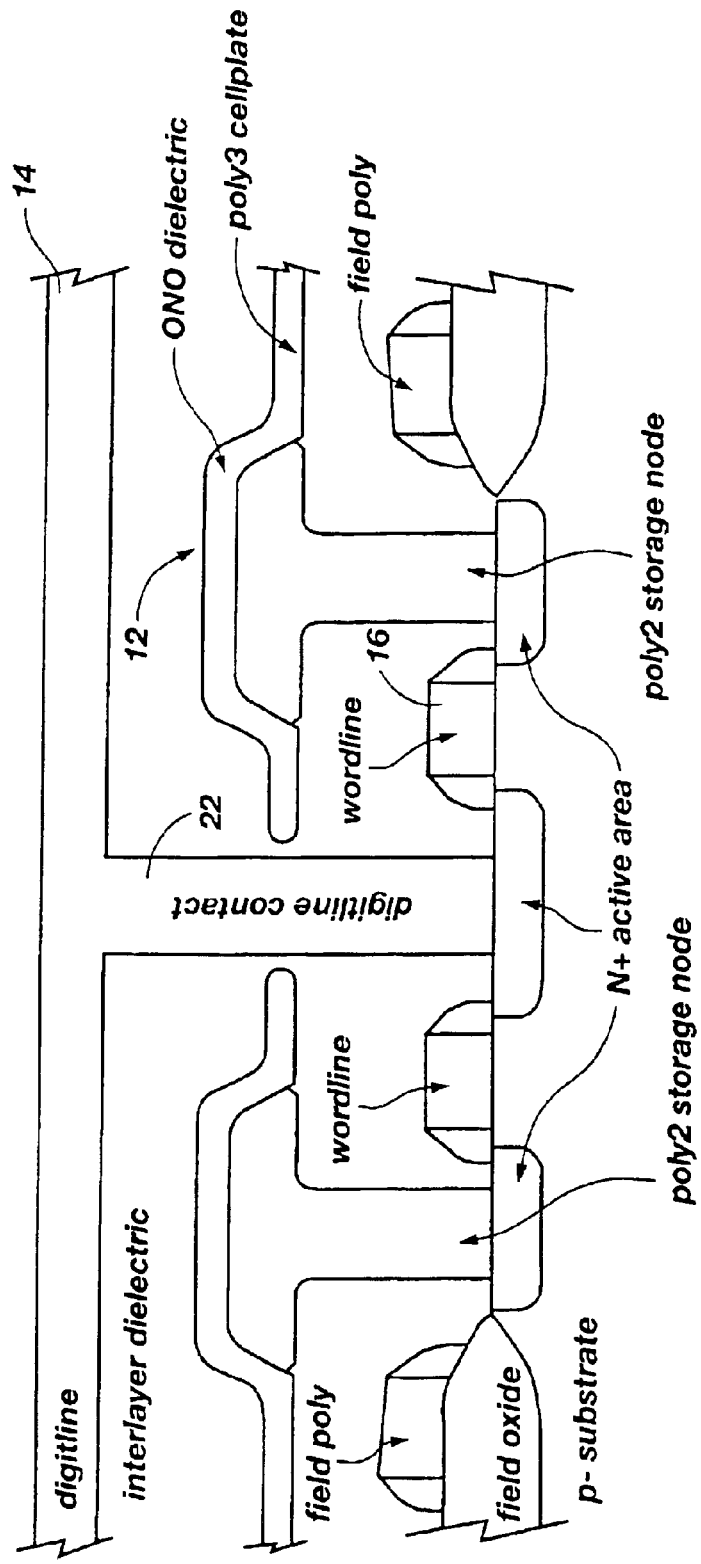
FIG. 16 is a buried capacitor cell process cross-section.

FIG. 16 contains a process cross-section for the buried capacitor memory bit depicted in FIG. 9. This type of memory bit, employing a buried capacitor structure, places the digitline physically above the storage capacitor. The digitline is constructed from either metal or polycide while the digitline contact is formed using metal or polysilicon plug technology. The memory bit capacitor is formed with polysilicon (poly2) as the bottom plate, an oxide-nitrideoxide (ONO) dielectric, and a sheet of polysilicon (poly3) which forms the common node shared by all memory bit capacitors. The capacitor shape can be simple, such as a rectangle, or complex, such as concentric cylinders or stacked discs. Exotic capacitor structures are the topic of many DRAM process papers. The ONO dielectric undergoes optimization to achieve maximum capacitance with minimum leakage. It must also tolerate the maximum DRAM operating voltage without breakdown. For this reason, the cellplate (poly3) is normally biased at +Vcc/2 volts. This will ensure that the dielectric will have no more than Vcc/2 volts across it for either stored logic state, a logic one at +Vcc/2 volts or a logic zero at −Vcc/2 volts.

Figure 17:
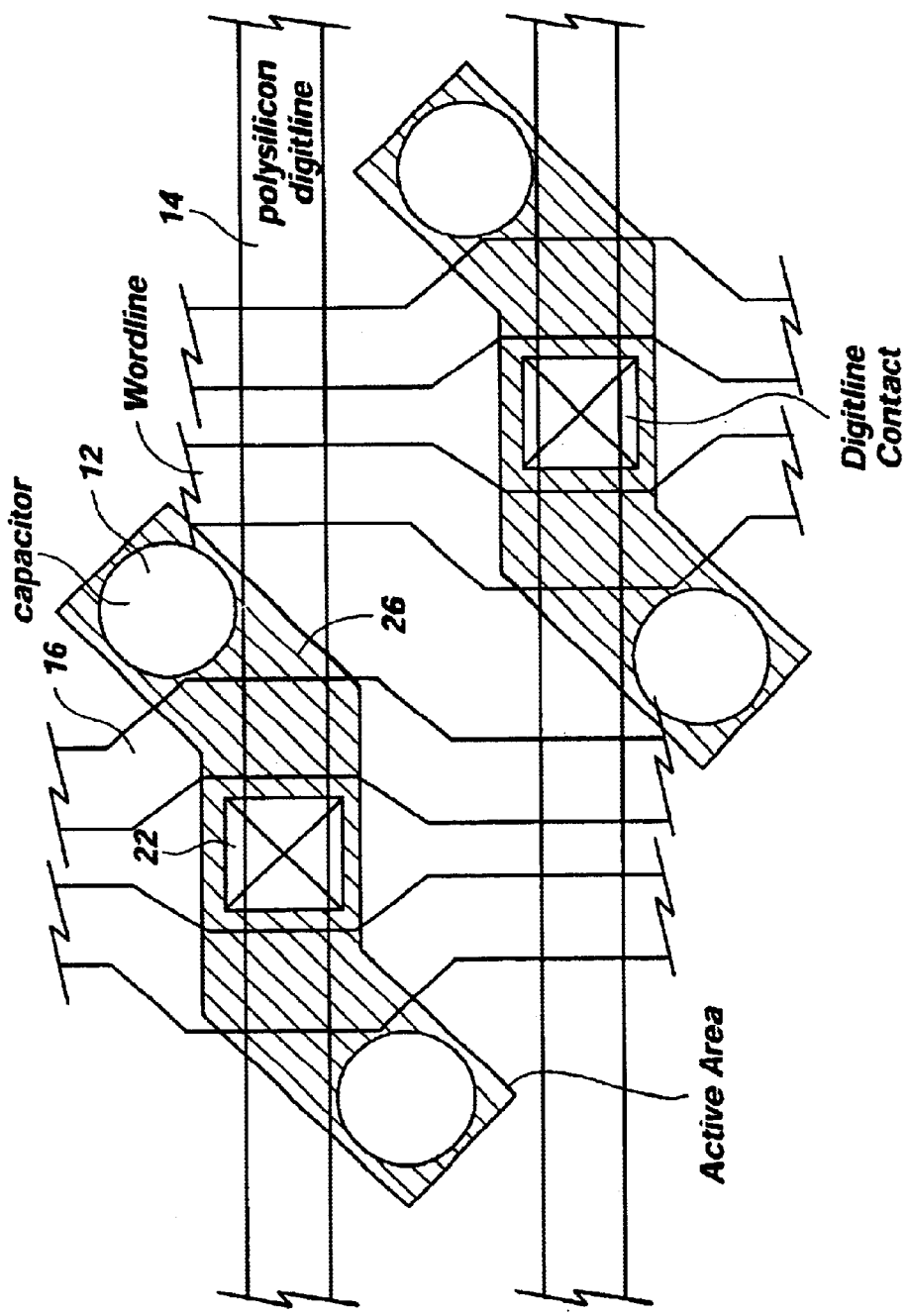
FIG. 17 is a buried digitline memory bit cell layout.
Figure 18:
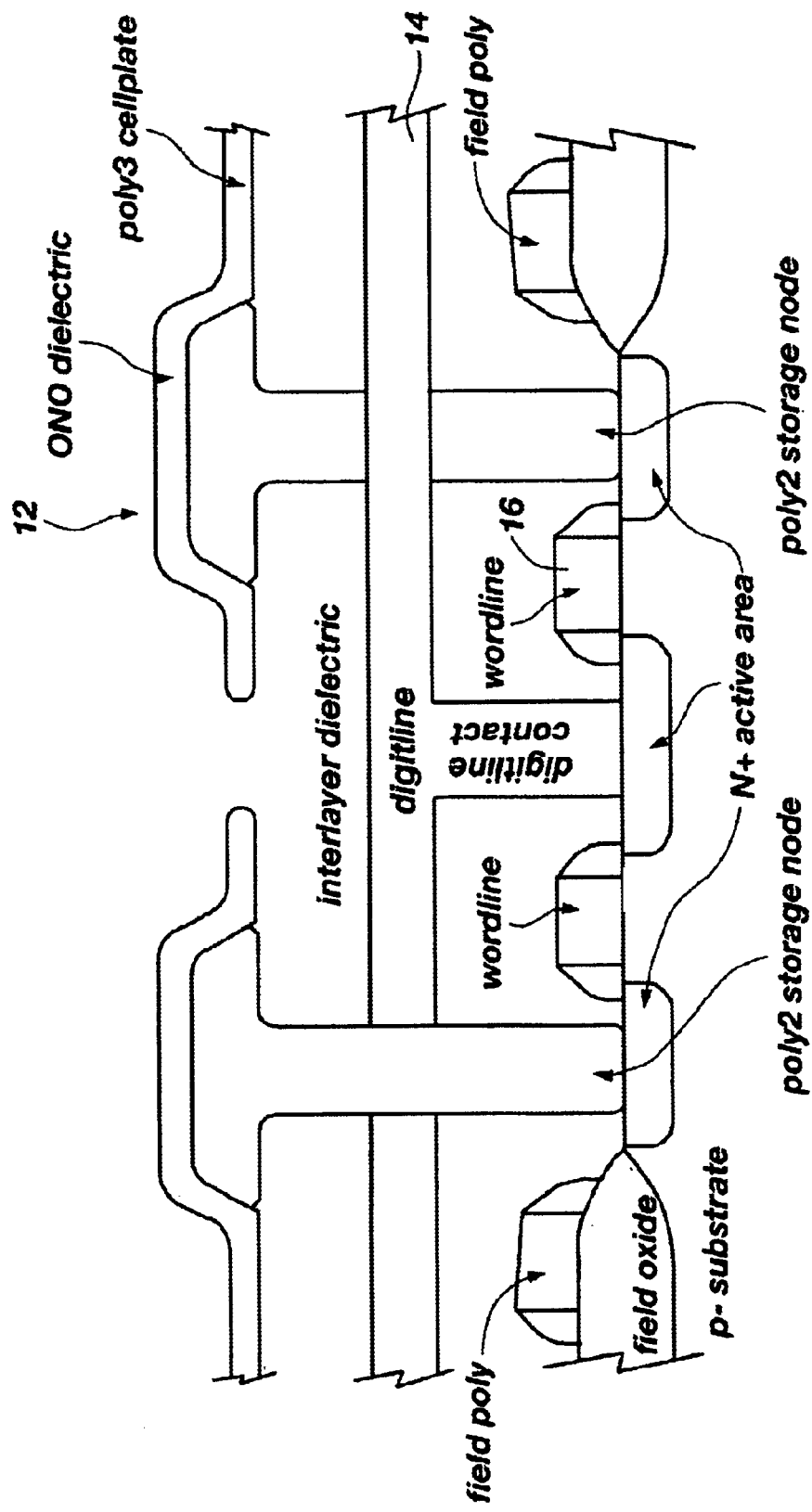
FIG. 18 is a buried digitline memory bit process cross-section.

There are two other basic memory bit configurations used in the DRAM industry. The first, shown in FIGS. 17 and 18, is referred to as a buried digitline or capacitor over bitline cell. The digitline in this cell is almost always made from polysilicon rather than metal. As viewed from the top, the active area 26 is normally bent or angled to accommodate the storage capacitor contact that must drop between digitlines. An advantage that the buried digitline cell has over the buried capacitor cell of FIG. 16 is that the digitline is physically very close to the silicon surface, making digitline contacts much easier to produce. The angled active area, though, reduces the effective active area pitch, constraining the isolation process even further. Buried digitline cells also make formation of the capacitor contact extremely difficult.

Since the digitline is at or near minimum pitch for the process, insertion of a contact between digitlines is far from trivial.

Figure 19:
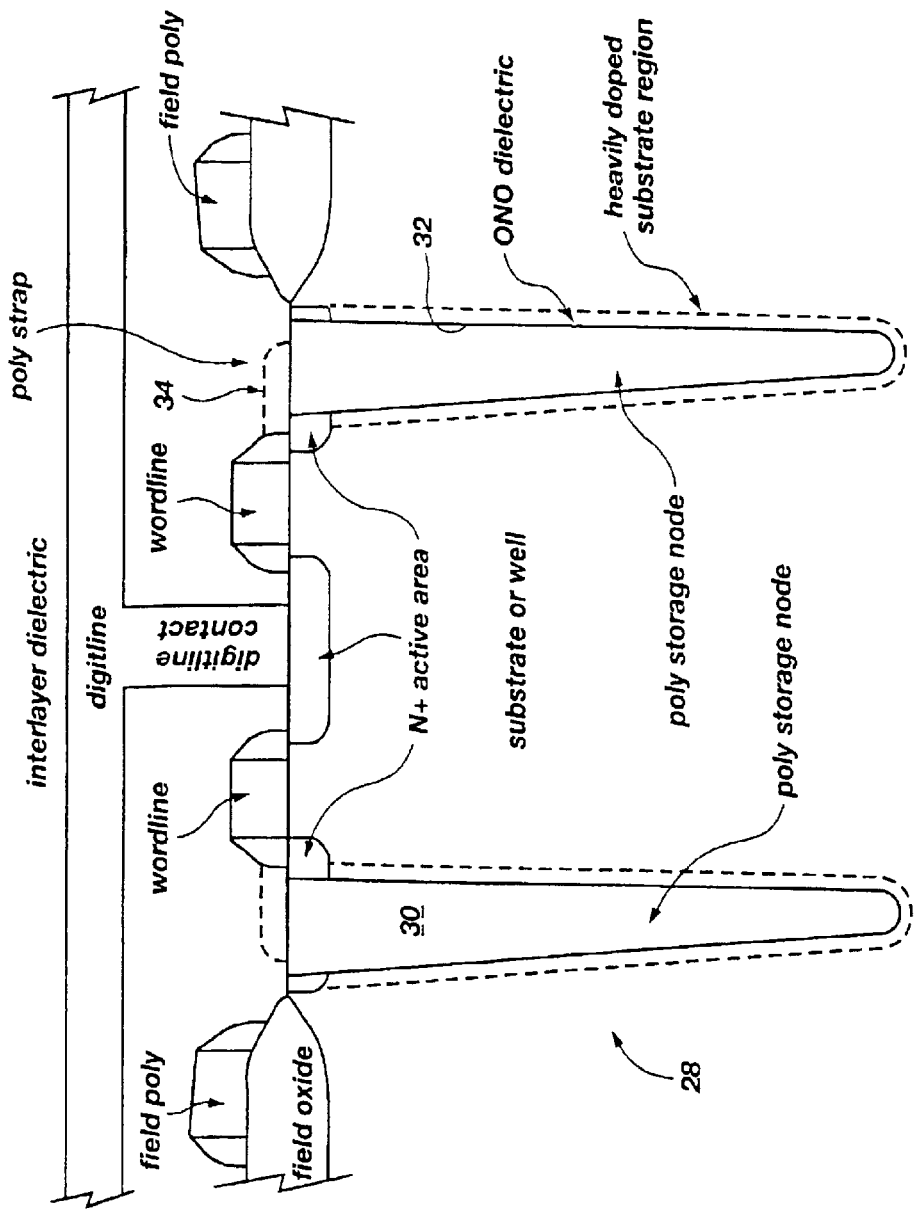
FIG. 19 is a trench capacitor memory bit process cross-section.

FIG. 19 contains a process cross-section of the third type of memory bit used in the construction of DRAMs. This cell utilizes trench storage capacitors 28 and is accordingly called a trench cell. Trench capacitors are formed in the silicon substrate, rather than above the substrate, after etching deep holes into the wafer. The storage node consists of a doped polysilicon plug 30 deposited in the hole following growth or deposition of the capacitor dielectric 32. Contact between the storage node plug and the transistor drain is usually made through a poly strap 34. With most trench capacitor designs, the substrate serves as the common node connection to the capacitors, preventing the use of +Vcc/2 bias and thinner dielectric. The substrate is heavily doped around the capacitor to reduce the resistance and improve the capacitor's CV characteristics. A real advantage to the trench cell is that the capacitance can be increased by merely etching a deeper hole into the substrate. Furthermore, the capacitor does not add stack height to the design, which greatly simplifies contact technology. The disadvantage to trench capacitor technology resides in the difficulty with reliably building capacitors in deep silicon holes and in connecting the trench capacitor to the transistor drain terminal.

Sense Amplifier Elements. The term "sense amplifier" refers to a collection of circuit elements that pitch up to the digitlines of a DRAM array. This collection most generally includes isolation transistors, devices for digitline equilibration and bias, one or more N-sense amplifiers, one or more P-sense amplifiers, and devices to connect selected digitlines to I/O signal lines. All of these circuits along with the wordline driver circuits, to be discussed later, are called pitch cells. This designation comes from the requirement that the physical layout for these circuits is constrained by the digitline and wordline pitches of an array of memory bits. For example, the sense amplifier layout for a specific digitline pair (column) generally consumes the space of four digitlines. This is commonly referred to as quarter-pitch or four-pitch, such that one sense amplifier exists for every four digitlines.

The first elements for review are the equilibration and bias circuits. From the earlier discussions on DRAM operation, the digitlines start at Vcc/2 volts prior to cell access and sensing. In this paired digitline configuration, it is important to the sensing operation that both digitlines, which form a column pair, are at the same voltage before firing a wordline. Any offset voltage that appears between the pair will directly reduce the effective signal voltage produced by the access operation. Digitline equilibration is accomplished with one or more NMOS transistors connected between the digitlines. The higher drive strength of an NMOS device produces faster equilibration than a PMOS transistor of comparable size. An equilibration transistor, together with bias transistors, appears schematically in FIG. 20. The gate terminal 36 is connected to a signal called EQ (EQuilibrate). EQ is held at Vcc whenever the external row address strobe (RAS*) is high, indicating an inactive or precharge state for the DRAM. When RAS* falls, EQ will transition low, turning off the equilibration transistor just prior to any wordline firing. Toward the end of each RAS* cycle, EQ will again transition high and force the digitlines to re-equilibrate.

Figure 20:
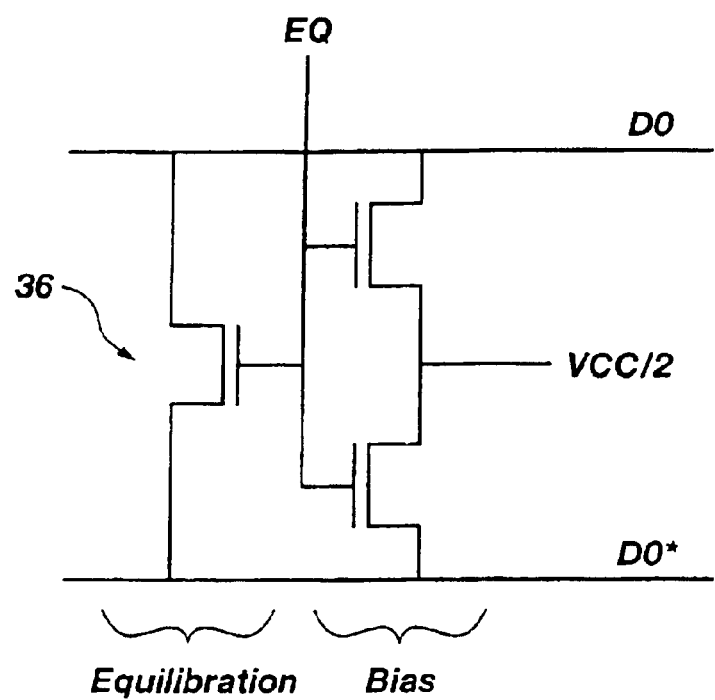
FIG. 20 is an equilibration and bias circuit schematic.
Figure 21:
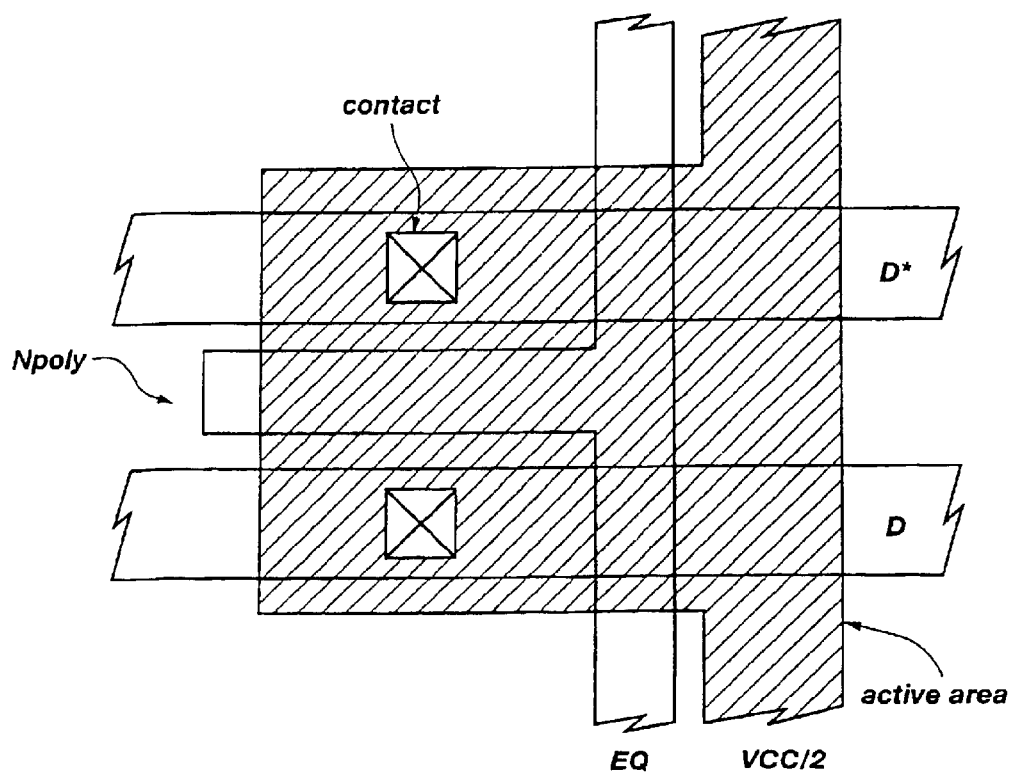
FIG. 21 is an equilibration and bias circuit layout.

As shown in FIG. 20, Vcc/2 bias for the digitlines is provided by two additional NMOS transistors. The devices operate in conjunction with equilibration to ensure that the digitline pair remains at the prescribed voltage for sensing. Normally, a pair of digitlines that is at Vcc and ground, respectively, will equilibrate to Vcc/2 volts. The bias devices ensure that this occurs, and also guarantee that the digitlines remain at Vcc/2 despite leakage paths that might otherwise discharge them. NMOS transistors are again used because of their superior drive strength, but also to allow integration with the equilibration transistor. Most often, layout integrates the bias and equilibration transistors to reduce their effective size and since they share the same EQ control signal. Most modern DRAMs use Vcc/2 volt precharge since this reduces power consumption, improves sensing and reduces read time. An exception to Vcc/2 precharge exists in the IBM® 16 Mbit PMOS memory bit DRAM designs that equilibrate and bias the digitlines to Vcc. Since the wordlines and digitlines are both at Vcc when the part is inactive, row to column shorts do not contribute to increased standby current. On the other hand, row to column shorts cause higher standby current in Vcc/2 precharge DRAMs since their wordlines are kept at ground in standby. A typical layout for the equilibration and bias circuit appears in FIG. 21.

Isolation devices are important elements in sense amplifier circuits. Generally implemented as NMOS transistors, isolation transistors are placed between the array digitlines and specific sense amplifier components. As will be understood shortly, there are a multitude of possible configurations for the sense amplifier block. Isolation devices provide two functions. First, if the sense amps are positioned between and connected to two arrays, they allow one of the two arrays to be electrically isolated. This isolation is necessary whenever a wordline fires high in one of the arrays. Isolation of the second array will reduce the total digitline capacitance connected to the sense amplifiers. This speeds read and write time, reduces power consumption, and extends refresh for the isolated array. Second, the isolation devices provide some resistance between the sense amplifier and the array digitlines. This resistance stabilizes the sense amplifiers and speeds up the sensing operation by somewhat separating the high capacitance digitlines from the low capacitance sense nodes. Capacitance of the sense nodes, between isolation transistors, is generally less than 15 fF, permitting the sense amplifier to latch somewhat faster than if solidly connected to the digitlines. The restore operation slows, though, because of the isolation resistance, but this is less important than sensing and stability. Isolation transistors are physically located on both ends of the sense amplifier layout. For quarter pitch sense amplifiers, there is one isolation transistor for every two digitlines. Although this is twice the active area width and space of an array, it nevertheless establishes the minimum isolation used in the pitch cells.

Figure 22:
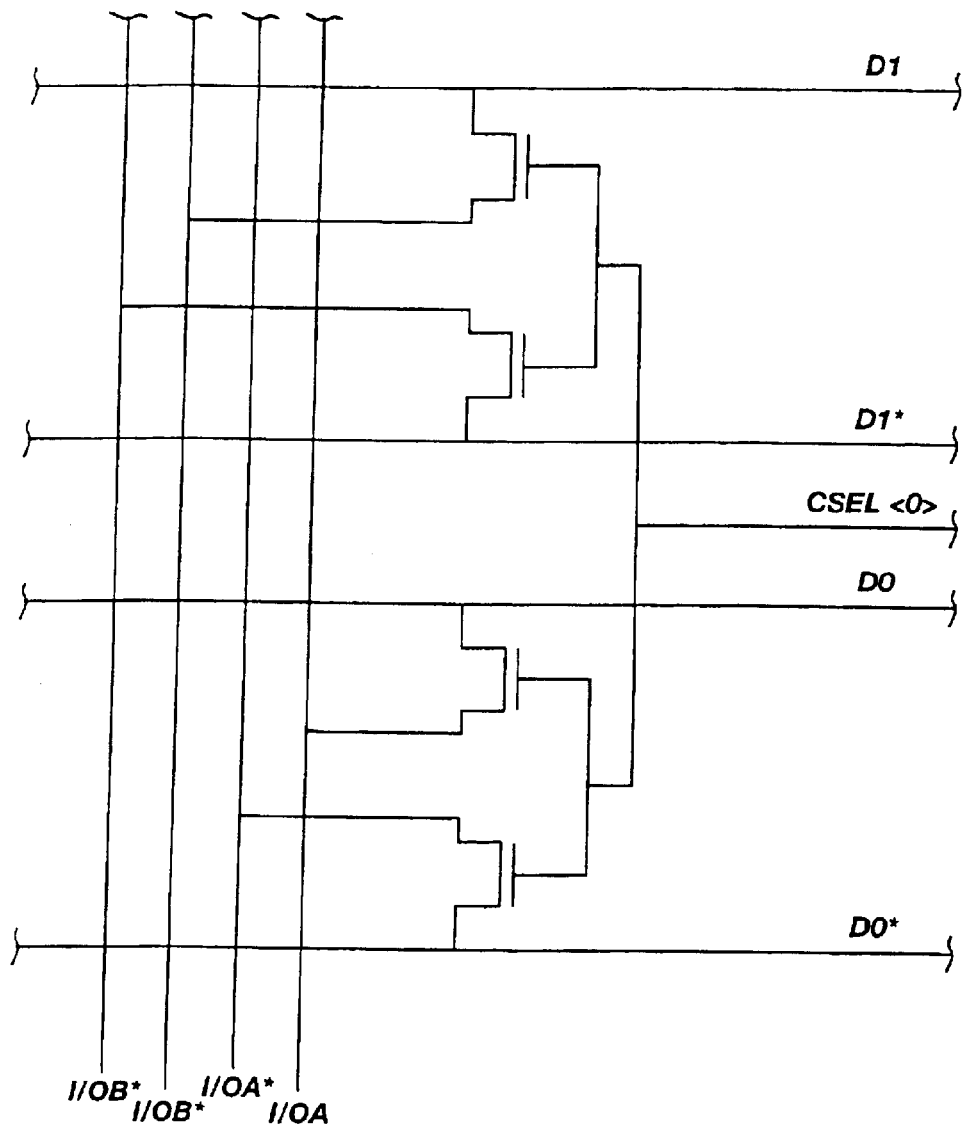
FIG. 22 is a schematic showing I/O transistors.

Input/output (I/O) transistors allow data to be read from or written to specific digitline pairs. A single I/O transistor connects to each sense node as shown in FIG. 22. The outputs of each I/O transistor are connected to I/O signal pairs. Commonly, there are two pairs of I/O signal lines permitting four I/O transistors to share a single column select control signal. DRAM designs employing two or more metal layers run the column select lines across the arrays using either metal2 or metal3. Each column select activates four I/O transistors on both sides of an array, permitting the connection of four digitline pairs (columns) to peripheral data path circuits. The I/O transistors are carefully sized to ensure that the I/O bias voltage or remnant voltage on the I/O lines does not introduce instability into the sense amplifiers. Although designs vary significantly as to the numerical ratio, I/O transistors are two to eight times smaller than the N-sense amplifier transistors. This relationship is referred to as beta ratio. A beta ratio between five and eight is common, although proper selection can only be verified with silicon, since simulations fail to adequately predict sense amplifier instability.

The fundamental elements of any sense amplifier block are the N-sense amplifier and the P-sense amplifier. These amplifiers, as previously discussed, work together to detect the access signal voltage and drive the digitlines, accordingly to Vcc and ground. The N-sense amplifier, depicted in FIG. 5, consists of cross-coupled NMOS transistors. The N-sense amplifier drives the low potential digitline to ground. Similarly, the P-sense amplifier consists of cross-coupled PMOS transistors and drives the high potential digitline to Vcc. The sense amplifiers are carefully designed to guarantee correct detection and amplification of the small signal voltage produced during cell access (less than 200 mV). Matching of transistor $V_{th}$, transconductance, and junction capacitance within close tolerances helps ensure reliable sense amplifier operation. Ultimately, the layout dictates the overall balance and performance of the sense amplifier block. As a result, a tremendous amount of time is spent ensuring that the sense amplifier layout is optimum. Symmetry and exact duplication of elements are critical to a successful design including balanced coupling to all sources of noise, such as I/O lines and latch signals (NLAT* and ACT). Balance is especially critical for layout residing inside the isolation transistors, since the sense node capacitance is very low, making it more sensitive to noise and circuit imbalances.

While the majority of DRAM designs latch the digitlines to Vcc and ground, a growing number of designs are beginning to reduce these levels. Various technical papers report improved refresh times and lower power dissipation through reductions in latch voltages. At first, this appears contradictory, since writing a smaller charge into the memory cell should produce lower refresh time. The benefits are derived from maintaining lower drain to source voltages (Vds) and negative gate to source voltages (Vgs) across non-accessed memory bit transistors. Lower Vds and negative Vgs translate to substantially lower subthreshold leakage and longer refresh, despite the smaller stored charge. Most designs that implement reduced latch voltages generally raise the N-sense amplifier latch voltage without lowering the P-sense amplifier latch voltage. Designated as boosted sense ground designs, they write data into each memory bit using full Vcc for a logic one and boosted ground for a logic zero. The sense ground level is generally a few hundred millivolts above true ground. In standard DRAMs which drive digitlines fully to ground, the Vgs of non-accessed memory bits becomes zero when the digitlines are latched. This results in high subthreshold leakage for a stored one level, since full Vcc exists across the memory bit transistor while the Vgs is held to zero. Stored zero levels do not suffer from prolonged subthreshold leakage since any amount of cell leakage produces a negative Vgs for the transistor. The net effect is that a stored one level leaks away much faster than a stored zero level. One's level retention, therefore, establishes the maximum refresh period for most DRAM designs. Boosted sense ground extends refresh by reducing subthreshold leakage for stored ones. This is accomplished by guaranteeing negative gate to source bias on non-accessed memory bit transistors. The benefit of extended refresh from these designs is somewhat diminished, though, by the added complexity of generating boosted ground levels and the problem of digitlines that no longer equilibrate at Vcc/2 volts.

The rate at which the sense amplifiers are activated has been the subject of some debate. A variety of designs utilizes multistage circuits to control the rate at which NLAT* fires. Especially prevalent with boosted sense ground designs are two stage circuits that initially drive NLAT* quickly toward true ground, to speed sensing, and then bring NLAT* to the boosted ground level to reduce cell leakage. An alternative to this approach, using two stage drivers, first drives NLAT* slowly toward ground to limit current and digitline disturbances. Following this phase is a second phase in which NLAT* drives strongly toward ground to complete the sensing operation. The second phase usually occurs in conjunction with ACT activation. Although these two designs have contrary operation, they each meet specific performance objectives—trading off noise and speed.

Figure 23:
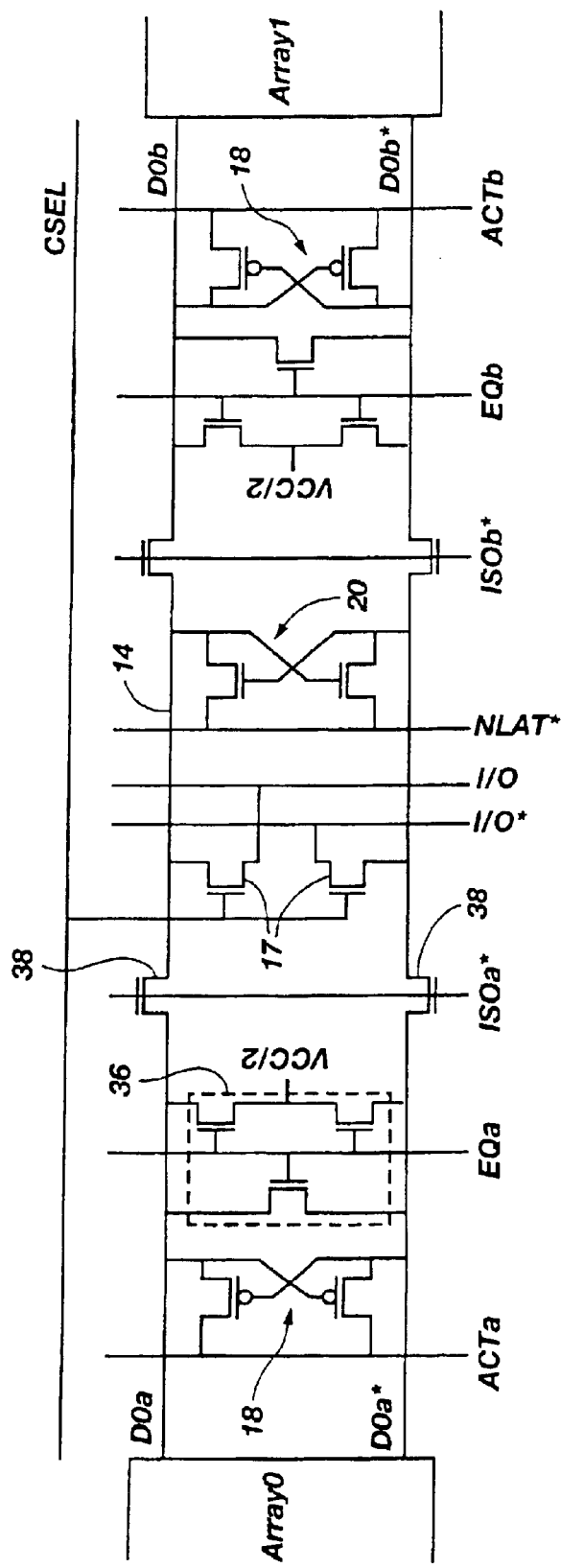
FIG. 23 is a standard sense amplifier block.

FIG. 23 shows a sense amplifier block commonly utilized in double or triple metal designs. It features two P-sense amplifiers 18 placed outside the isolation transistors 38, a pair of EQ/Bias devices 36, a single N-sense amplifier 20, and a single I/O transistor 17 for each digitline. This design is quarter pitch, as are FIGS. 23 and 24, since only half of the sense amplifiers required for an array are on either side. Placement of the P-sense amplifiers outside the isolation devices is necessary since a full one level (Vcc) cannot pass through NMOS ISO transistors whose gate terminals are driven to Vcc. EQ/Bias devices 36 are also placed outside the ISO devices to permit continued equilibration of digitlines in the isolated arrays. The I/O transistor gate terminals for four adjacent digitlines connect to a common CSEL signal. Each of the four I/O transistors is tied to a separate I/O bus. This sense amplifier, although simple to implement, is somewhat larger than other designs due to the presence of two P-sense amplifiers.

Figure 24:
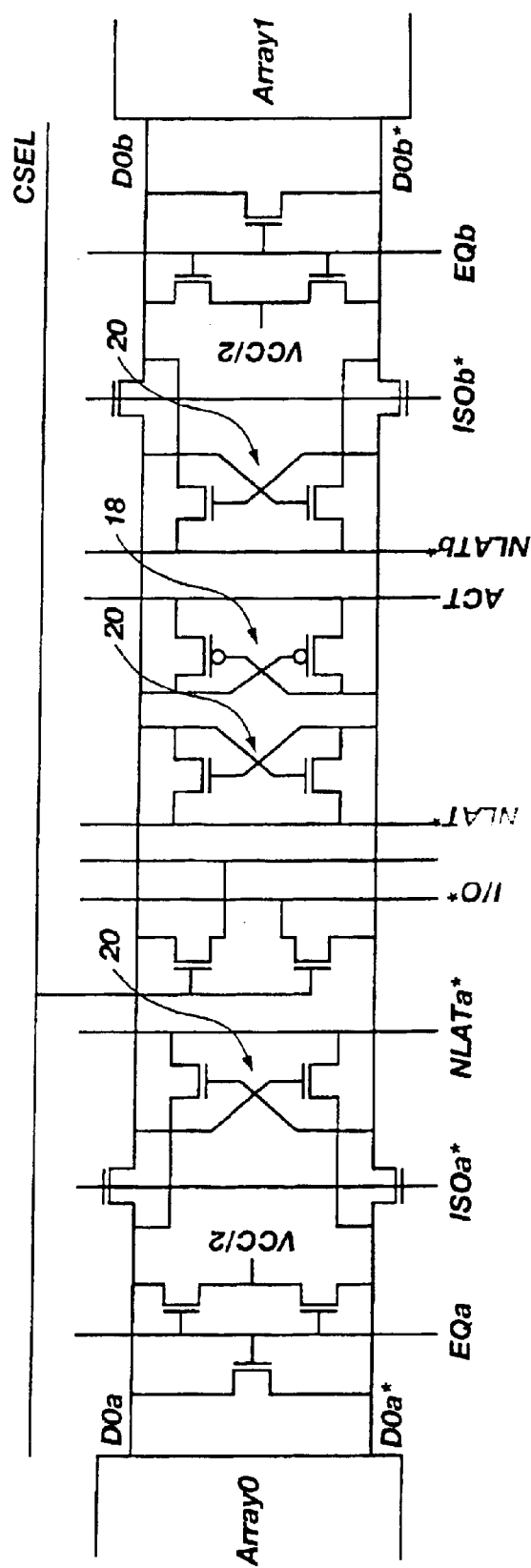
FIG. 24 is a complex sense amplifier block.

FIG. 24 shows a second, more complicated style of sense amplifier block. This design employs a single P-sense amplifier 18 and three sets of N-sense amplifiers 20. In this design, the P-sense amplifier is between the isolation transistors. Writing a full one level to the memory bits requires that the isolation devices be either NMOS depletion, PMOS enhancement, or NMOS enhancement mode with boosted gate drive. The use of three N-sense amplifiers suggests the use of PMOS isolation transistors, which prevent the writing of full zero levels unless the N-sense amplifiers exist outside the isolation devices. In this design, the use of three N-sense amplifiers guarantees faster sensing and higher stability than a similar design using only two N-sense amplifiers. The inside N-sense amplifier fires prior to the outside N-sense amplifiers to ensure proper sensing. This design using three N-sense amplifiers will not yield a minimum layout, but this objective is sacrificed for higher performance.

Figure 25:
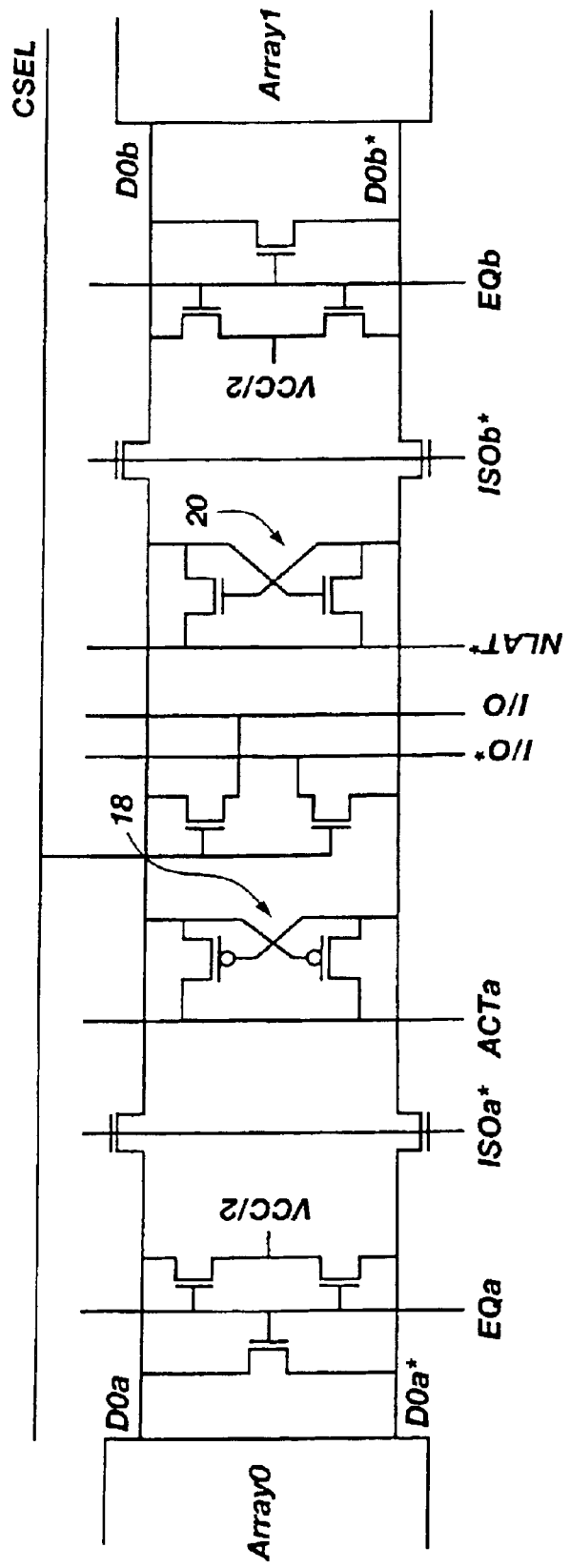
FIG. 25 is a minimized sense amplifier block.

The sense amplifier block shown in FIG. 25 is at or near the minimum configuration. This design features single N-sense 20 and P-sense 18 amplifiers placed between the isolation transistors. To write full logic levels requires that the isolation transistors be either depletion mode devices or that the gate voltages be boosted above Vcc by at least one $V_{th}$. This design still includes a pair of EQ/Bias circuits to maintain equilibration on isolated arrays. Only a few designs have ever tried to operate with a single EQ/Bias circuit residing within the isolation devices. Most designers consider floating digitlines a risky proposition since cell leakage increases and sensing operations degrade as the digitlines drift away from the Vcc/2 precharge level. Future DRAM designs implemented on SOI (Silicon On Insulator) could permit the use of single EQ/Bias circuits, though, since this technology has negligible junction leakage.

Figure 26:
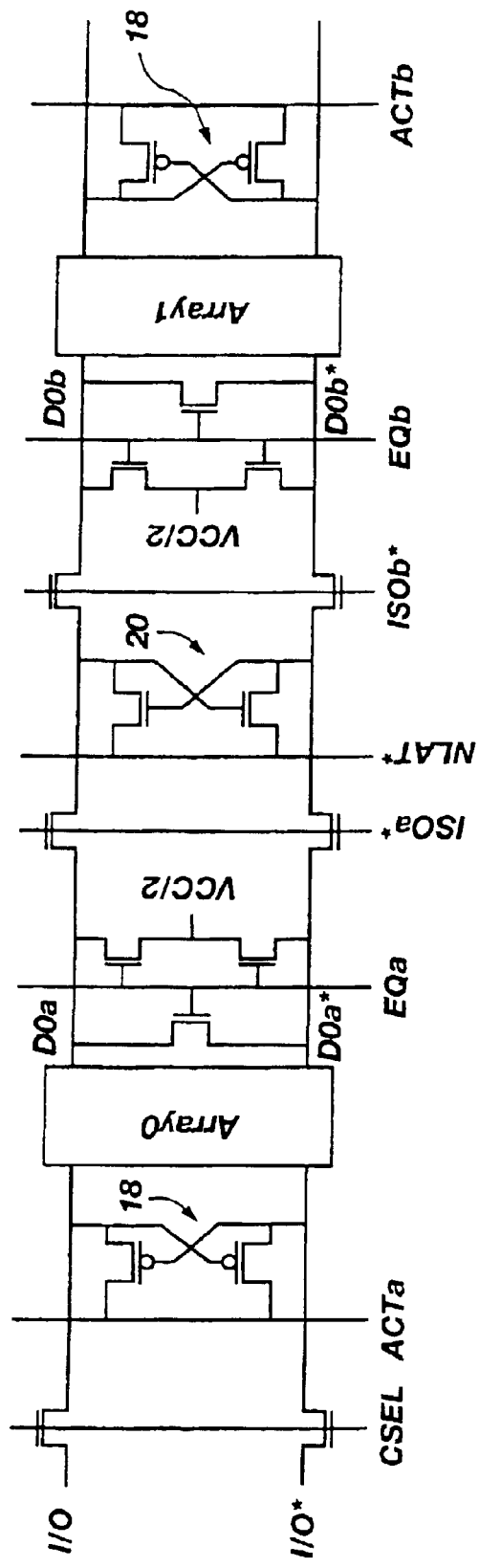
FIG. 26 is a single metal sense amplifier block.

A sense amplifier design for use on a single metal DRAM appears in FIG. 26. Prevalent on 1 Mb and 4 Mb designs, single metal processes conceded to multi-metal processes at the 16 Mb generation. Unlike the double metal sense amplifiers shown in FIGS. 24 through 26, single metal sense amps lay out at half pitch—one amplifier for every two array digitlines. This type of layout is extremely difficult, placing tight constraints on process design margins. Because of the unavailability of metal2, column select signals cannot route across the memory arrays. As a result, column select signal generation requires a localized rather than a global column decoding circuit. FIG. 26 depicts how the N-sense amplifier 20 and P-sense amplifiers 18 are located on opposite ends of the memory bit arrays in single metal designs. The sharing of sense amplifiers by two adjacent arrays is especially beneficial for single metal designs. FIG. 26 illustrates this concept by showing how two arrays and their associated P-sense amplifiers share a single N-sense amplifier. In the depicted case, where I/O devices exist on only one end, the rightmost P-sense amplifier activates only when the right array is being accessed. The left P-sense amplifier, though, always activates, regardless of which array is being accessed, since all read and write operations must pass through the left P-sense amplifier to reach the I/O devices.

Figure 27:
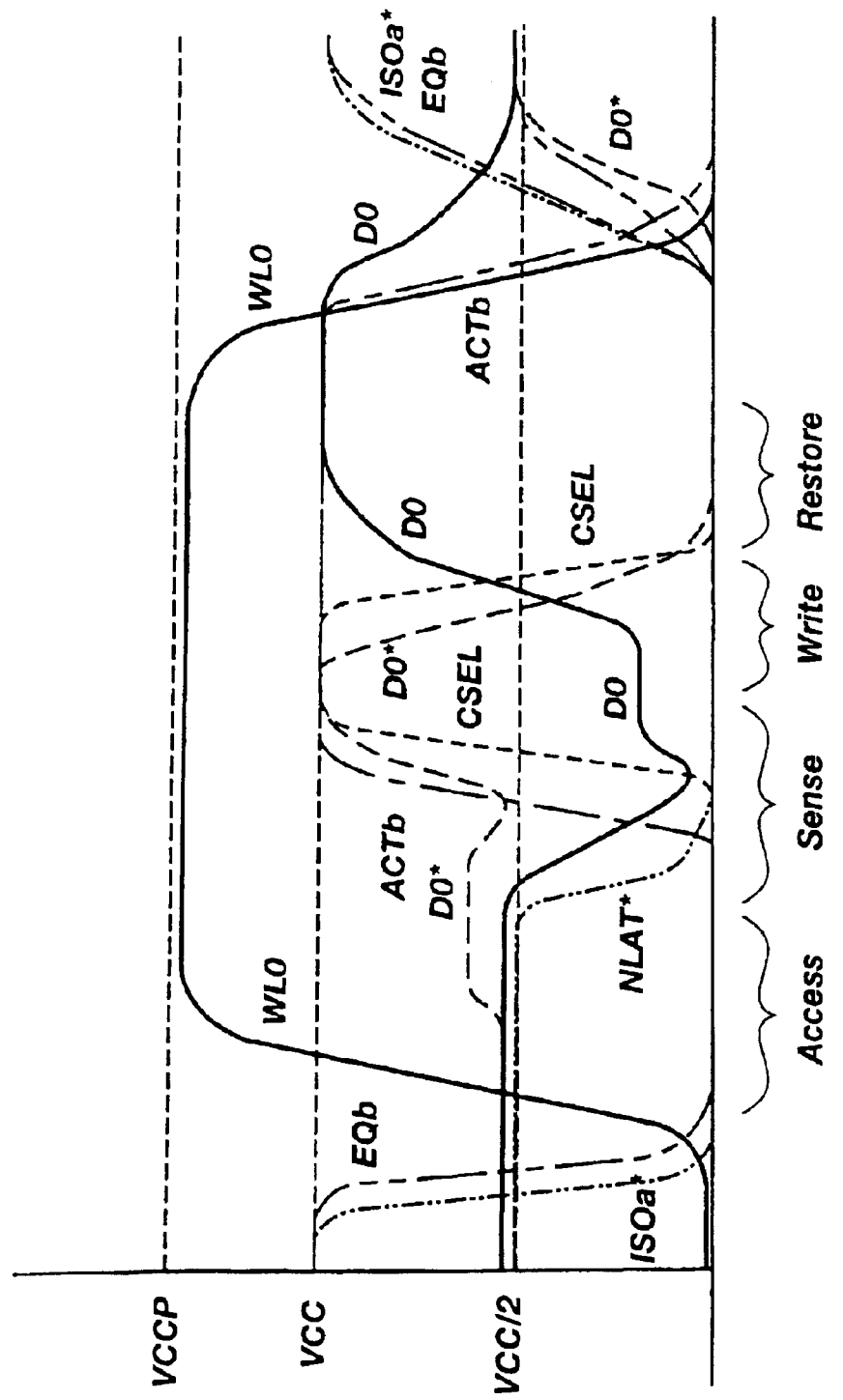
FIG. 27 depicts waveforms for a read-modify-write DRAM cycle.

A set of operating signal waveforms appears in FIG. 27 for the sense amplifier shown in FIG. 23. The waveforms depict a read modify write cycle (late write) in which a read operation precedes a write operation during a single cell access. In this example, a one level is read from the cell, indicated by D0* rising above D0 during the cell access. A one level always appears as +Vcc/2 in the memory bit cell, regardless of whether the cell connects to a true or complement digitline. The actual data state as viewed from the DRAM's data terminal (DQ) is a function of the data topology and the presence of data scrambling. Data scrambling or topo scrambling is implemented through additional datapath circuits to ensure that the stored memory bit data level and DQ logic level are in agreement. A memory bit one level (+Vcc/2) corresponds to a logic one at the DQ and a memory bit zero level (-Vcc/2) corresponds to a logic zero at the DQ terminal. The late write timing sequence shown in FIG. 27 depicts a wordline firing in array1. Prior to the wordline firing, ISOa* must transition low to isolate array0 from the sense amplifiers. EQb also goes low and disables the EQ/Bias transistors connected to array1. The wordline fires high, accessing a memory bit, which dumps its charge onto DO*. NLAT*, initially at Vcc/2, drives low to begin the sensing operation by firing the N-sense amplifier to pull D0 toward ground. ACT fires, moving from ground to Vcc, which activates the P-sense amplifier, driving D0* toward Vcc. CSEL0 rises to Vcc, which enables the I/O transistors and connects the peripheral data circuits to the memory cells. The I/O lines are biased at a voltage close to Vcc. The I/O line bias causes D0 to rise slightly while the column is active. Following this read operation, write drivers in the periphery activate and drive the I/O lines to opposite data states (in this example). This new data propagates through the I/O devices and writes over the previous data held by the sense amplifiers. After the sense amplifiers latch the new data, the write drivers and the I/O devices shut down, allowing the sense amplifiers to restore the digitlines to full levels. The wordline transitions low to shut off the memory bit transistor after the cell restoration completes. Finally, EQb and ISOa* fire high to equilibrate the digitlines back to Vcc/2 and to reconnect array0 to the sense amplifiers. While timing for each of these events needs to be minimized for optimum DRAM performance, timing cannot be pushed too far as to eliminate all timing margins. Margins are necessary to ensure proper device operation over the expected range of process variations and over a wide range of operating conditions.

Row Decoder Elements. Row decode circuits are similar to sense amplifier circuits in that they also pitch up to memory bit arrays and have a variety of implementations. A row decode block consists of two basic elements, a wordline driver and an address decoder tree. There are three basic configurations for wordline driver circuits that include the NOR driver, the inverter (CMOS) driver, and the bootstrap driver. Additionally, the drivers and associated decode trees can either be configured as local row decodes for each array section or as global row decodes which drive a multitude of array sections. Global row decodes connect to multiple arrays through metal wordline straps. The straps are stitched to the polysilicon wordlines at specific intervals dictated by the polysilicon resistance and the desired RC wordline time constant. Most processes that strap wordlines with metal do not silicide the polysilicon, although doing so would reduce the number of stitch regions required. Strapping wordlines and using global row decoders obviously reduce die size—in some cases very dramatically. The penalty to strapping is that it requires an additional metal layer and that this layer is at minimum array pitch. This puts a tremendous burden on process technologists in which three conductors are at minimum pitch—wordlines, digitlines, and wordline straps. Distributed row decoders, on the other hand, do not require metal straps, but do require additional die size. It is highly advantageous to reduce the polysilicon resistance in order to stretch the wordline length and reduce the number of needed row decodes especially on large DRAMs such as the 1 gigabit.

Figure 28:
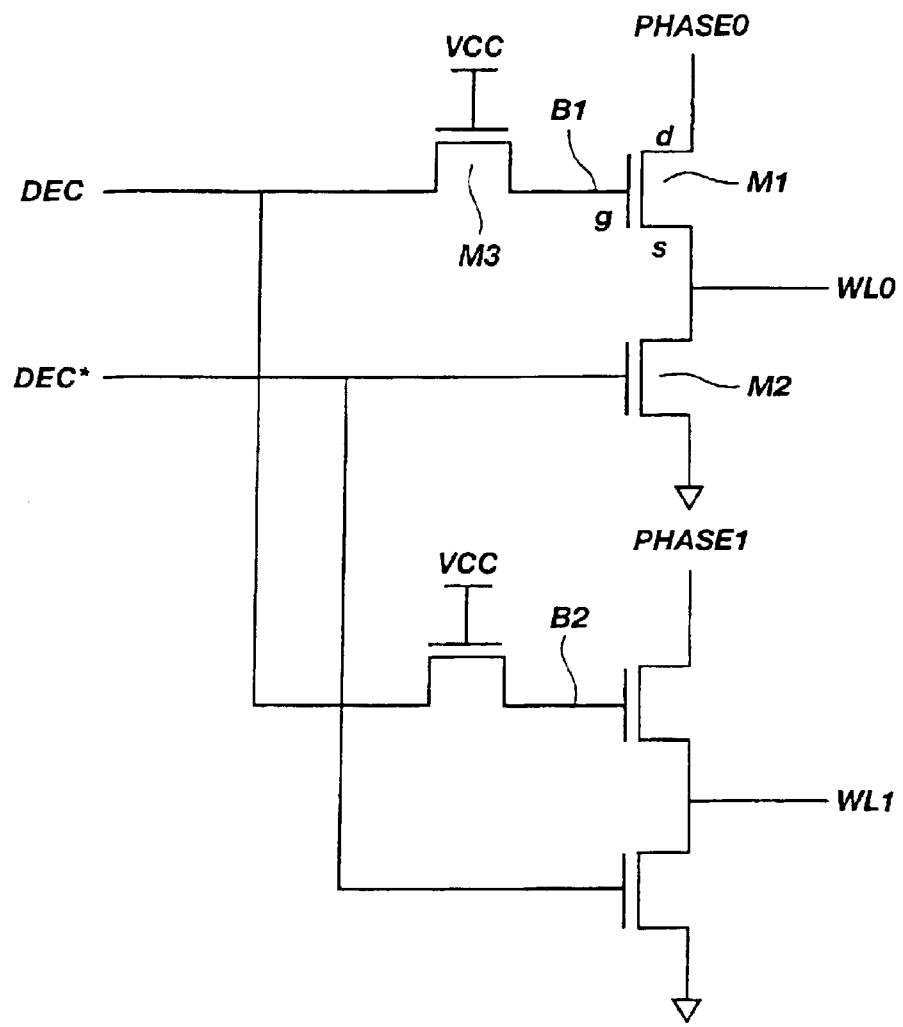
FIG. 28 is a bootstrap wordline driver schematic.
Figure 29:
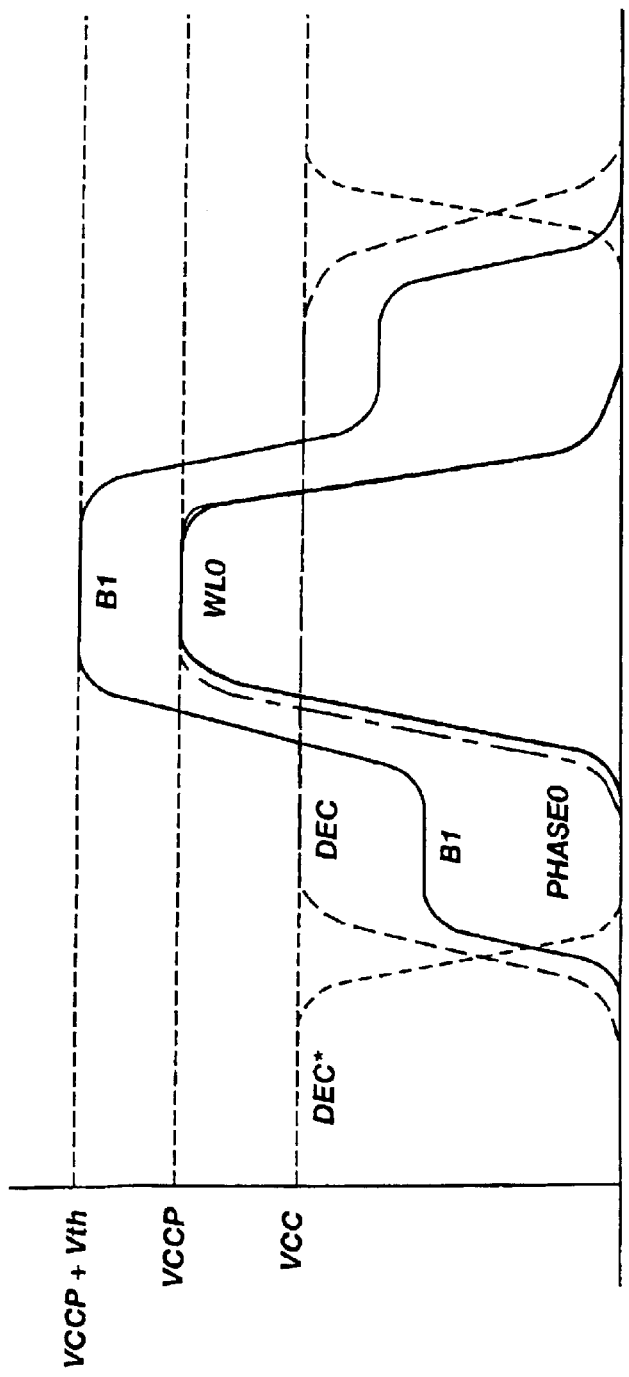
FIG. 29 is a bootstrap wordline driver operation.

The bootstrap wordline driver shown in FIG. 28 is built exclusively from NMOS transistors, producing the smallest layout for the three types of driver circuits. As the name denotes, this driver relies on bootstrapping principles to bias the output transistor's gate terminal. This bias voltage must be high enough to allow the NMOS transistor to drive the wordline to the boosted wordline voltage Vccp. Operation of the bootstrap driver will be described with the help of FIG. 29. Initially, the driver is off and the wordline 16 and phase terminals are at ground. Transistor M2 holds the wordline at ground since the decoder output signal DEC* is at Vcc. The gate of pass transistor M3 is fixed at Vcc. The signals DEC and DEC* are generated by a separate decode circuit. DEC and DEC*, as a complement pair, represent the first of two terms necessary to decode the correct wordline. PHASE0 represents the second term. If DEC rises to Vcc and DEC* drops to ground, as determined by the decoder, the boot node labeled B1 will rise to Vcc–$V_{th}$ volts and transistor M2 will turn off. Transistor M1 continues to hold the wordline to ground since PHASE0 is still at ground. Once B1 reaches Vcc–$V_{th}$, the PHASE signal fires to the boosted wordline voltage Vccp. As a result of gate to drain and gate to source capacitance of M1, the gate of M1 will boot to an elevated voltage, Vboot. This voltage is determined by the parasitic capacitance of node B1, Cgs1, Cgd1, Vccp and the initial voltage at B1, Vcc–$V_{th}$. Accordingly, Vboot≅[(VCCP·Cgd1) ÷(Cgs1+Cgd1+CB1)]+(Vcc–$V_{th}$) . In conjunction with the wordline voltage rising from ground to Vccp, the gate to source capacitance of M1 provides a secondary boost to the boot node. The secondary boost helps to ensure that the boot voltage is adequate to drive the wordline to a full Vccp level.

The bootstrap driver is turned off by first driving the PHASE0 signal to ground. M1 remains on, since node 131 cannot drop below Vcc–$V_{th}$, substantially discharging the wordline toward ground. This is followed by the address decoder turning off, bringing DEC to ground and DEC* to Vcc. With DEC* at Vcc, transistor M2 turns on and fully clamps the wordline to ground. A voltage level translator is required for the PHASE0 signal since it operates between ground and the boosted voltage Vccp. For a global row decode configuration, this is not much of a burden. For a local row decode configuration, the level translators can be very difficult to implement. Generally, these translators are placed in array gaps which exist at the intersection of sense amplifier and row decode blocks, or they are distributed throughout the row decode block itself. The translators require both PMOS and NMOS transistors and must be capable of driving large capacitive loads. Layout of the translators is very difficult, especially since the overall layout must be as small as possible.

Figure 30:
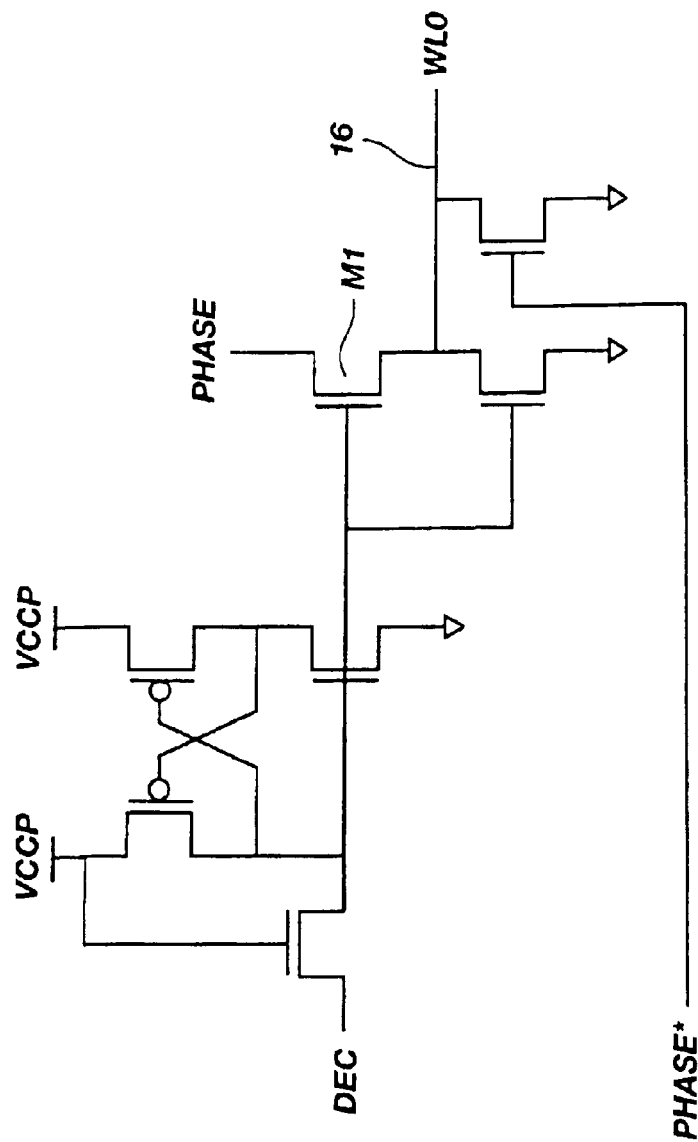
FIG. 30 is a NOR wordline driver.

The second type of wordline driver, shown in FIG. 30, is called a NOR driver. It is similar to the bootstrap driver in that two decode terms drive the output transistor from separate terminals. The NOR driver uses a PMOS transistor for M1 and does not rely on bootstrapping to derive the gate bias. Rather, the gate is driven by a voltage translator that converts DEC* from Vcc to Vccp voltage levels. This translation is necessary to ensure that M1 remains off for nonselected wordlines since the PHASE signal that is common to multiple drivers is driven to Vccp. To fire a specific wordline, DEC* must be low and the appropriate PHASE must fire high. Generally, there are four to eight PHASE signals per row decoder block. The NOR driver requires separate level translators for each PHASE and DEC* signal. The bootstrap driver by comparison requires translators only for the PHASE signals, far fewer than the NOR driver.

Figure 31:
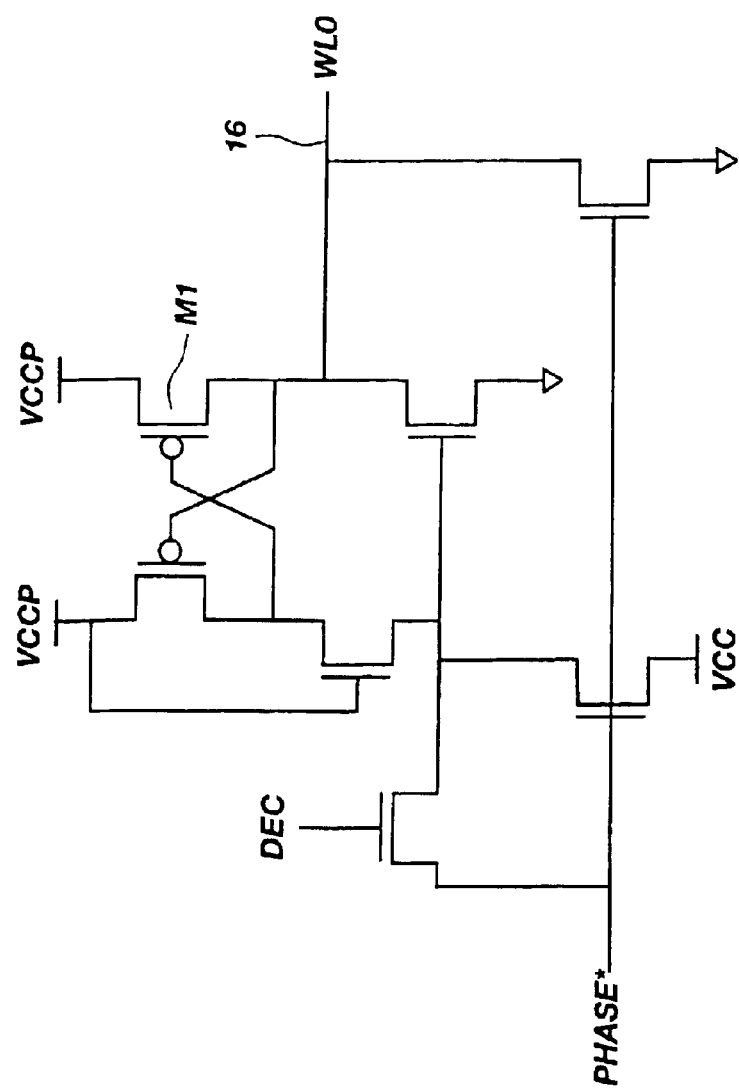
FIG. 31 is a CMOS wordline driver.

The final wordline driver configuration seen in FIG. 31 lacks a specific name, but is sometimes referred to as a CMOS inverter driver or CMOS driver. Unlike the first two drivers, the output transistor, M1, has its source terminal permanently connected to Vccp. This driver, therefore, requires a voltage translator for each and every wordline. Both decode terms DEC and PHASE* combine to drive the output stage through the translator. The advantage of this driver, other than simple operation, is low power consumption. The CMOS driver conserves power because the translators drive only the small capacitance associated with a single wordline driver. The PHASE translators of both the bootstrap and NOR drivers must drive considerable junction capacitance. Disadvantages of the CMOS driver are layout complexity and high standby current. Subthreshold leakage in transistor M1 and the high drain to source bias (Vccp) cause high standby current for this design. The bootstrap and NOR drivers do not suffer from high standby current since Vccp is not applied to the output transistors when the drivers are disabled. For DRAM designs having thousands of wordline drivers, the cumulative leakage current can easily exceed the standby current budget. Only careful design of transistor M1 will prevent this from occurring.

Address decode trees are the final element of the row decode block to be discussed. Decode trees are constructed from all types of logic—static, dynamic, pass gate, or a combination thereof. Regardless of what type of logic that an address decoder is implemented with, the layout must completely reside beneath the row address signal lines to constitute an efficient, minimal design. In other words, the metal address tracks dictate the die area available for the decoder. For DRAM designs that utilize global row decode schemes, the penalty for inefficient design may be insignificant, but for distributed local row decode schemes, the die area penalty can be significant. As with memory bits and sense amplifiers, any time invested in row decode optimization is well spent.

Figure 32:
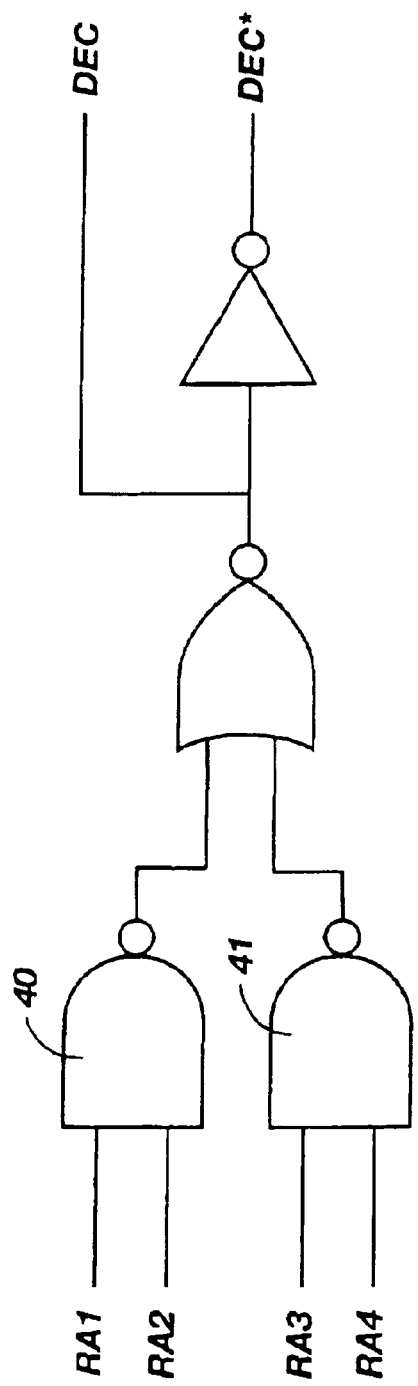
FIG. 32 is a static decode tree.

The simplest type of address decode tree utilizes static CMOS logic. Shown in FIG. 32, a simple tree can be designed using 2-input NAND gates 40 and 41. While easy to design schematically, static logic address trees are not popular, since they waste silicon and are difficult to lay out efficiently. Static logic requires two transistors for each address term, one NMOS and one PMOS—producing a large layout for designs with many address terms. Furthermore, static gates must be cascaded to accumulate address terms, adding gate delays with each level. For these and other reasons, static logic gates are not utilized in row decode address trees for today's state of the art DRAM.

Figure 33:
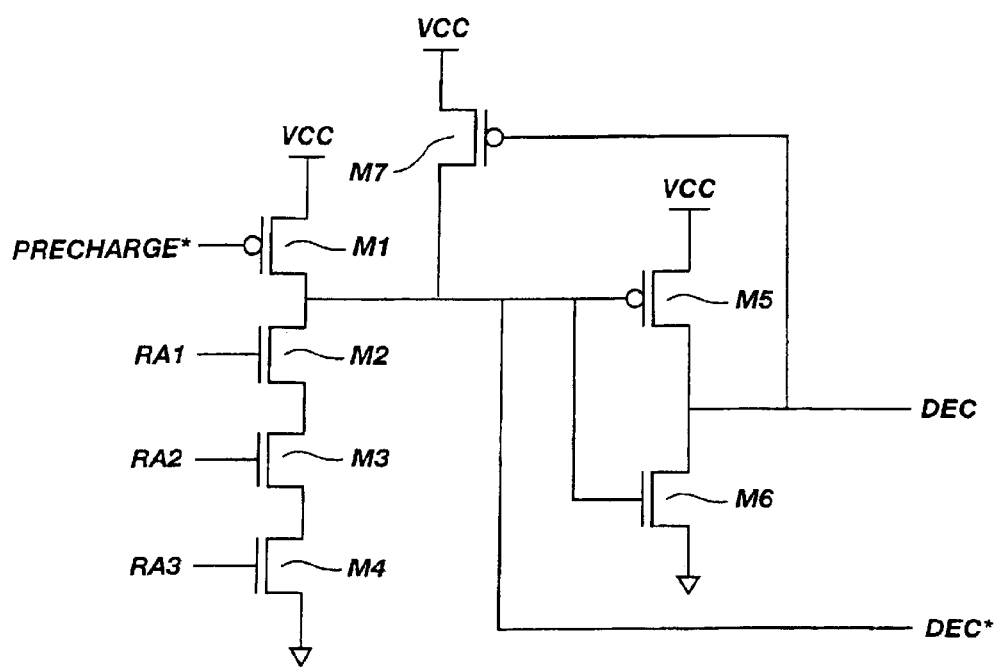
FIG. 33 is a P&E decode tree.

The second type of address tree utilizes dynamic logic, the most prevalent being precharge and evaluate (P&E) logic. Used by the majority of DRAM manufacturers, P&E address trees come in a variety of forms, although the differences between one and another can be subtle. FIG. 33 shows a simplified schematic for one version of a P&E address tree designed for use with bootstrapped wordline drivers. P&E address tree circuits feature one or more PMOS precharge transistors and a cascade of enable NMOS transistors M2–M4. This P&E design uses half of the transistors required by the static address tree of FIG. 32. As a result, the layout of the P&E tree is much smaller than the static tree, fitting more easily under the address lines. The PRECHARGE* signal, under control of the RAS* chain logic, drives the precharge transistor. PRECHARGE* and transistor M1 ensure that DEC* precharges high, disabling the wordline driver and preparing the tree for row address activation. M7 is a small PMOS transistor driven by the DEC inverter (M5 and M6). Together, M7 and the inverter form a latch ensuring that DEC* remains high for all rows not selected by the row addresses. At the beginning of any RAS* cycle, PRECHARGE* is low and the row addresses are all disabled (low). After RAS* falls, PRECHARGE* transitions high to turn off M1. Following this, the row addresses are enabled. If RA1 through RA3 all go high, then M2–M4 will turn on, overpowering M7 and driving DEC* to ground and DEC to Vcc. The output of each tree segment normally drives four bootstrapped wordline drivers—each connected to a separate PHASE signal. For an array with 256 wordlines, there will be 64 such decode trees.

The row address lines shown as RA1–RA3 can be either true and complement address lines or predecoded address lines. Predecoded address lines are formed by logically combining (AND) addresses as shown in Table 1. Advantages to predecoded addresses include lower power, since fewer signals make transitions during address changes, and higher efficiency, since only three transistors are necessary to decode six addresses for the circuit of FIG. 33. Predecoding is especially beneficial for redundancy circuits. Predecoded addresses are used throughout most DRAM designs today.

TABLE 1

| RA0 | RA1 | PR01(n) |
|-----|-----|---------|
| 0   | 0   | 0       |
| 1   | 0   | 1       |
| 0   | 1   | 2       |
| 1   | 1   | 3       |

Figure 34:
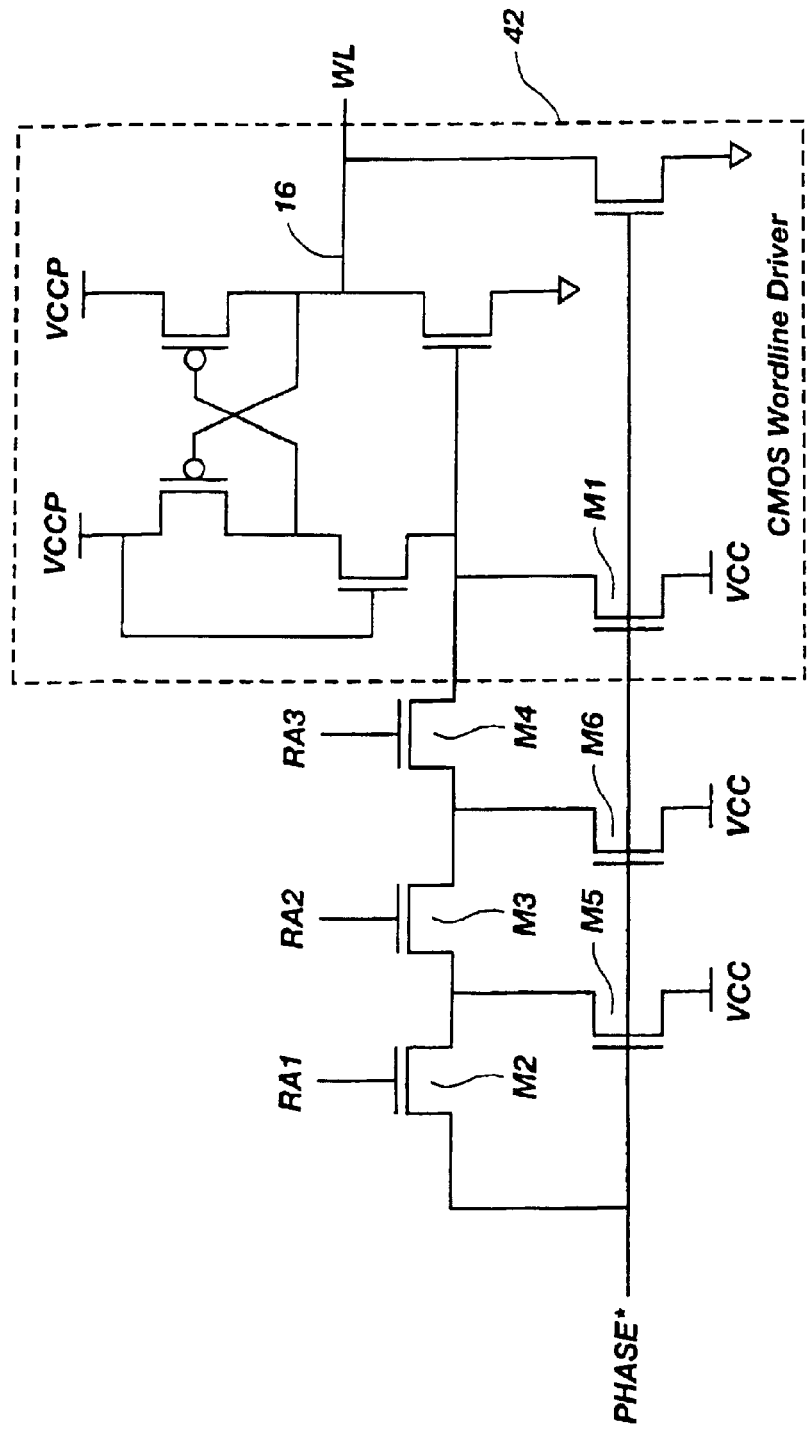
FIG. 34 is a pass transistor decode tree schematic.

The final type of address tree, shown in FIG. 34, utilizes pass transistor logic. Pass transistor address trees are similar to P&E trees in many ways. Both designs utilize PMOS precharge transistors and NMOS address enable transistors. Unlike P&E logic, though, the NMOS cascade does not terminate at ground. Rather, the cascade of M2–M4 goes to a PHASE* signal that is high during precharge and low during the evaluation. The address signals operate the same as in the P&E tree, high to select and low to deselect. The pass transistor tree is shown integrated into a CMOS wordline driver 42. This is necessary since they are generally used together and their operation is very complementary. The cross-coupled PMOS transistors of the CMOS level translator provide a latch necessary to keep the final interstage node biased at Vcc. The latch has a weak pull-up, easily overpowered by the cascaded NMOS enable transistors. A pass transistor address tree is not used with bootstrapped wordline drivers, since the PHASE signal feeds into the address tree logic rather than into the driver as required by the bootstrap driver.

Architectural Characteristics. A detailed description of the two most prevalent array architectures under consideration for future large scale DRAMs is provided—the aforementioned open digitline and folded digitline architectures. To provide a viable point for comparison, each architecture will be employed in the theoretical construction of 32 Mbit memory blocks for use in a 256 Mbit DRAM. Design parameters and layout rules from a typical 0.25 $\mu$m DRAM process provide the needed dimensions and constraints for the analysis. Some of these parameters are shown in Table 2. Examination of DRAM architectures in the light of a real world design problem permits a more objective and unbiased comparison. An added benefit to this approach is that the strengths and weaknesses of either architecture should become readily apparent.

TABLE 2

| Parameter | Value |
|---|---|
| Digitline width Wdl | 0.3 $\mu$m |
| Digitline pitch Pdl | 0.6 $\mu$m |
| Wordline width Wwl | 0.3 $\mu$m |
| Wordline pitch for $8F^2$ memory bit Pwl8 | 0.6 $\mu$m |
| Wordline pitch for $6F^2$ memory bit Pwl6 | 0.9 $\mu$m |
| Cell capacitance Cc | 30 fF |
| Digitline capacitance per memory bit Cdm | 0.8 fF |
| Wordline capacitance per $8F^2$ memory bit Cw8 | 0.6 fF |
| Wordline capacitance per $6F^2$ memory bit Cw6 | 0.5 fF |
| Wordline sheet resistance Rs | 6$\Omega$/sq |

Figure 35:
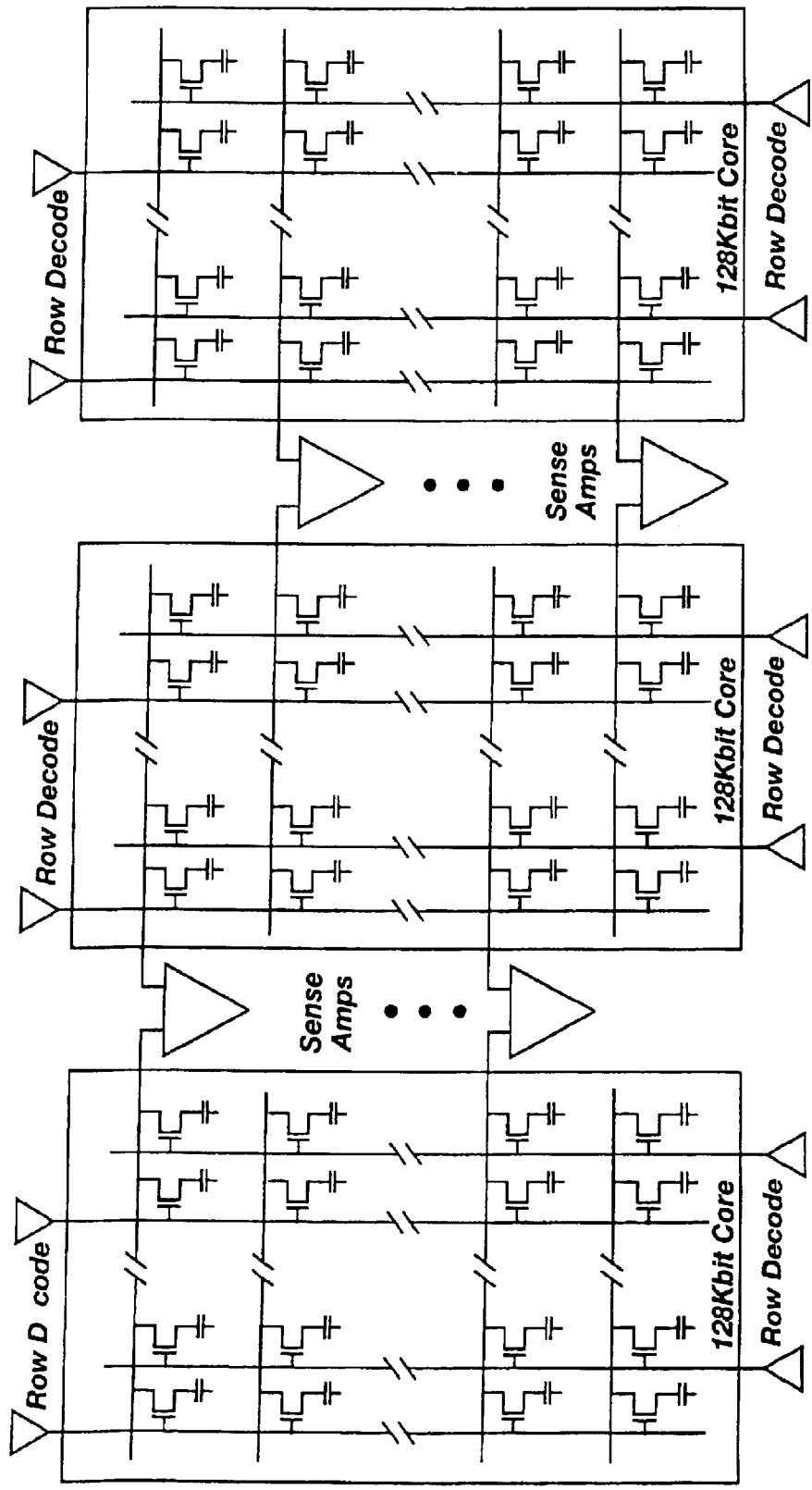
FIG. 35 is an open digitline architecture schematic.

Open Digitline Array Architecture. The open digitline array architecture was the prevalent architecture prior to the 64 kbit DRAM. A modern embodiment of this architecture as shown in FIG. 35 is constructed with multiple cross-point array cores separated by strips of sense amplifier blocks in one axis and either row decode blocks or wordline stitching regions in the other axis. Each 128 Kbit array core is built using $6F^2$ memory bit cell pairs. There are a total of 131,072 ($2^{17}$) functionally addressable memory bits arranged in 264 rows and 524 digitlines. The 264 rows consist of 256 actual wordlines, 4 redundant wordlines and 4 dummy wordlines. The 524 digitlines consist of 512 actual digitlines, 8 redundant digitlines, and 4 dummy digitlines. Photolithography problems usually occur at the edge of large repetitive structures such as memory bit arrays. These problems produce malformed or nonuniform structures, rendering the edge cells useless. Inclusion of dummy memory bits, wordlines and digitlines on each array edge ensures that these problems only occur on dummy cells, leaving live cells unaffected. Although dummy structures make each array core larger, they also significantly improve device yield, making them necessary items on all DRAM designs.

Array core size, as measured in the number of memory bits, is restricted by two factors—a desire to keep the quantity of memory bits binary and practical limits on wordline and digitline length. The need for a binary quantity of memory bits in each array core derives from the binary nature of DRAM addressing. Given N row addresses and M column addresses for a given part, there are a total of $2^{N+M}$ addressable memory bits. Address decoding is greatly simplified within a DRAM if array address boundaries are derived directly from address bits. Since the addressing is binary, the boundaries naturally become binary. Therefore, the size of each array core must necessarily have $2^X$ addressable rows and $2^Y$ addressable digitlines. The resulting array core size is $2^{X+Y}$ memory bits, which is, of course, a binary number. The second set of factors limiting array core size is practical limits on digitline and wordline length. From earlier discussions, the digitline capacitance is limited by two factors. First, the ratio of cell capacitance to digitline capacitance must fall within a specified range to ensure reliable sensing. Second, operating current and power for the DRAM is, in large part, determined by the current required to charge and discharge the digitlines during each active cycle. For the 256 Mbit generation, the digitlines are restricted from having connection to more than 256 rows (128 memory bit pairs) because of these power considerations. Each memory bit connected to a digitline adds capacitance to the digitline. The power dissipated during a read or refresh operation is proportional to the digitline capacitance (Cd), the supply voltage (Vcc), the number of active columns (N), and the refresh period (P). Accordingly, the power dissipated is given as Pd=Vccx·(N·Vcc·(Cd+Cc))÷(2·P) watts. On a 256 Mbit DRAM in 8K refresh, there are 32,768 ($2^{15}$) active columns during each read, write, or refresh operation. Active array current and power dissipation for a 256 Mbit DRAM are given in Table 3 for a 90 nS refresh period (−5 timing) at various digitline lengths. The budget for active array current is limited to 200 mA for this 256 Mbit design. To meet this budget, the digitline cannot exceed a length of 256 memory bits.

TABLE 3

| Digitline Length | Digitline Capacitance | Active Current | Power Dissipation |
|---|---|---|---|
| 128 memory bits | 102 fF | 60 mA | 199 mW |
| 256 memory bits | 205 fF | 121 mA | 398 mW |
| 512 memory bits | 410 fF | 241 mA | 795 mW |

TABLE 4

| Wordline Length | Rwl | Cwl | Time Constant |
|---|---|---|---|
| 128 memory bits | 1,536 ohms | 64 fF | 0.098 nS |
| 256 memory bits | 3,072 ohms | 128 fF | 0.39 nS |
| 512 memory bits | 6,144 ohms | 256 fF | 1.57 nS |
| 1,024 memory bits | 12,288 ohms | 512 Ff | 6.29 nS |

Wordline length, is limited by the maximum allowable RC time constant of the wordline. To ensure acceptable access time for the 256 Mbit DRAM, the wordline time constant should be kept below four nanoseconds. For a wordline connected to N memory bits, the total resistance and capacitance using 0.3 $\mu$m polysilicon are Rwl=Rs·N·Pwl÷0.3 $\mu$m ohms and Cwl=Cw6·N Farads, respectively. Table 4 contains the effective wordline time constants for various wordline lengths. As shown in the table, the wordline length cannot exceed 512 memory bits (512 digitlines) if the wordline time constant is to remain under four nanoseconds.

Figure 36:
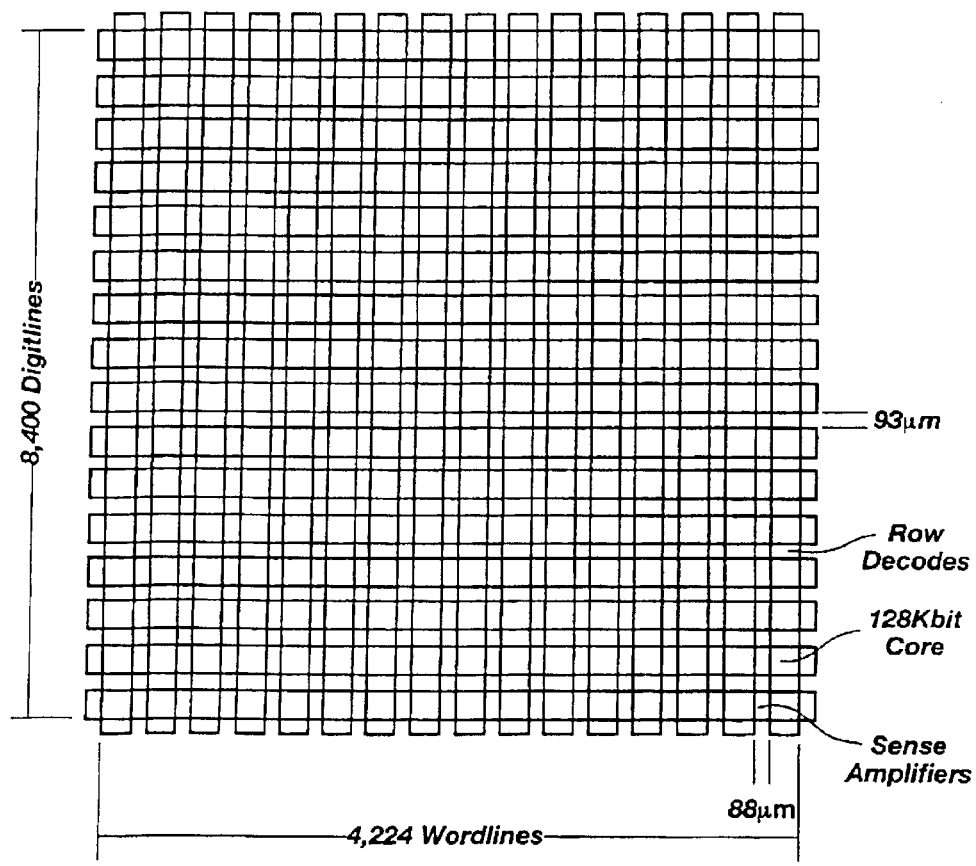
FIG. 36 is an open digitline 32 Mbit array block.

The open digitline architecture does not support digitline twisting since the true and complement digitlines which constitute a column are in separate array cores. Therefore, no silicon area is consumed for twist regions. The 32 Mbit array block requires a total of 256 128 Kbit array cores in its construction. Each 32 Mbit block represents an address space comprising a total of 4,096 rows and 8,192 columns. A practical configuration for the 32 Mbit block is depicted in FIG. 36. In this figure, the 256 array cores appear in a 16 by 16 arrangement. The 16 by 16 arrangement produces 2 Mbit sections consisting of 256 wordlines and 8,192 digit-lines (4,096 columns). A total of 16 2 Mbit sections are required to form the complete 32 Mbit block. Sense amplifier strips are positioned vertically between each 2 Mbit section. Row decode strips or wordline stitching strips are positioned horizontally between each array core.

Layout was generated for the various 32 Mbit elements depicted in FIG. 36 using commercial IC layout software. This layout is necessary to obtain reasonable estimates for pitch cell size. These size estimates, in turn, allow overall dimensions of the 32 Mbit memory block to be calculated. The results of these estimates appear in FIG. 36. Essentially, the overall height of the 32 Mbit block can be found by summing the height of the row decode blocks (or stitch regions) together with the product of wordline pitch and total number of wordlines. Accordingly, Height32= (Tr·Hldec)+(Tdl·Pdl) microns, where Tr is the number of local row decoders, Hldec is the height of each decoder, Tdl is the number of wordlines including redundant and dummy lines, and Pdl is the digitline pitch. Similarly, the width of the 32 Mbit block is found by summing the total width of the sense amplifier blocks together with the product of the wordline pitch and the number of wordlines. This bit of math yields Width32=(Tsa·Wamp)+(Twl·Pwl6) microns, where Tsa is the number of sense amplifier strips, Wamp is the width of the sense amplifiers, Twl is the total number of wordlines including redundant and dummy lines, and Pwl6 is the wordline pitch for the $6F^2$ memory bit. Table 5 contains calculation results for the 32 Mbit block shown in FIG. 36. While overall size is the best measure of architectural efficiency, a second popular metric is array efficiency. Array efficiency is determined by dividing the area consumed by functionally addressable memory bits by the total die area. To simplify the analysis, peripheral circuits will be ignored in the array efficiency calculation. Rather, the array efficiency calculation will only consider the 32 Mbit memory block, ignoring all other factors. With this simplification, the array efficiency for a 32 Mbit block is given as Efficiency=($100 \cdot 2^{25}$·Pdl·Pwl6)÷(Area32) percent, where $2^{25}$ is the number of addressable memory bits in each 32 Mbit block. The open digitline architecture yields a calculated array efficiency of 51.7 percent.

TABLE 5

| Description | Parameter | Size |
| --- | --- | --- |
| Number of sense amplifier strips | Tsa | 17 |
| Width of sense amplifiers | Wamp | 88 μm |
| Number of local decode strips | Tldec | 17 |
| Height of local decode strips | Hldec | 93 μm |
| Number of digitlines | Tdl | 8,400 |
| Number of wordlines | Twl | 4,224 |
| Height of 32 Mbit block | Height32 | 6,621 μm |
| Width of 32 Mbit block | Width32 | 5,298 μm |
| Area of 32 Mbit block | Area32 | 35,078,058 μm |

Figure 37:
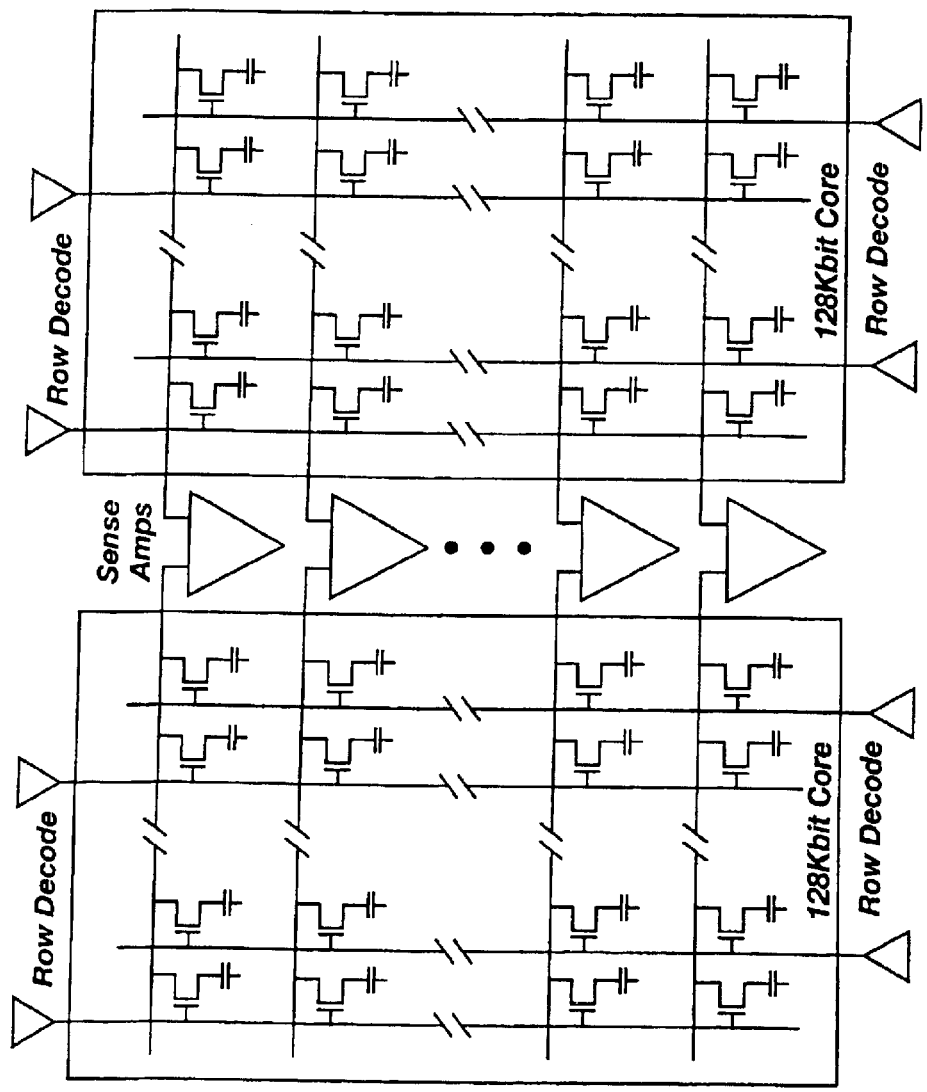
FIG. 37 is a single pitch open digitline architecture.

Unfortunately, the architecture presented in FIG. 36 is incomplete and the corresponding results do not represent reality. There are serious implications to using an open digitline architecture. The first problem is that the sense amplifiers must connect to two separate array cores. While this requirement is easily understood, the implications are far from trivial. Memory block edges present a real problem since the sense amplifiers cannot be placed outside of arrays as depicted in FIG. 36—they must always be between arrays. There are two methods of solving this problem. First, design the sense amplifiers such that the sense amplifier block contains a set of sense amplifiers for every digitline in the array. This solution, seen in FIG. 37, eliminates the need to have sense amplifiers on both sides of an array core since all of the digitlines connect to a single sense amplifier block. Not only does this solution eliminate the edge problem, but it also reduces the 32 Mbit block size since there are only eight sense amplifier strips instead of the seventeen shown in FIG. 36. Unfortunately, it is next to impossible to lay out sense amplifiers in this fashion. Even single metal sense amplifier layout, considered the tightest layout in the industry, can only achieve one sense amplifier for every two digitlines.

Figure 38:
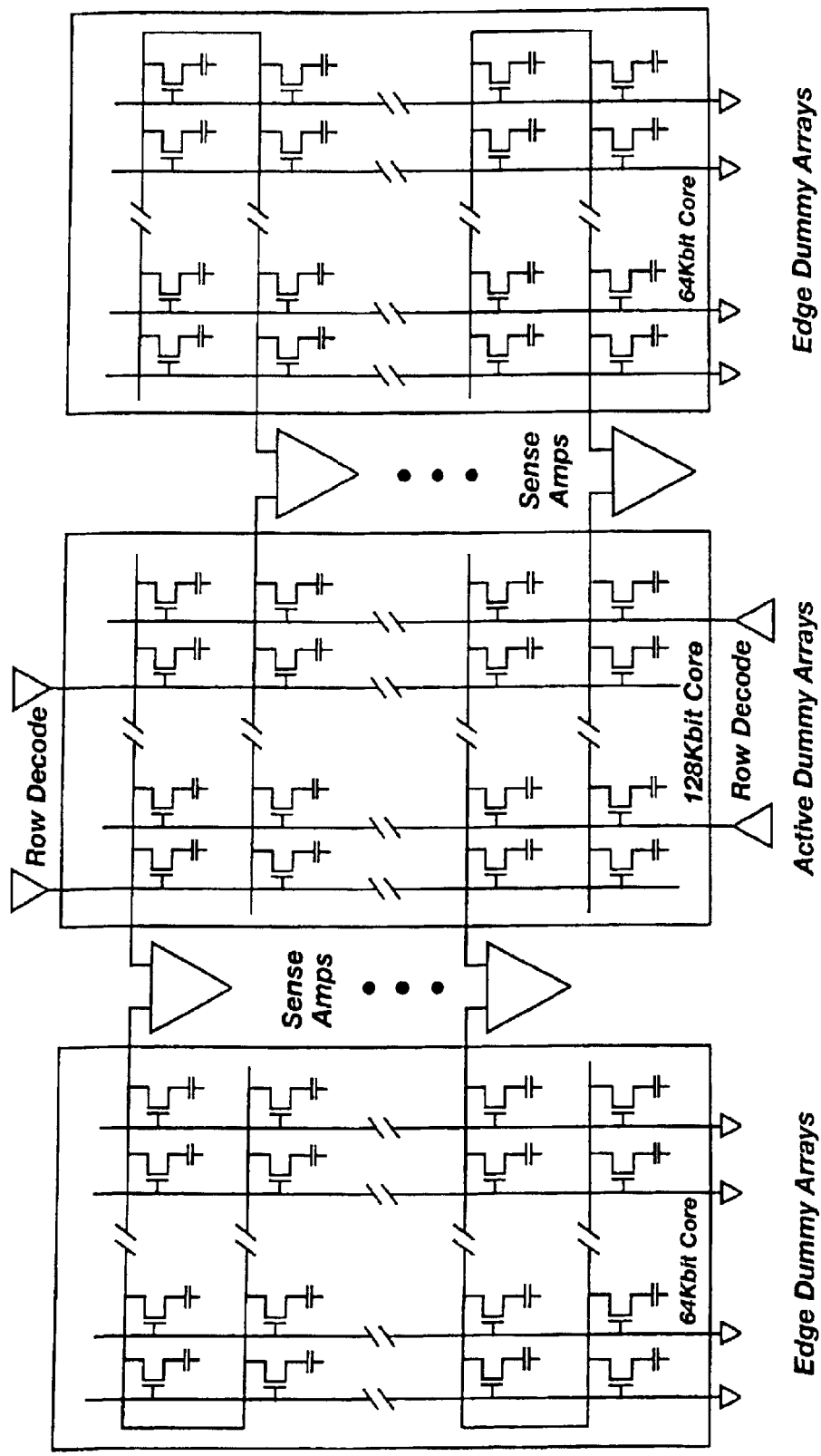
FIG. 38 is an open digitline architecture with dummy arrays.

A second approach to solving the array edge problem in open digitline architectures is to maintain the configuration shown in FIG. 36, but include some form of reference digitline for the edge sense amplifiers. The reference digitline can assume any form, as long as it accurately models the capacitance and behavior of a true digitline. Obviously, the best type of reference digitline is a true digitline. Therefore, with this approach, additional dummy array cores are added to both edges of the 32 Mbit memory block as shown in FIG. 38. The dummy array cores only need half as many wordlines as a true array core since only half of the digitlines are connected to any single sense amplifier strip. The unconnected digitlines are used to double the effective length of the reference digitlines. While this approach solves the array edge problem, it results in lower array efficiency and a larger 32 Mbit memory block. Dummy arrays solve the array edge problem inherent in open digitline architecture, but they necessitate sense amplifier layouts that are on the edge of impossible. The problem of sense amplifier layout is all the worse because of the need to route global column select lines through the layout. For all intents and purposes, the sense amplifier layout cannot be completed without the presence of an additional conductor such as a third metal or without time multiplexed sensing. Therefore, for the open digitline architecture to be successful, an additional metal must be added to the DRAM process.

The presence of metal3 not only enables the sense amplifier layout, but also permits the use of either a full or hierarchical global row decoding scheme. A full global row decoding scheme using wordline stitching places great demands upon metal and contact/via technologies, but represents the most efficient use of the additional metal. Hierarchical row decoding using bootstrap wordline drivers is slightly less efficient, but relaxes process requirements significantly. For a balanced perspective, both approaches, global and hierarchical, were analyzed. The results of this analysis for the open digitline architecture are summarized in Tables 6 and 7, respectively. Array efficiency for global and hierarchical row decoding calculated to 60.5 percent and 55.9 percent, respectively, for the 32 Mbit memory blocks is based upon data from these tables.

TABLE 6

| Description | Parameter | Size |
| --- | --- | --- |
| Number of sense amplifier strips | Tsa | 17 |
| Width of sense amplifiers | Wamp | 88 μm |
| Number of global decode strips | Tgdec | 1 |
| Height of global decode strips | Hgdec | 200 μm |
| Number of stitch regions | Nst | 17 |
| Height of stitch regions | Hst | 10 μm |
| Number of digitlines | Tdl | 8,400 |
| Number of wordlines | Twl | 4,488 |
| Height of 32 Mbit block | Height32 | 5,410 μm |
| Width of 32 Mbit block | Width32 | 5,535 μm |
| Area of 32 Mbit block | Area32 | 29,944,350 μm |

TABLE 7

| Description | Parameter | Size |
| --- | --- | --- |
| Number of sense amplifier strips | Tsa | 17 |
| Width of sense amplifiers | Wamp | 88 μm |
| Number of global decode strips | Tgdec | 1 |
| Height of global decode strips | Hgdec | 190 μm |
| Number of hier decode strips | Thdec | 17 |
| Height of hier decode strips | Hhdec | 37 μm |
| Number of digitlines | Tdl | 8,400 |
| Number of wordlines | Twl | 4,488 |
| Height of 32 Mbit block | Height32 | 5,859 μm |
| Width of 32 Mbit block | Width32 | 5,535 μm |
| Area of 32 Mbit block | Area32 | 32,429,565 μm |

Figure 39:
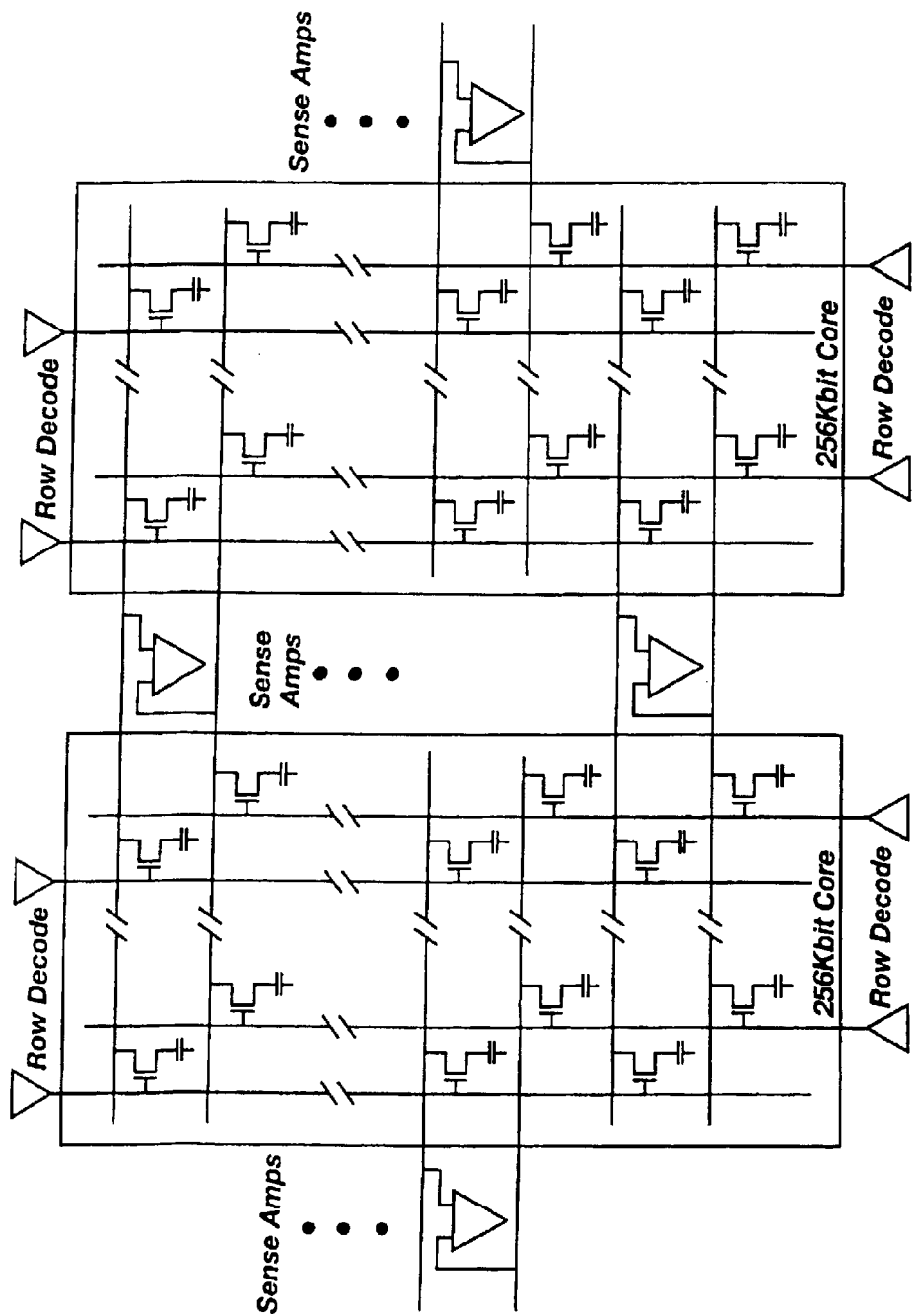
FIG. 39 is a folded digitline array architecture schematic.

Folded Array Architecture. The folded array architecture depicted in FIG. 39 is the standard architecture used in today's modern DRAM designs. The folded architecture is constructed with multiple array cores separated by strips of sense amplifiers and either row decode blocks or wordline stitching regions. Unlike the open digitline architecture which uses $6F^2$ memory bit cell pairs, the folded array core uses $8F^2$ memory bit cell pairs. Modern array cores include 262,144 ($2^{18}$) functionally addressable memory bits arranged in 532 rows and 1,044 digitlines. The 532 rows consist of 512 actual wordlines, 4 redundant wordlines and 16 dummy wordlines. Each row (wordline) connects to memory bit transistors on alternating digitlines. The 1,044 digitlines consist of 1,024 actual digitlines (512 columns), 16 redundant digitlines (8 columns) and 4 dummy digitlines. As discussed earlier, photolithography limitations necessitate the use of the dummy wordlines and digitlines. These photo problems are very pronounced at the edges of large repetitive structures such as the array core.

Sense amplifier blocks are placed on both sides of each array core. The sense amplifiers within each block are laid out at quarter pitch—one sense amplifier for every four digitlines. Each sense amplifier connects through isolation devices to columns (digitline pairs) from both adjacent array cores. Odd columns connect on one side of the core and even columns connect on the opposite side. Each sense amplifier block is, therefore, connected to only odd or even columns, never connecting to both odd and even columns within the same block. Connecting to both odd and even columns requires a half pitch sense amplifier layout—one sense amplifier for every two digitlines. While half pitch layout is possible with certain DRAM processes, the bulk of production DRAM designs remains quarter pitch due to ease of layout. The analysis presented in this section is accordingly based upon quarter pitch design practices.

Location of row decode blocks for the array core depends upon the number of available metal layers. For one and two metal processes, local row decode blocks are located at the top and bottom edges of the core. Three and four metal processes support the use of global row decodes. Global row decodes require only stitch regions or local wordline drivers at the top and bottom edges of the core. Stitch regions consume much less silicon area than local row decodes, substantially increasing array efficiency for the DRAM. The array core also includes digitline twist regions that run parallel to the wordlines. These regions provide the die area required for digitline twisting. Depending upon the particular twisting scheme selected for a design, the array core will need between one and three twist regions. For the sake of analysis, a triple twist is assumed, since it offers the best overall noise performance and is the choice of DRAM manufacturers on advanced large-scale applications. Each twist region constitutes a break in the array structure, necessitating the inclusion of dummy wordlines. For this reason, there are 16 dummy wordlines (2 for each array edge) in the folded array core rather than 4 dummy wordlines as in the open digitline architecture.

The array core for folded digitline architectures contains more memory bits than is possible for open digitline architectures. Larger core size is an inherent feature of folded architectures arising from the very nature of the architecture. Folded architectures get their name from the fact that a folded array core results from folding two open digitline array cores one on top of the other. The digitlines and wordlines from each folded core are spread apart (double pitch) to allow room for the other folded core. After folding, each constituent core remains intact and independent, except for memory bit changes ($8F^2$ conversion) that are necessary in the folded architecture. The array core size doubles since the total number of digitlines and wordlines doubles in the folding process. It does not quadruple as one might suspect, because the two constituent folded cores remain independent—the wordlines from one folded core do not connect to memory bits in the other folded core. Digitline pairing (column formation) is a natural outgrowth of the folding process since each wordline only connects to memory bits on alternating digitlines. The existence of digitline pairs (columns) is the one characteristic of folded digitline architectures that produces superior signal-to-noise performance. Furthermore, the digitlines that form a column are physically adjacent to one another. This feature permits various digitline twisting schemes to be used which further improves signal-to-noise.

TABLE 8

| Wordline Length | Rwl | Cwl | Time Constant |
| --- | --- | --- | --- |
| 128 memory bits | 3,072 ohms | 77 fF | 0.24 nS |
| 256 memory bits | 6,144 ohms | 154 fF | 0.95 nS |
| 512 memory bits | 12,288 ohms | 307 fF | 3.77 nS |
| 1,024 memory bits | 24,576 ohms | 614 fF | 15.09 nS |

Similar to the open digitline architecture, digitline length for the folded digitline architecture is again limited by power dissipation and minimum cell to digitline capacitance ratio. For the 256 Mbit generation, digitlines are restricted from having connection to more than 256 cells (128 memory bit pairs). The analysis to arrive at this quantity is similar to that for the open digitline architecture. Refer back to Table 3 to view the calculated results of power dissipation versus digitline length for a 256 Mbit DRAM in 8K refresh. Wordline length is again limited by the maximum allowable RC time constant of the wordline. Contrary to an open digitline architecture in which each wordline connects to memory bits on each digitline, the wordlines in a folded digitline architecture only connect to memory bits on alternating digitlines. Therefore, a wordline can cross 1,024 digitlines while only connecting to 512 memory bit transistors. The wordlines will have twice the overall resistance, but only slightly more capacitance since the wordlines run over field oxide on alternating digitlines. Table 8 contains the effective wordline time constants for various wordline lengths for a folded array core. For a wordline connected to N memory bits, the total resistance and capacitance using 0.3 μm polysilicon are Rwl=2·N·Pwl÷0.3 μm ohms and Cwl=Cw8·N Farads, respectively. As shown in Table 8, the wordline length cannot exceed 512 memory bits (1,024 digitlines) for the wordline time constant to remain under four nanoseconds. Although the wordline connects to only 512 memory bits, it is two times longer (1,024 digitlines) than wordlines in open digitline array cores. The folded digitline architecture, therefore, requires half as many row decode blocks or wordline stitching regions as the open digitline architecture.

Figure 40:
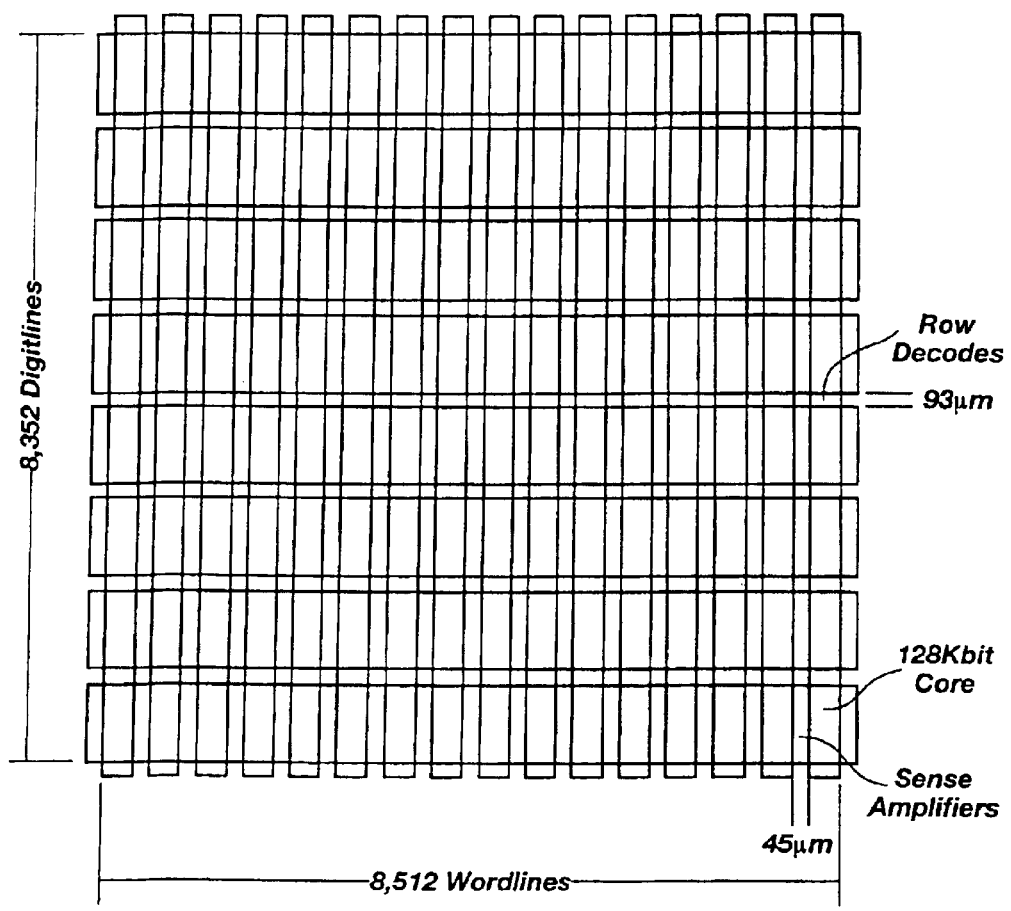
FIG. 40 is a folded digitline architecture 32 Mbit array block.

A diagram of a 32 Mbit array block using folded digitline architecture is shown in FIG. 40. This block requires a total of 128 256 Kbit array cores. In this figure, the 128 array cores are arranged in an 8 row by 16 column configuration. The 16 column by 8 row arrangement produces 2 Mbit sections consisting of 256 wordlines and 8,192 digitlines (4,096 columns). A total of 16 2 Mbit sections form the complete 32 Mbit array block. Sense amplifier strips are positioned vertically between each 2 Mbit section, as was done in the open digitline architecture. Again, row decode blocks or wordline stitching regions are positioned horizontally between the array cores.

The 32 Mbit array block shown in FIG. 40 includes size estimates for the various pitch cells. Layout was generated where necessary to arrive at the size estimates. Overall size for the folded digitline 32 Mbit block can be found by again summing the dimensions for each component. Accordingly, Height32=(Tr·Hrdec)+(Tdl·Pdl) microns, where Tr is the number of row decoders, Hrdec is the height of each decoder, Tdl is the number of digitlines including redundant and dummy, and Pdl is the digitline pitch. Similarly, Width32=(Tsa·Wamp)+(Twl·Pwl8)+(Ttwist·Wtwist) microns, where Tsa is the number of sense amplifier strips, Wamp is the width of the sense amplifiers, Twl is the total number of wordlines including redundant and dummy, Pwl8 is the wordline pitch for the $8F^2$ memory bit, Ttwist is the total number of twist regions, and Wtwist is the width of the twist regions. Table 9 shows the calculated results for the 32 Mbit block shown in FIG. 40. This table assumes the use of a double metal process necessitating the use of local row decoder blocks. Note that Table 9 contains approximately twice as many wordlines as Table 5 for the open digitline architecture. The reason for this is that each wordline in the folded array only connects to memory bits on alternating digitlines, whereas each wordline in the open array connects to memory bits on every digitline. A folded digitline design, therefore, needs twice as many wordlines as a comparable open digitline design.

TABLE 9

| Description | Parameter | Size |
|---|---|---|
| Number of sense amplifier strips | Tsa | 17 |
| Width of sense amplifiers | Wamp | 45 μmn |
| Number of local decode strips | Tldec | 9 |
| Height of local decode strips | Hldec | 93 μm |
| Number of digitlines | Tdl | 8,352 |

TABLE 9-continued

| Description | Parameter | Size |
|---|---|---|
| Number of wordlines | Twl | 8,512 |
| Number of twist regions | Ttwist | 48 |
| Width of twist regions | Wtwist | 6 μm |
| Height of 32 Mbit block | Height32 | 6,592 μm |
| Width of 32 Mbit block | Width32 | 6,160 μm |
| Area of 32 Mbit block | Area32 | 40,606,720 μm |

Array efficiency for the 32 Mbit memory block from FIG. 40 is again found by dividing the area consumed by functionally addressable memory bits by the total die area. For a simplified analysis, the peripheral circuits are ignored. Array efficiency for the 32 Mbit block is, therefore, given as Efficiency=($100 \cdot 2^{25}$·Pdl·2·Pwl8)÷(Area32) percent, which yields 59.5 percent for the folded array design example.

The addition of metal3 to the DRAM process enables the use of either a global or hierarchical row decoding scheme—similar to the open digitline analysis. While global row decoding and stitched wordlines achieve the smallest die size, they also place greater demands upon the fabrication process. For a balanced perspective, both approaches were analyzed for the folded digitline architecture. The results of this analysis are presented in Tables 10 and 11. Array efficiency for the 32 Mbit memory blocks using global and hierarchical row recoding is calculated to 74.0 percent and 70.9 percent, respectively.

TABLE 10

| Description | Parameter | Size |
|---|---|---|
| Number of sense amplifier strips | Tsa | 17 |
| Width of sense amplifiers | Wamp | 45 μm |
| Number of global decode strips | Tgdec | 1 |
| Height of global decode strips | Hgdec | 200 μm |
| Number of stitch regions | Nst | 9 |
| Height of stitch regions | Hst | 10 μm |
| Number of digitlines | Tdl | 8,352 |
| Number of wordlines | Twl | 8,512 |
| Number of twist regions | Ttwist | 48 |
| Width of twist regions | Wtwist | 6 μm |
| Height of 32 Mbit block | Height32 | 5,301 μm |
| Width of 32 Mbit block | Width32 | 6,160 μm |
| Area of 32 Mbit block | Area32 | 32,654,160 μm |

TABLE 11

| Description | Parameter | Size |
|---|---|---|
| Number of sense amplifier strips | Tsa | 17 |
| Width of sense amplifiers | Wamp | 45 μm |
| Number of global decode strips | Tgdec | 1 |
| Height of global decode strips | Hgdec | 190 μm |
| Number of hier decode strips | Nhdec | 9 |
| Height of hier decode strips | Hhec | 37 μm |
| Number of digitlines | Tdl | 8,352 |
| Number of wordlines | Twl | 8,512 |
| Number of twist regions | Ttwist | 48 |
| Width of twist regions | Wtwist | 6 μm |
| Height of 32 Mbit block | Height32 | 5,534 μm |
| Width of 32 Mbit block | Width32 | 6,160 μm |
| Area of 32 Mbit block | Area32 | 34,089,440 μm |

Advanced Bilevel DRAM Architecture. The present invention provides a novel advanced architecture for use on future large scale DRAMs. A 32 Mbit memory block is described with this new architecture for use in a 256 Mbit DRAM. The results achieved with the new architecture are compared to those obtained for the open digitline and folded digitline architectures described above.

The bilevel digitline architecture is an innovation which has created a new DRAM array configuration—one that allows the use of 6F² memory bits in an otherwise folded digitline array configuration.

Figure 41:
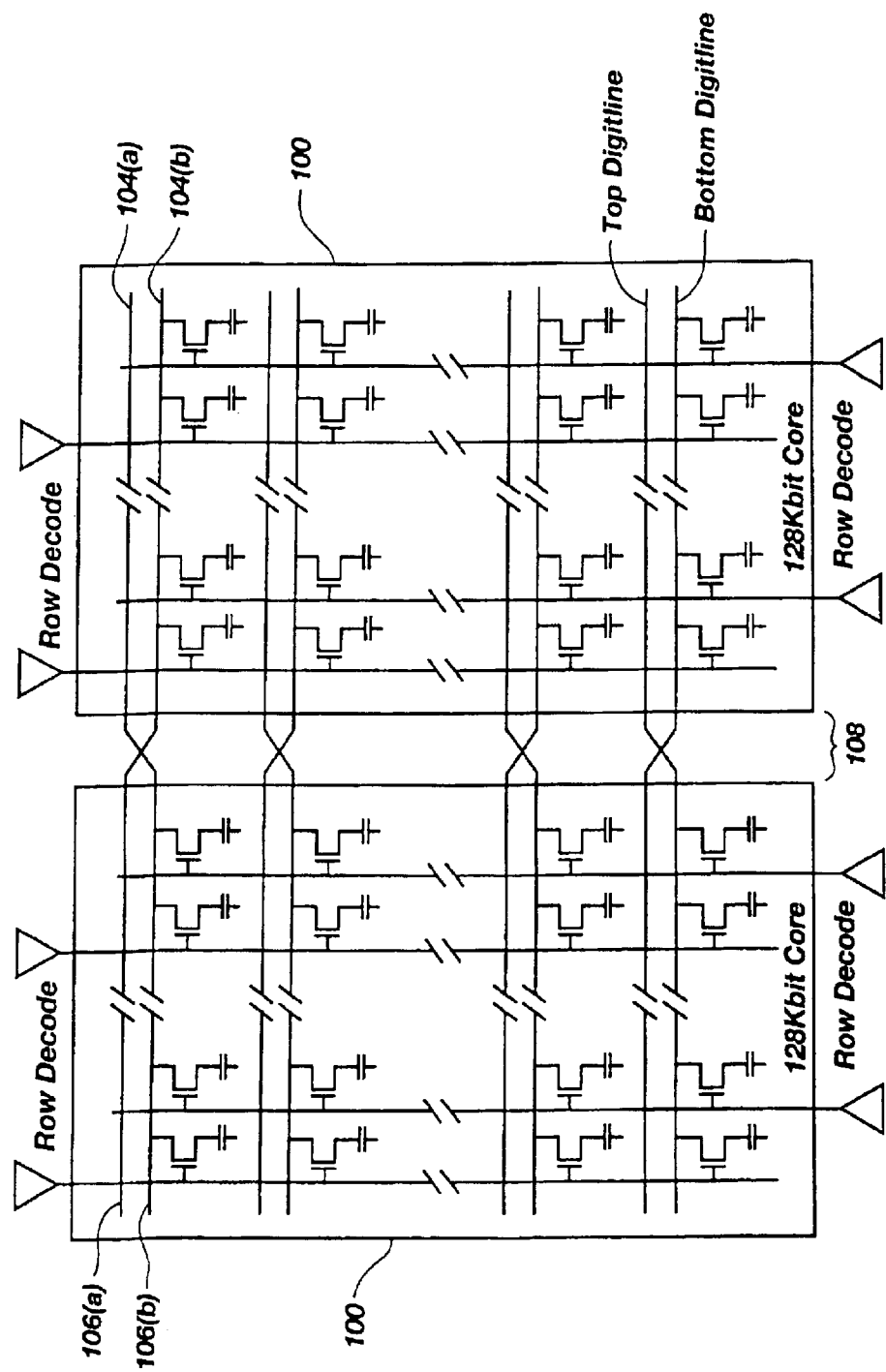
FIG. 41 is a development of bi-level digitline architecture.
Figure 42:
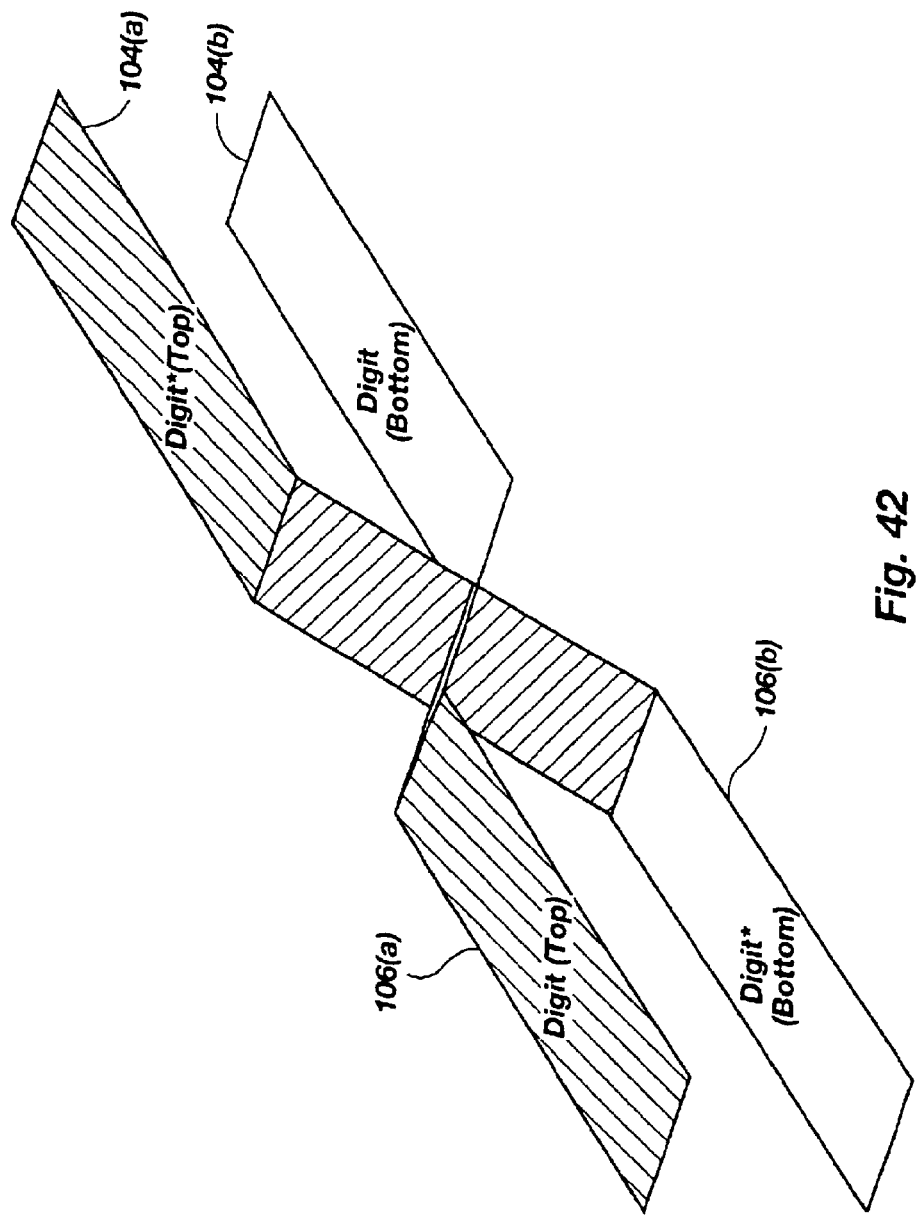
FIG. 42 is a digitline vertical twisting concept.

6F² memory cells are a byproduct of cross-point style (open digitline) array blocks. Cross-point style array blocks require that every wordline connect to memory bit transistors on every digitline, precluding the formation of digitline pairs. Yet, digitline pairs (columns) remain an essential element in folded digitline type operation. Digitline pairs and digitline twisting are important features that provide for good signal to noise performance. The bilevel digitline architecture solves the cross-point and digitline pair dilemma through vertical integration. Essentially, two open digitline cross-point array sections 100 are placed side by side as seen in FIG. 41. Digitlines in one array section are designated as true digitlines 106(b) and 104(b) while digitlines from the second array section are designated as complement digitlines 104(a) and 106(a). An additional conductor is added to the DRAM process to complete formation of the digitline pairs. The added conductor allows digitlines from each array section to route across the other array section—both true and complement digitlines being vertically aligned. At the juncture 108 between each section, the true and complement signals are vertically twisted. This twisting allows the true digitline to connect to memory bits in one array section and the complement digitline to connect to memory bits in the other array section. The twisting concept is illustrated in FIG. 42.

Figure 43:
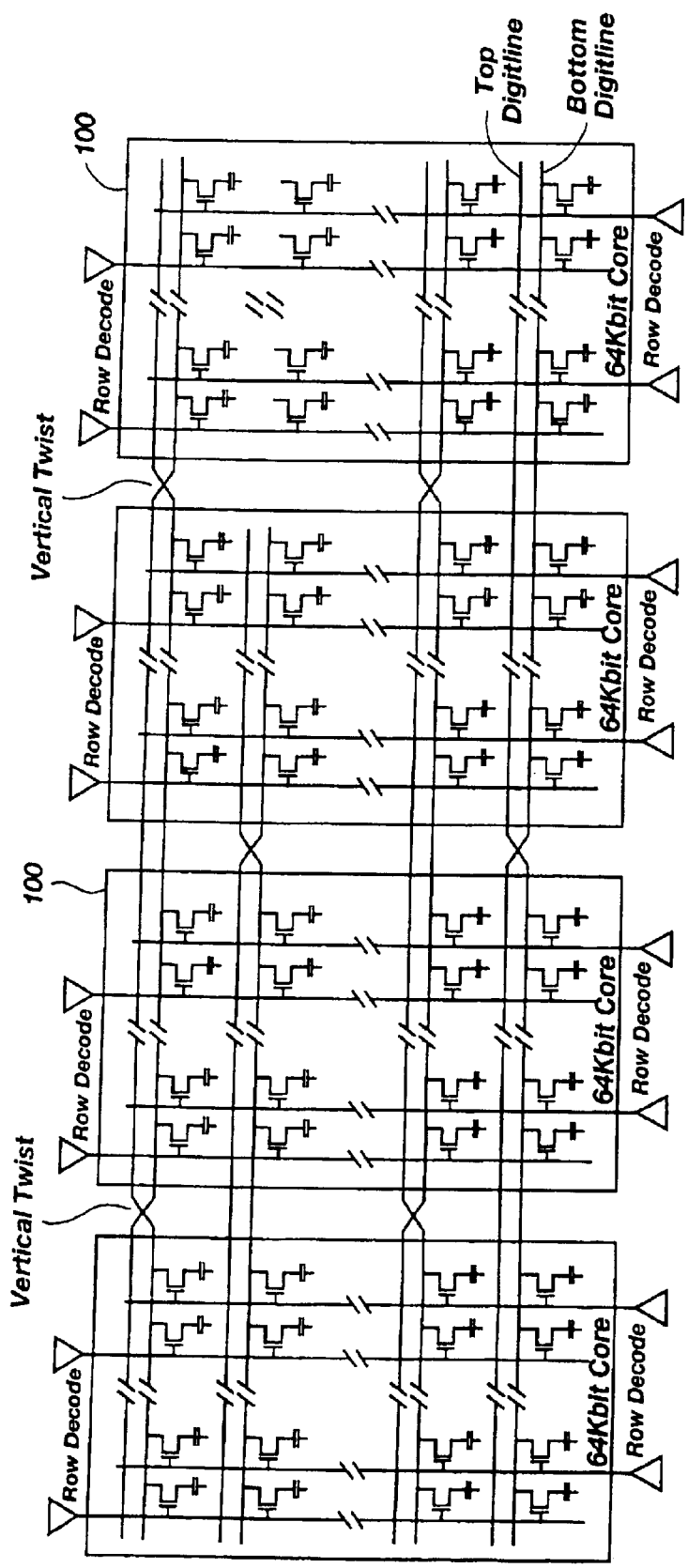
FIG. 43 is a bi-level digitline architecture schematic.

To improve signal to noise characteristics of this design, the single twist region is replaced by three twist regions as illustrated in FIG. 43. An added benefit to multiple twist regions is that only half of the digitline pairs actually twist within each region, thus making room in the twist region for each twist to occur. The twist regions are equally spaced at the 25%, 50%, and 75% marks in the overall array. Assuming that even digitline pairs twist at the 50% mark, then odd digitlines twist at the 25% and 75% marks. Each component of a digitline pair, true and complement, spends half of its overall length on the bottom conductor connecting to memory bits and half of its length on the top conductor. This characteristic balances the capacitance and the number of memory bits associated with each digitline. Furthermore, the triple twisting scheme guarantees that the noise terms are balanced for each digitline, producing excellent signal to noise performance.

Figure 44A:
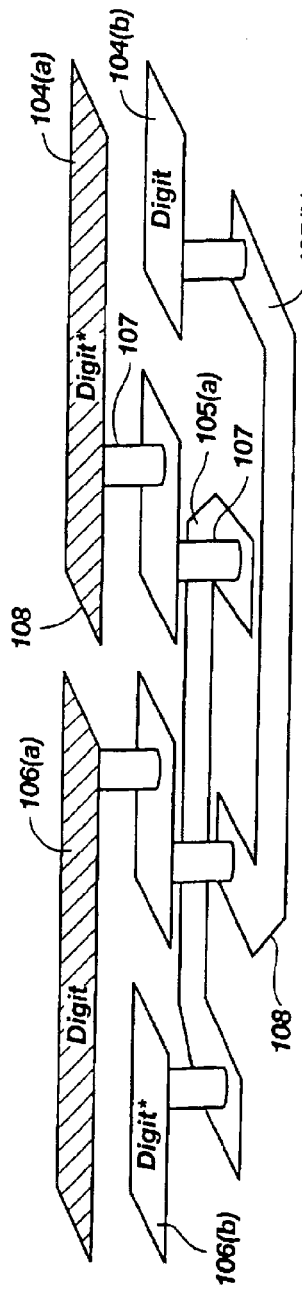
FIG. 44A depicts a first vertical twisting scheme.
Figure 44B:
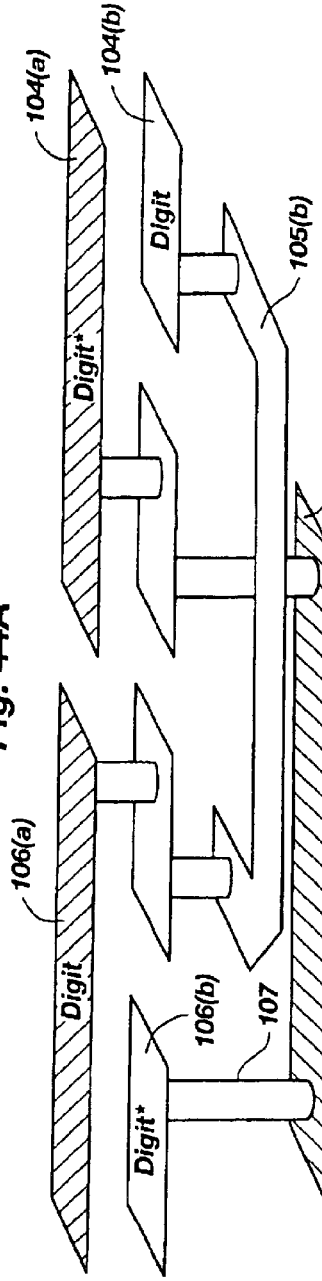
FIG. 44B depicts a second vertical twisting scheme.
Figure 44C:
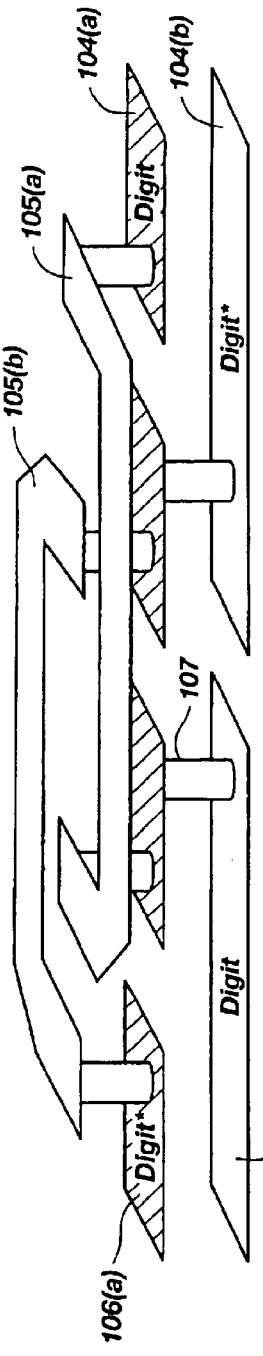
FIG. 44C depicts a third vertical twisting scheme.

A variety of vertical twisting schemes is possible with the bilevel digitline architecture. As shown in FIGS. 44A–C, each scheme utilizes conductive layers already present in the DRAM process to complete the twist. Vertical twisting is simplified since only half of the digitlines is involved in a given twist region. The final selection of a twisting scheme is based upon available process technology, yield factors and die size consideration.

FIG. 44A illustrates one architecture where a multi-level digitline pair having a digit and digit complement line is fabricated in a semiconductor die. The two digitlines are separated into multiple segments by a vertical twist 108 which allows one segment of a digitline to be vertically located below a segment of another digitline on one side of the twist while having the vertical locations reversed on the other side of the vertical twist. The multi-level digitline pair is preferably fabricated using three levels of the memory die. Two of the levels are used for the digitlines 104 and 106 while the third level is used for conductive lines 105(a) and (b). It will be appreciated that the third level is not required, but the horizontal area requirement will be increased by locating lines 105 on the second level. The multiple levels are connected via vertical conductive connections 107. Connections 107 can be any conductive material and are preferably fabricated as either a polysilicon plug or a metal plug. Memory cells are coupled to a digitline when that digitline is located vertically below the other digitline. That is, digitlines 104(b) and 106(a) are coupled to memory cells.

FIG. 44B illustrates an architecture where the lines 105 are fabricated on two separate levels, thereby requiring four levels of the semiconductor. This architecture reduces the horizon area requirements. FIG. 44C illustrates a memory where the conductive lines 105 are fabricated above the digitline pair.

The architectures of FIGS. 44A, B and C include one vertical twist and are presented to illustrate different possible fabrication techniques. It will be appreciated that the memory can be designed with multiple vertical twists per digitline pair such that, in total, half of each digitline is coupled to memory cells. Further, the digitlines, conductive lines 105, and connections 107 can be fabricated using available conductive materials including, but not limited to, metal, polysilicon and doped regions in the substrate.

Figure 45:
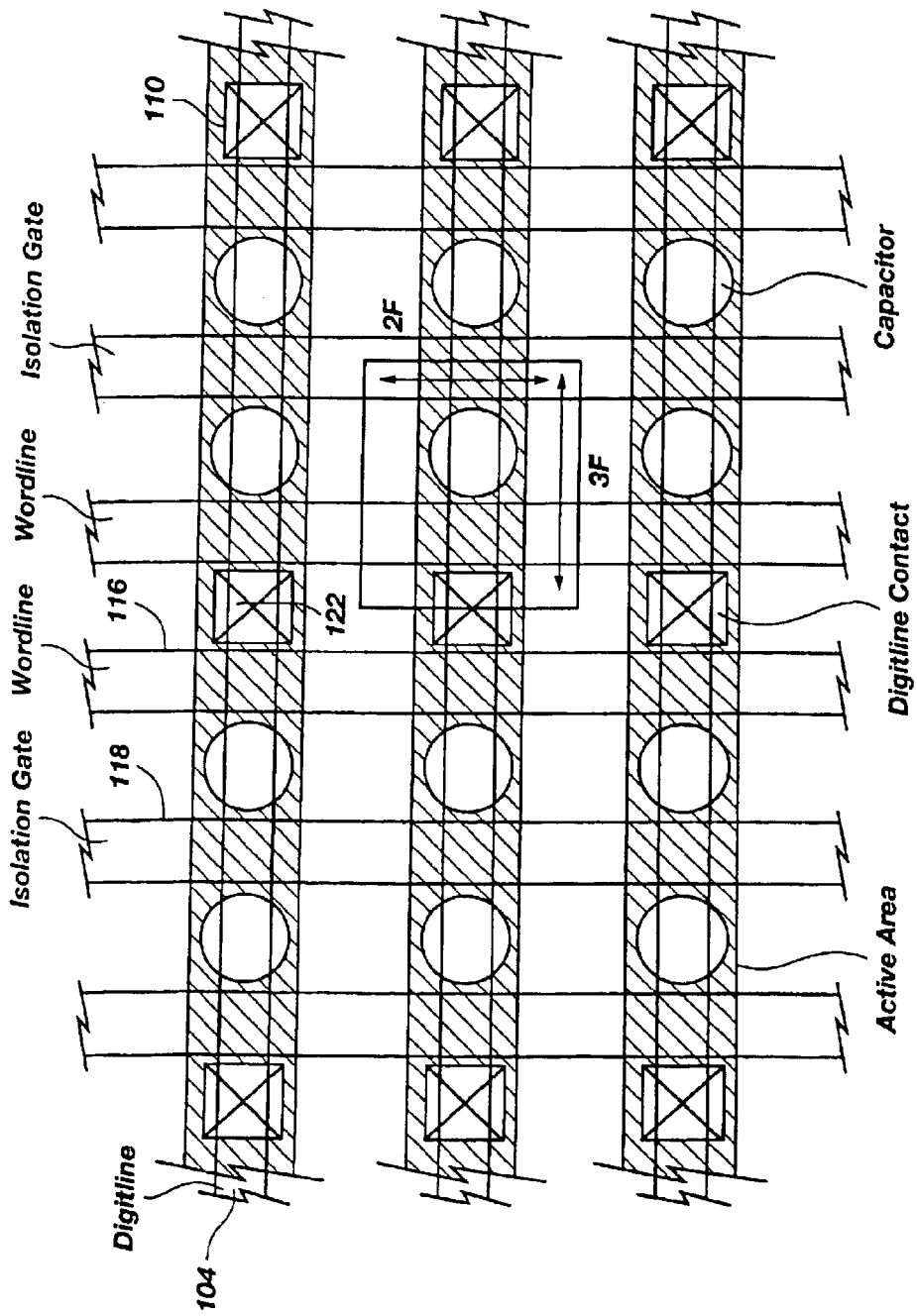
FIG. 45 is a plaid $6F^2$ memory bit array.

To further advance the bilevel digitline architecture concept, its 6F² memory bit was modified to improve yield. Shown in arrayed form in FIG. 45, the 'plaid' memory bit is constructed using long parallel strips of active area 110 vertically separated by traditional field oxide isolation. Wordlines 116 run perpendicular to the active area in straight strips of polysilicon. Plaid memory bits are again constructed in pairs that share a common contact 122 to the digitline 104 or 106. Isolation gates 118 (transistors) formed with additional polysilicon strips provide horizontal isolation between memory bits. Isolation is obtained from these gates by permanently connecting the isolation gate polysilicon to either a ground or negative potential. The use of isolation gates in this memory bit design eliminates one and two dimensional encroachment problems associated with normal isolation processes. Furthermore, many photolithography problems are eliminated from the DRAM process as a result of the straight, simple design of both the active area and polysilicon in the memory bit. The "plaid" designation for this memory bit is derived from the similarity between an array of memory bits and tartan fabric—very apparent in a color array plot. Isolation transistors having a gate connected to a bias potential have been used for isolation in pitch cells in prior memory devices. Isolation gates, however, have not been used in a memory array.

In the bilevel and folded digitline architectures, both true and complement digitlines exist in the same array core. Accordingly, the sense amplifier block needs only one sense amplifier for every two digitline pairs. For the folded digitline architecture, this yields one sense amplifier for every four metal1 digitlines—quarter pitch. The bilevel digitline architecture that uses vertical digitline stacking needs one sense amplifier for every two metal1 digitlines—half pitch. Sense amplifier layout is, therefore, more difficult for bilevel than folded designs. The triple metal DRAM process needed for bilevel architectures concurrently enables and simplifies sense amplifier layout. Metal1 is used for lower level digitlines and local routing within the sense amplifiers and row decoders. Metal2 is available for upper level digitlines and column select signal routing through the sense amplifiers. Metal3 can, therefore, be used for column select routing across the arrays and control and power routing through the sense amplifiers. The function of metal2 and metal3 can easily be swapped in the sense amplifier block depending upon layout preferences and design objectives.

Wordline pitch is effectively relaxed for the plaid $6F^2$ memory bit used in the bilevel digitline architecture. The memory bit is still built using the minimum process feature size of 0.3 µm. The relaxed wordline pitch stems from structural differences between a folded digitline memory bit and an open digitline or plaid memory bit. There are essentially four wordlines running across each folded digitline memory bit pair compared to two wordlines that run across each open digitline or plaid memory bit pair. Although the plaid memory bit is 25% shorter than a folded memory bit (3 features versus 4 features), it also has half as many wordlines, effectively reducing the wordline pitch. This relaxed wordline pitch makes layout much easier for the wordline drivers and address decode tree. In fact, both odd and even wordlines can be driven from the same row decoder block, thus eliminating half of the row decoder strips in a given array block. This is an important consideration since the tight wordline pitch for folded digitline designs necessitates separate odd and even row decode strips.

Figure 46:
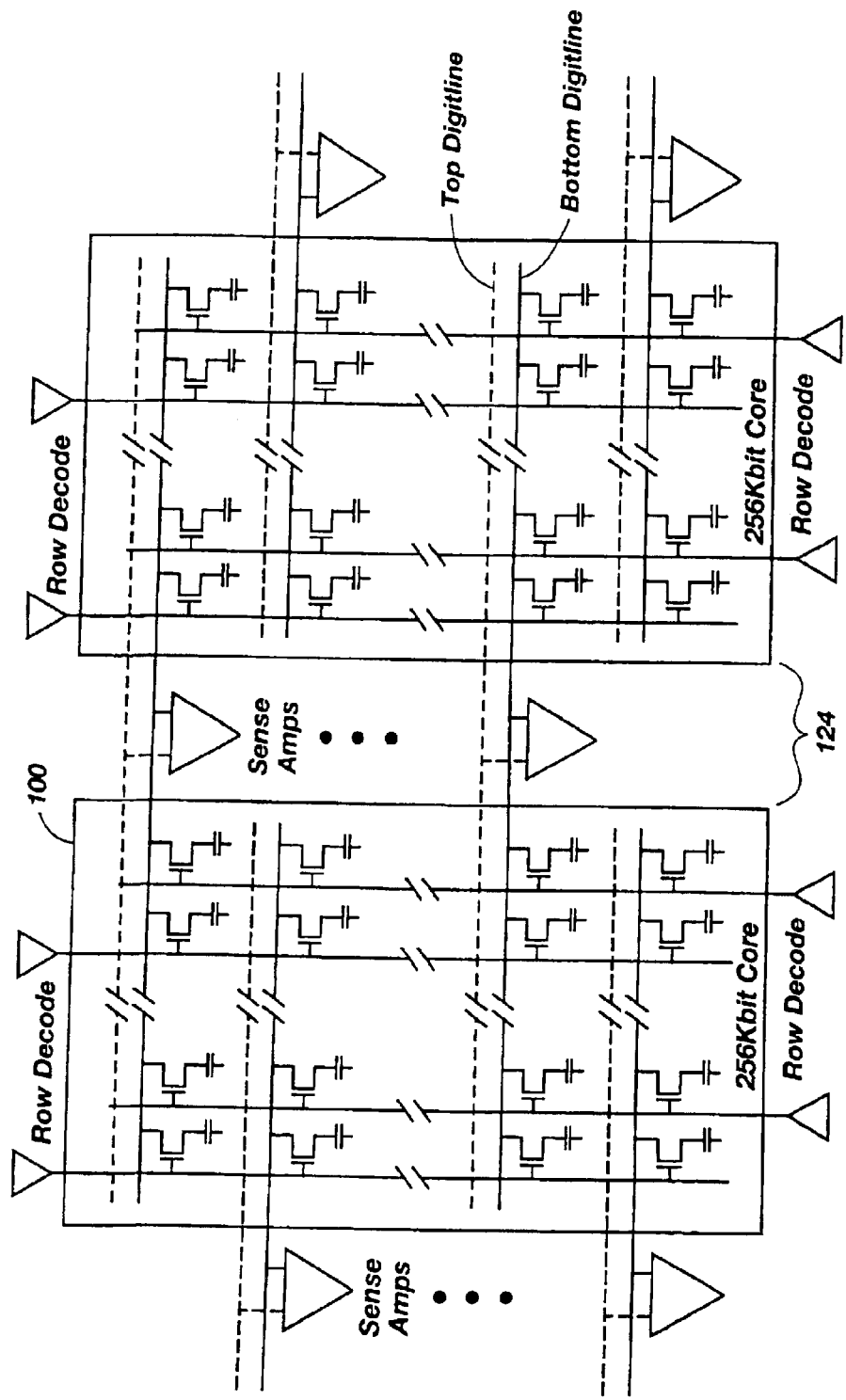
FIG. 46 is a bi-level digitline array schematic.

The bilevel digitline array architecture depicted in FIG. 46 is the preferred architecture for tomorrow's large scale DRAM designs. The bilevel architecture is constructed with multiple array cores 100 separated by strips of sense amplifiers 124 and either row decode blocks or wordline stitching regions. Wordline stitching requires a four metal process while row decode blocks can be implemented in a three metal process. The array cores include 262,144 ($2^{25}$) functionally addressable plaid $6F^2$ memory bits arranged in 532 rows and 524 bilevel digitline pairs. The 532 rows consist of 512 actual wordlines, 4 redundant wordlines, and 16 dummy wordlines. There are also 267 isolation gates in each array due to the use of plaid memory bits, but since they are accounted for in the wordline pitch, they can be ignored. The 524 bilevel digitline pairs consist of 512 actual digitline pairs, 8 redundant digitline pairs, and 4 dummy digitline pairs. The term "digitline pair" is used in describing the array core structure since pairing is a natural product of the bilevel architecture. Each digitline pair consists of one digitline on metal1 and a vertically aligned complementary digitline on metal2.

Sense amplifier blocks are placed on both sides of each array core. The sense amplifiers within each block are laid out at half pitch—one sense amplifier for every two metal1 digitlines. Each sense amplifier connects through isolation devices to columns (digitline pairs) from two adjacent array cores. Similar to the folded digitline architecture, odd columns connect on one side of the array core and even columns connect on the other side. Each sense amplifier block is then exclusively connected to either odd or even columns, never both.

Unlike a folded digitline architecture that needs a local row decode block connected to both sides of an array core, the bilevel digitline architecture only needs a local row decode block connected to one side of each core. As stated earlier, the relaxed wordline pitch allows both odd and even rows to be driven from the same local row decoder block. This feature helps make the bilevel digitline architecture more efficient than alternative architectures. A four metal DRAM process allows local row decodes to be replaced by either stitch regions or local wordline drivers. Either approach could substantially reduce die size. The array core also includes the three twist regions that are necessary for the bilevel digitline architecture. The twist region is somewhat larger than that used in the folded digitline architecture, due to the complexity of twisting digitlines vertically. The twist regions again constitute a break in the array structure, necessitating the inclusion of dummy wordlines.

As with the open digitline and folded digitline architecture, the bilevel digitline length is limited by power dissipation and minimum cell to digitline capacitance ratio. In the 256 Mbit generation, the digitlines are again restricted from having connection to more than 256 memory bits (128 memory bit pairs). The analysis to arrive at this quantity is the same as that for the open digitline architecture, except that the overall digitline capacitance is higher since the digitline runs equal lengths in metal2 and metal1. The capacitance added by the metal2 component is small compared to the metal1 component since metal2 does not connect to memory bit transistors. Overall, the digitline capacitance increases by about 25 percent compared to an open digitline. The power dissipated during a read or refresh operation is proportional to the digitline capacitance (Cd), the supply voltage (Vcc), the number of active columns (N), and the refresh period (P) and is given as Pd=Vccx·(N·Vcc (Cd+Cc))÷(2·P) watts. On a 256 Mbit DRAM in 8K refresh there are 32,768 ($2^{15}$) active columns during each read, write, or refresh operation. Active array current and power dissipation for a 256 Mbit DRAM are given in Table 12 for a 90 nS refresh period (−5 timing) at various digitline lengths. The budget for active array current is limited to 200 mA for this 256 Mbit design. To meet this budget, the digitline cannot exceed a length of 256 memory bits.

TABLE 12

| Digitline Length | Digitline Capacitance | Active Current | Power Dissipation |
| --- | --- | --- | --- |
| 128 memory bits | 128 fF | 75 mA | 249 mW |
| 256 memory bits | 256 fF | 151 mA | 498 mW |
| 512 memory bits | 513 fF | 301 mA | 994 mW |

Wordline length is again limited by the maximum allowable RC time constant of the wordline. The calculation for bilevel digitline is identical to that performed for open digitline due to the similarity of array core design. These results are given in Table 4 above. Accordingly, the wordline length cannot exceed 512 memory bits (512 bilevel digitline pairs) if the wordline time constant is to remain under the required four nanosecond limit.

Figure 47:
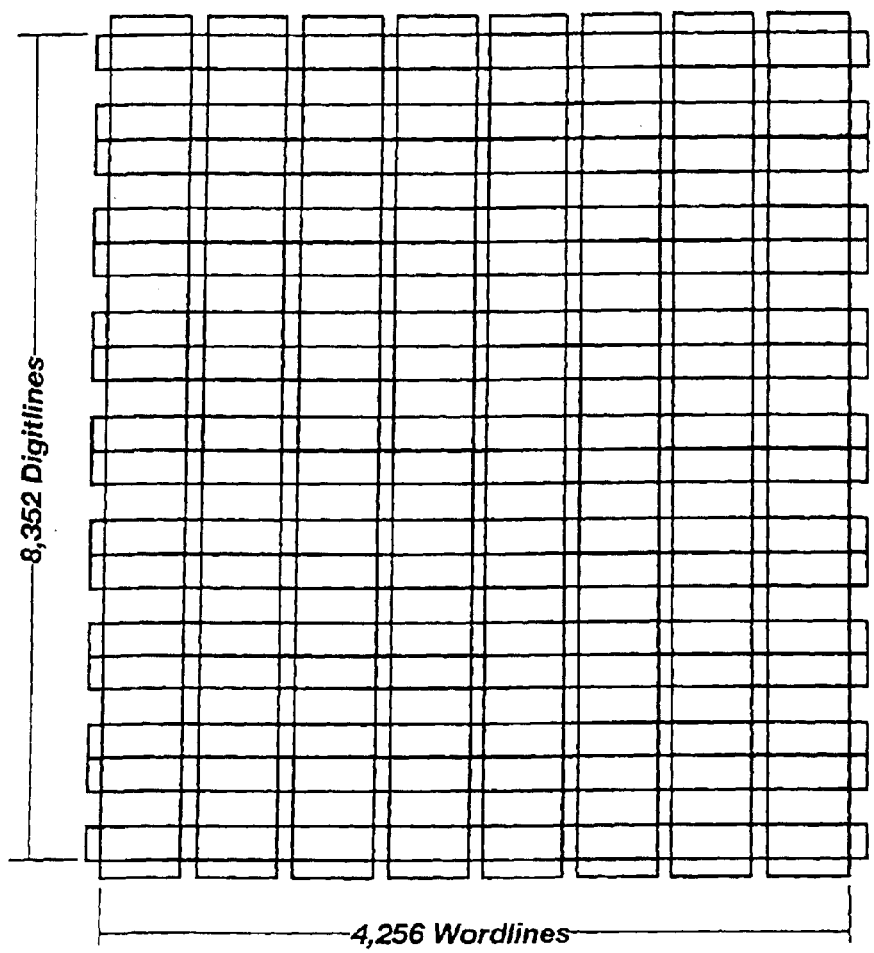
FIG. 47 is a bi-level digitline architecture 32 Mbit array block.

Layout of various bilevel elements was generated to obtain reasonable estimates of pitch cell size. These size estimates allow overall dimensions for a 32 Mbit array block to be calculated. The diagram for a 32 Mbit array block using the bilevel digitline architecture is shown in FIG. 47. This block requires a total of 128 256 Kbit array cores. The 128 array cores are arranged in 16 rows and 8 columns. Each 4 Mbit vertical section consists of 512 wordlines and 8,192 bilevel digitline pairs (8,192 columns). A total of eight 4 Mbit strips are required to form the complete 32 Mbit block. Sense amplifier blocks are positioned vertically between each 4 Mbit section. Row decode strips are positioned horizontally between every array core. There are only a total of eight row decode strips needed for the sixteen array cores since each row decode contains wordline drivers for both odd and even rows.

The 32 Mbit array block shown in FIG. 47 includes pitch cell layout estimates. Overall size for the 32 Mbit block is found by summing the dimensions for each component. As before, Height32=(Tr·Hrdec)+(Tdl·Pdl) microns where Tr is the number of bilevel row decoders, Hrdec is the height of each decoder, Tdl is the number of bilevel digitline pairs including redundant and dummy, and Pdl is the digitline pitch. Also, Width32=(Tsa·Wamp)+(Twl·Pwl6)+ (Ttwist·Wtwist) microns, where Tsa is the number of sense amplifier strips, Wamp is the width of the sense amplifiers, Twl is the total number of wordlines including redundant and dummy, Pwl6 is the wordline pitch for the plaid $6F^2$ memory bit, Ttwist is the total number of twist regions, and Wtwist is the width of the twist regions. Table 13 shows the calculated results for the bilevel 32 Mbit block shown in FIG. 47. A triple metal process is assumed in these calculations since it requires the use of local row decoders. Array efficiency for the bilevel digitline 32 Mbit array block is given as Efficiency=$(100 \cdot 2^{25} \cdot Pdl \cdot 2 \cdot Pwl6) \div (Area32)$ percent, which yields 63.1 percent for this design example.

TABLE 13

| Description | Parameter | Size |
| --- | --- | --- |
| Number of sense amplifier strips | Tsa | 9 |
| Width of sense amplifiers | Wamp | 65 μm |
| Number of local decode strips | Tldec | 8 |
| Height of local decode strips | Hldec | 149 μm |
| Number of digitlines | Tdl | 8,352 |
| Number of wordlines | Twl | 4,256 |
| Number of twist regions | Ttwist | 24 |
| Width of twist regions | Wtwist | 9 μm |
| Height of 32 Mbit block | Height32 | 6,203 μm |
| Width of 32 Mbit block | Width32 | 4,632 μm |
| Area of 32 Mbit block | Area32 | 28,732,296 μm |

With metal4 added to the bilevel DRAM process, the local row decoder scheme can be replaced by a global or hierarchical row decoder scheme. The addition of a fourth metal to the DRAM process places even greater demands upon process technologists. Regardless, an analysis of 32 Mbit array block size was performed assuming the availability of metal4. The results of the analysis are shown in Tables 14 and 15 for the global and hierarchical row decode schemes. Array efficiency for the 32 Mbit memory block using global and hierarchical row decoding calculates to 74.5 percent and 72.5 percent, respectively.

TABLE 14

| Description | Parameter | Size |
| --- | --- | --- |
| Number of sense amplifier strips | Tsa | 9 |
| Width of sense amplifiers | Wamp | 65 μm |
| Number of global decode strips | Tgdec | 1 |
| Height of global decode strips | Hgdec | 200 μm |
| Number of stitch regions | Nst | 4 |
| Height of stitch regions | Hst | 10 μm |
| Number of digitlines | Tdl | 8,352 |
| Number of wordlines | Twl | 4,256 |
| Number of twist regions | Ttwist | 24 |
| Width of twist regions | Wtwist | 9 μm |
| Height of 32 Mbit block | Height32 | 5,251 μm |
| Width of 32 Mbit block | Width32 | 4,632 μm |
| Area of 32 Mbit block | Area32 | 24,322,632 μm |

TABLE 15

| Description | Parameter | Size |
| --- | --- | --- |
| Number of sense amplifier strips | Tsa | 9 |
| Width of sense amplifiers | Wamp | 65 μm |
| Number of global decode strips | Tgdec | 1 |
| Height of global decode strips | Hgdec | 190 μm |
| Number of hier decode strips | Nhdec | 4 |
| Height of hier decode strips | Hhec | 48 μm |
| Number of digitlines | Tdl | 8,352 |
| Number of wordlines | Twl | 4,256 |
| Number of twist regions | Ttwist | 24 |
| Width of twist regions | Wtwist | 9 μm |

TABLE 15-continued

| Description | Parameter | Size |
| --- | --- | --- |
| Height of 32 Mbit block | Height32 | 5,393 μm |
| Width of 32 Mbit block | Width32 | 4,632 μm |
| Area of 32 Mbit block | Area32 | 24,980,376 μm |

Architectural Comparison. Although a straight comparison of DRAM architectures might appear simple, in actual fact it is a very complicated problem. Profit remains the critical test of architectural efficiency and is the true basis for comparison. This in turn requires accurate yield and cost estimates for each alternative. Without these estimates and a thorough understanding of process capabilities, conclusions are elusive and the exercise remains academic. The data necessary to perform the analysis and render a decision also varies from manufacturer to manufacturer. Accordingly, a conclusive comparison of the various array architectures is not possible. Rather, the architectures will be compared in light of the available data. To better facilitate a comparison, the 32 Mbit array block size data is summarized in Table 16 for the open digitline, folded digitline, and bilevel digitline architectures.

TABLE 16

| Architecture | Row Decode | Metals | 32 Mbit Area ($\mu m^2$) | Efficiency (%) |
| --- | --- | --- | --- | --- |
| Open Digit | Global | 3 | 29,944,350 | 60.5 |
| Open Digit | Hier | 3 | 32,429,565 | 55.9 |
| Folded Digit | Local | 2 | 40,606,720 | 59.5 |
| Folded Digit | Global | 3 | 32,654,160 | 74.0 |
| Folded Digit | Hier | 3 | 34,089,440 | 70.9 |
| Bilevel Digit | Local | 3 | 28,732,296 | 63.1 |
| Bilevel Digit | Global | 4 | 24,322,632 | 74.5 |
| Bilevel Digit | Hier | 4 | 24,980,376 | 72.5 |

From Table 16 it can be concluded that overall die size (32 Mbit Area) is a better metric for comparison than array efficiency. For instance, the triple metal folded digitline design using hierarchical row decodes has an area of 34,089,440 $\mu m^2$ and an efficiency of 70.9%. The triple metal bilevel digitline design with local row decodes has an efficiency of only 63.1%, but an overall area of 28,732,296 $\mu m^2$. Array efficiency for the folded digitline is higher, but this is misleading, since the folded digitline yields a die that is 18.6% larger for the same number of conductors. Table 16 also illustrates that the bilevel digitline architecture always yields the smallest die area, regardless of the configuration. The smallest folded digitline design at 32,654,160 $\mu m^2$ and the smallest open digitline design at 29,944,350 $\mu m^2$ are still larger than the largest bilevel digitline design at 28,732,296 $\mu m^2$. Also apparent is that the bilevel and open digitline architectures both need at least three conductors in their construction. The folded digitline architecture still has a viable design option using only two conductors. The penalty to two conductors is, of course, a much larger die size—a full 41% larger than the triple metal bilevel digitline design.

Conclusion. A novel bilevel digitline architecture for use on advanced DRAM designs has been described. The bilevel digitline architecture achieves significant reductions in die size while maintaining the high signal to noise performance of traditional folded digitline architectures. The bilevel digitline uses vertically stacked digitline pairs connected to arrays of $6F^2$ or smaller memory cells. Vertical digitline twisting ensures balanced noise cancellation and equalizes the quality of memory cells contacting each digitline.

DRAM die size reduction results primarily from the use of smaller memory cells in cross-point style arrays and secondarily from efficient pitch cell utilization. Overall, the bilevel digitline approach presented combines the best characteristics of both folded and open digitline architectures into an efficient new DRAM architecture.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method for improved differential electrical noise reduction for an integrated circuit device having a memory having multiple vertical levels of circuitry, the memory having at least four arrays of memory cells, each array of memory cells being substantially equally spaced from an adjacent array of memory cells, each array of memory cells including a plurality of memory cells and at least four pairs of digitlines, each pair of digitlines including a first digitline and a second digitline, the first digitline and the second digitline being substantially vertically aligned in an upper conductive level and a lower conductive level of the integrated circuit device, the first digitline and second digitline of each pair of digitlines each connected to an equal number of the memory cells in each array of memory cells, the method comprising:

electrically balancing the first digitline and the second digitline of each digitline pair of the at least four pairs of digitlines to balance the electrical noise therebetween by vertically twisting the first digitline and the second digitline of each pair of digitlines of the at least four pairs of digitlines between arrays of the at least four arrays of memory cells in a twist region located between each array of the at least four arrays of memory cells, a first pair of digitlines and a third pair of digitlines of the at least four pairs of digitlines vertically twisted in the twist region located between a first array of memory cells and a second array of memory cells and vertically twisted in the twist region located between a third array of memory cells and a fourth array of memory cells while a second pair of digitlines and a fourth pair of digitlines of the at least four pairs of digitlines are vertically twisted in the twist region located between the second array of memory cells and the third array of memory cells, the electrically balancing including connecting an equal number of memory cells to a portion of one of the first digitline and the second digitline of a pair of digitlines of the at least four pairs of digitlines when located in a lower conductive level of an array of the at least four arrays of memory cells.

2. The method of claim 1, further comprising:

isolating adjacent memory cell of an array of the at least four arrays of memory cells using an isolation region comprising a plurality of isolation transistors, each isolation transistor having a gate biased to a predetermined voltage.

* * * * *

UNITED STATES PATENT AND TRADEMARK OFFICE
CERTIFICATE OF CORRECTION

| | | |
|---|---|---|
| PATENT NO. | : 6,898,102 B2 | Page 1 of 1 |
| APPLICATION NO. | : 10/620179 | |
| DATED | : May 24, 2005 | |
| INVENTOR(S) | : Keeth | |

It is certified that error appears in the above-identified patent and that said Letters Patent is hereby corrected as shown below:

In column 31, line 27, in Claim 1, after "and" insert -- the --.

In column 31, line 29, in Claim 1, after "of the" insert -- plurality of --.

In column 32, line 22, in Claim 1, delete "a" and insert -- the --, therefor.

In column 32, line 26, in Claim 2, delete "cell" and insert -- cells --, therefor.

Signed and Sealed this

First Day of April, 2008

JON W. DUDAS
*Director of the United States Patent and Trademark Office*